US012646550B2

(12) United States Patent
Kao et al.

(10) Patent No.: US 12,646,550 B2
(45) Date of Patent: Jun. 2, 2026

(54) MEMORY CIRCUIT AND METHOD OF OPERATING THE SAME

(71) Applicant: TAIWAN SEMICONDUCTOR MANUFACTURING COMPANY, LTD., Hsinchu (TW)

(72) Inventors: Yun-Feng Kao, Hsinchu (TW); Katherine H. Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 54 days.

(21) Appl. No.: 18/752,079

(22) Filed: Jun. 24, 2024

(65) Prior Publication Data

US 2025/0239286 A1 Jul. 24, 2025

Related U.S. Application Data

(60) Provisional application No. 63/622,879, filed on Jan. 19, 2024.

(51) Int. Cl.
*G11C 11/22* (2006.01)

(52) U.S. Cl.
CPC ...... *G11C 11/2275* (2013.01); *G11C 11/2259* (2013.01); *G11C 11/2273* (2013.01)

(58) Field of Classification Search
CPC ............ G11C 11/2275; G11C 11/2259; G11C 11/2273
See application file for complete search history.

(56) References Cited

U.S. PATENT DOCUMENTS

2022/0366954 A1 11/2022 Lai
2023/0075348 A1* 3/2023 Lee ........................ G06F 7/5443

FOREIGN PATENT DOCUMENTS

TW 393640 6/2000

* cited by examiner

*Primary Examiner* — Han Yang
(74) *Attorney, Agent, or Firm* — Hauptman Ham, LLP

(57) ABSTRACT

A memory circuit includes a first memory cell array configured to store data, and a second memory cell array. The second memory cell array is configured as a first logic circuit or a second logic circuit in response to a first set of control signals. The first logic circuit is configured to perform a first logic function on a first set of data signals based on a second set of control signals. The second logic circuit is configured to perform a second logic function on the first set of data signals based on the second set of control signals. The second logic function is different from the first logic function. The first set of data signals is part of the data stored in the first memory cell array. The first memory cell array and the second memory cell array are embedded in a same memory cell array.

20 Claims, 32 Drawing Sheets

400C

| Function | C1,C2,C3 | A | B | Vo |
|----------|----------|---|---|-----|
| OR | (0,0,1)<br>(0,1,0)<br>(1,0,0) | 0 | 0 | 0 |
| | | 0 | 1 | 1 |
| | | 1 | 0 | 1 |
| | | 1 | 1 | 1 |

400B

400E

| Function | C1,C2,C3 | A | B | Vo |
|----------|----------|---|---|-----|
| AND | (1,1,1) | 0 | 0 | 0 |
| | | 0 | 1 | 0 |
| | | 1 | 0 | 0 |
| | | 1 | 1 | 1 |

400D

700C

700B

| Function | C1,C2 | A | B | Vo |
|----------|-------|---|---|-----|
| OR | (1,0) | 0 | 0 | 0 |
| | | 0 | 1 | 1 |
| | | 1 | 0 | 1 |
| | | 1 | 1 | 1 |

| Function | C1,C2 | A | B | Vo |
|----------|-------|---|---|-----|
| AND | (0,1) | 0 | 0 | 0 |
| | | 0 | 1 | 0 |
| | | 1 | 0 | 0 |
| | | 1 | 1 | 1 |

800C

800B

| Function | C1 | A | B | Vo |
|---|---|---|---|---|
| OR | V1 | 0 | 0 | 0 |
| | | 0 | 1 | 1 |
| | | 1 | 0 | 1 |
| | | 1 | 1 | 1 |

800E

800D

| Function | C1 | A | B | Vo |
|----------|-----|---|---|-----|
| AND | V2 | 0 | 0 | 0 |
|  |  | 0 | 1 | 0 |
|  |  | 1 | 0 | 0 |
|  |  | 1 | 1 | 1 |

800F

900B

| Function | A | B | Vo |
|----------|---|---|----|
| AND | 0 | 0 | 0 |
| | 0 | 1 | 0 |
| | 1 | 0 | 0 |
| | 1 | 1 | 1 |

900A

1000C

1000B

| Function | C1,C2,C3 | A | B | A' | B' | Vo |
|---|---|---|---|---|---|---|
| NAND | (0,0,1) | 0 | 0 | 1 | 1 | 1 |
| | (0,1,0) | 0 | 1 | 1 | 0 | 1 |
| | (1,0,0) | 1 | 0 | 0 | 1 | 1 |
| | | 1 | 1 | 0 | 0 | 0 |

1000E

1000D

| Function | C1,C2,C3 | A | B | A' | B' | Vo |
|----------|----------|---|---|----|----|----|
| NOR | (1,1,1) | 0 | 0 | 1 | 1 | 1 |
|  |  | 0 | 1 | 1 | 0 | 0 |
|  |  | 1 | 0 | 0 | 1 | 0 |
|  |  | 1 | 1 | 0 | 0 | 0 |

1230

1232

1234

1236

Setup mode

Computing mode

Carry-in mode

Readout mode

1200B

1800

1816 performing a read operation of the memory circuit

1818 Pulling the first node to a first supply voltage

1820 Pulling an output node to the first supply voltage or a reference supply voltage thereby setting an output signal 1822 Setting the first signal at the first node to floating or to the reference supply voltage 1824 Outputting the output signal From Operation 1814

MEMORY CIRCUIT AND METHOD OF OPERATING THE SAME

PRIORITY CLAIM

This application claims the benefit of U.S. Provisional Application No. 63/622,879, filed Jan. 19, 2024, which is herein incorporated by reference in its entirety.

BACKGROUND

Recent developments in the field of artificial intelligence have resulted in various products and/or applications, including, but not limited to, speech recognition, image processing, machine learning, natural language processing, or the like. Such products and/or applications often use neural networks to process large amounts of data for learning, training, cognitive computing, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
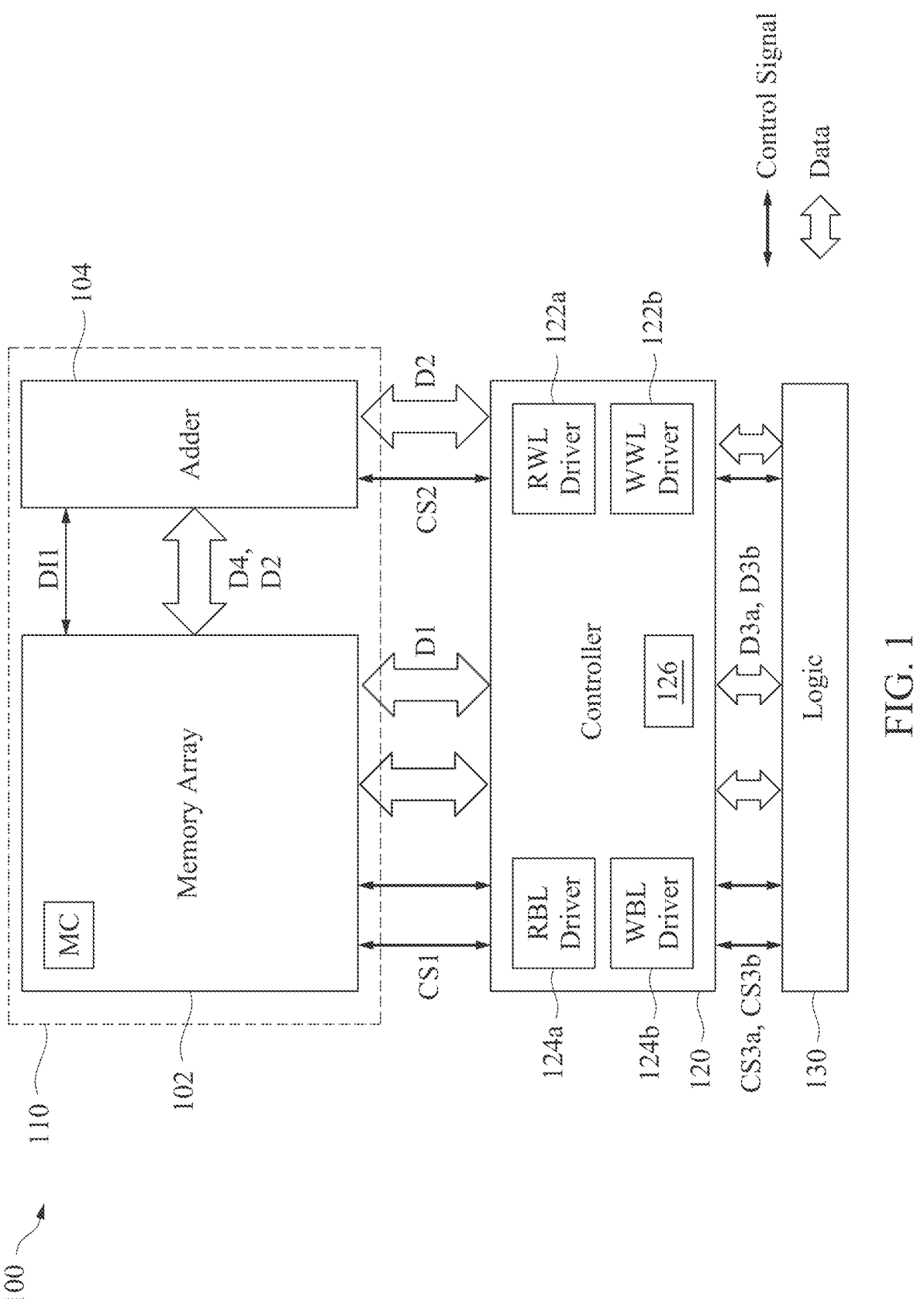
FIG. 1 is a block diagram of a memory device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a first memory cell array and a second memory cell array.

In some embodiments, the first memory cell array is configured to store data.

In some embodiments, the second memory cell array is configured as a first logic circuit or a second logic circuit in response to a first set of control signals. In some embodiments, the second memory cell array is reconfigurable as a first logic circuit or a second logic circuit in response to a first set of control signals.

In some embodiments, the first logic circuit is configured to perform a first logic function on a first set of data signals based on a second set of control signals.

In some embodiments, the second logic circuit is configured to perform a second logic function on the first set of data signals based on the second set of control signals.

In some embodiments, the second logic function is different from the first logic function.

In some embodiments, the first set of data signals is part of the data stored in the first memory cell array.

In some embodiments, the memory circuit further includes a controller. In some embodiments, the controller is configured to generate the first set of control signals.

In some embodiments, the controller is further configured to control the first memory cell array and the second memory cell array. In some embodiments, the first memory cell array and the second memory cell array are embedded in a same memory cell array.

In some embodiments, the inclusion of the first memory cell array and the second memory cell array within the same memory cell array makes it possible to reduce the distance between the first memory cell array and the second memory cell array thereby reducing the data loss or decay between the first memory cell array and the second memory cell array compared to other approaches.

In some embodiments, the inclusion of the first memory cell array and the second memory cell array within the same memory cell array makes it possible to reduce the distance between the first memory cell array and the second memory cell array thereby reducing processing time compared to other approaches.

FIG. 1 is a block diagram of a memory device 100, in accordance with some embodiments. A memory device is a type of an integrated circuit (IC) device. In at least one embodiment, a memory device is an individual IC device. In some embodiments, a memory device is included as a part of a larger IC device which comprises circuitry other than the memory device for other functionalities.

The memory device 100 comprises a memory circuit 110, a memory controller 120 and a memory logic circuit 130 (also referred to as "logic circuit 130"). The memory circuit 110 comprises a memory array 102 and an adder circuit 104.

The memory controller 120 (also referred to as "controller 120") comprises a read word line (RWL) driver 122a, a write word line (WWL) driver 122b, a read bit line (RBL)

driver 124a, a write bit line (WBL) driver 124b and a control circuit 126 (also referred to as a "controller 126").

In some embodiments, one or more elements of the memory controller 120 are included in the memory circuit 110, and/or one or more elements (except the memory array 102) of the memory circuit 110 are included in the memory controller 120.

In some embodiments, memory circuit 110 is a memory macro. A macro has a reusable configuration and is usable in various types or designs of IC devices. In some embodiments, the macro is understood in the context of an analogy to the architectural hierarchy of modular programming in which subroutines/procedures are called by a main program (or by other subroutines) to carry out a given computational function. In this context, an IC device uses the macro to perform one or more given functions. Accordingly, in this context and in terms of architectural hierarchy, the IC device is analogous to the main program and the macro is analogous to subroutines/procedures. In some embodiments, the macro is a soft macro. In some embodiments, the macro is a hard macro. In some embodiments, the macro is a soft macro which is described digitally in register-transfer level (RTL) code. In some embodiments, synthesis, placement and routing have yet to have been performed on the macro such that the soft macro can be synthesized, placed and routed for a variety of process nodes. In some embodiments, the macro is a hard macro which is described digitally in a binary file format (e.g., Graphic Database System II (GDSII) stream format), where the binary file format represents planar geometric shapes, text labels, other information and the like of one or more layout-diagrams of the macro in hierarchical form. In some embodiments, synthesis, placement and routing have been performed on the macro such that the hard macro is specific to a particular process node.

A memory macro is a macro comprising memory cells which are addressable to permit data to be written to or read from the memory cells. In some embodiments, a memory macro further comprises circuitry configured to provide access to the memory cells and/or to perform a further function associated with the memory cells. For example, in some embodiments, the memory circuit 110 comprises memory cells MC, as described herein, that form circuitry configured to provide a compute-in-memory (CIM) function associated with the memory cells MC. In at least one embodiment, a memory macro configured to provide a CIM function is referred to as a CIM macro. The described macro configuration is an example. Other configurations are within the scopes of various embodiments.

The memory circuit 110 includes a memory array 102 coupled to an adder circuit 104.

In some embodiments, memory circuit 110 is a memory array. In some embodiments, memory array 102 is a first memory array, and adder circuit 104 is a second memory array.

The memory array 102 comprises memory cells MC arranged in a plurality of columns and rows.

The memory controller 120 is electrically coupled to the memory cells MC and configured to control operations of the memory cells MC including, but not limited to, a read operation, a write operation, or the like. The memory controller 120 is electrically coupled to the adder circuit 104 and configured to control operations of the adder circuit 104 including, but not limited to, an initialization operation, a read operation, a write operation, or the like.

The memory array 102 further comprises a plurality of write word lines (shown in FIG. 2) extending along the rows, a plurality of read word lines (shown in FIG. 2) extending along the rows, a plurality of write bit lines (shown in FIG. 2) extending along the columns of the memory cells MC, and a plurality of read bit lines (shown in FIG. 2) extending along the columns of the memory cells MC.

Each of the memory cells MC is electrically coupled to the memory controller 120 by at least one of the write word lines, at least one of the read word lines, at least one of the write bit lines and at least one of the read bit lines.

In some example operations, write or read word lines are configured for transmitting addresses of the memory cells MC to be read from, or for transmitting addresses of the memory cells MC to be written to, or the like. In at least one embodiment, a set of word lines is configured to perform as both read word lines and write word lines. In some embodiments, write or read bit lines are used for transmitting data read from or written to the memory cells MC indicated by corresponding word lines, or the like. In some embodiments, read bit lines and/or read bit line bars (not shown) are configured for transmitting data read from the memory cells MC indicated by corresponding read word lines, and write bit lines and/or write bit line bars (not shown) are configured for transmitting data to be written to the memory cells MC indicated by corresponding write word lines, or the like.

The write word lines are commonly referred to herein as WWL, the read word lines are commonly referred to herein as RWL, the write bit lines are commonly referred to herein as WBL, and the read bit lines are referred to herein as RBL. Various numbers of write word lines, read word lines, write bit lines and/or read bit lines in the memory array 102 are within the scope of various embodiments.

Example memory types of the memory cells MC include, but are not limited to, dynamic random-access memory (DRAM), static random-access memory (SRAM), resistive RAM (RRAM), magnetoresistive RAM (MRAM), phase change RAM (PCRAM), spin transfer torque RAM (STTRAM), floating-gate metal-oxide-semiconductor field-effect transistors (FGMOS), spintronics, or the like. In one or more example embodiments described herein, the memory cells MC include DRAM memory cells.

In the example configuration in FIG. 1, the memory cells MC are single-port memory cells. In some embodiments, a port of a memory cell is represented by a set of a word line WL and a bit line BL/bit line bar BLB (referred to herein as a WL/BL/BLB set) which are configured to provide access to the memory cell in a read operation (i.e., read access) and/or in a write operation (i.e., write access). A single-port memory cell has one WL/BL/BLB set which is configured for both read access and write access, but not at the same time. A multi-port memory cell has several WL/BL/BLB sets each of which is configured for read access only, or for write access only, or for both read access and write access. Examples of single-port memory cells are described with respect to FIGS. 1-17C. Other configurations or other number of ports for memory cells in memory array 102 are within the scope of the present disclosure. For example, in some embodiments, one or more single-port memory cells that are described with respect to FIGS. 1-17C can be replaced with a corresponding multi-port memory cell.

The memory array 102 comprises a plurality of memory segments. In some embodiments, a memory segment comprises a memory row, a memory column, a memory bank, or the like. A memory row comprises a plurality of memory cells coupled to the same read word line RWL or write word line WWL. A memory column (also referred to as "memory string") comprises a plurality of memory cells coupled to the same read bit line RBL and the same write bit line WBL. A memory bank comprises more than one memory rows and/or more than one memory columns. In at least one embodiment, a memory bank comprises a section of the memory array 102 with multiple memory rows and multiple memory columns. In some embodiments, a memory segment comprises multiple memory banks. Other manners of dividing the memory array 102 into a plurality of memory segments are within the scopes of various embodiments.

Figure 3A:
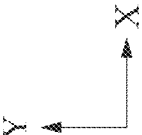
FIG. 3A is a circuit diagram of a memory cell, in accordance with some embodiments.
Figure 3A:
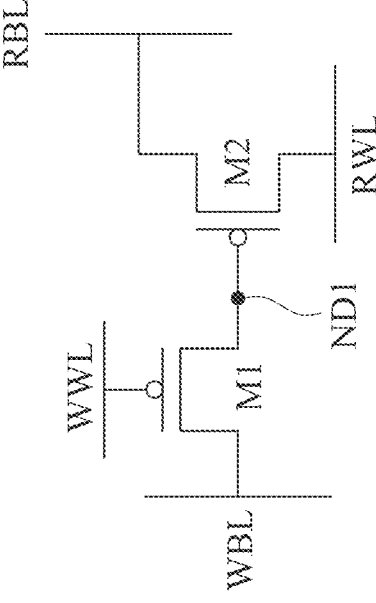
Figure 3B:
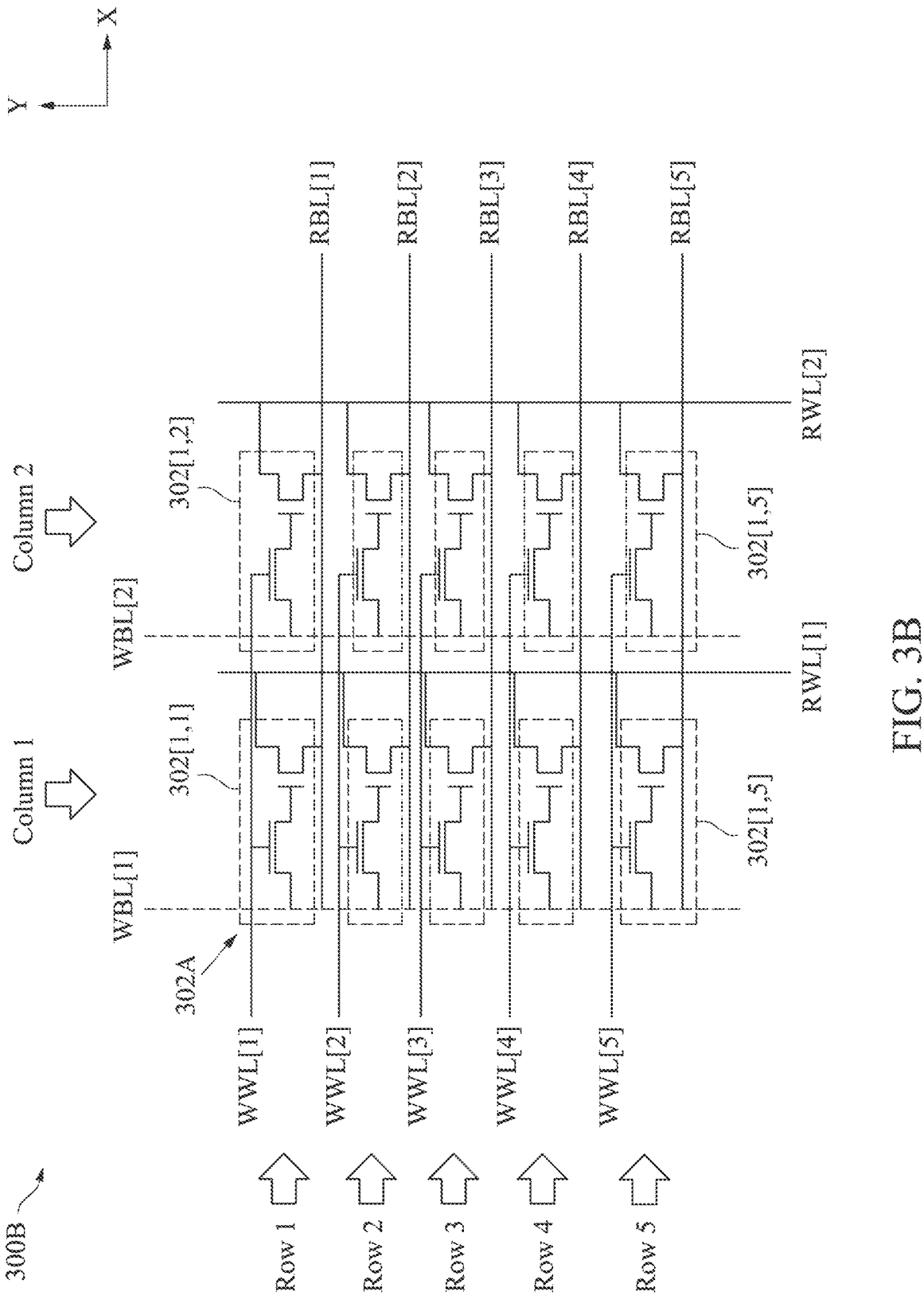
FIG. 3B is a circuit diagram of a memory cell array, in accordance with some embodiments.

Each of the memory cells MC includes an access portion (e.g., transistor M1 as shown in FIGS. 3A-3B) and a storage portion (e.g., transistor M2 as shown in FIGS. 3A-3B). In some embodiments, each of the memory cells MC is configured to store a piece of weight data (not shown), and is configured to perform a CIM operation on the piece of weight data and a piece of received data (not labelled).

Examples of CIM operations include, but are not limited to, mathematical operations, logical operations, combination thereof, or the like. In at least one embodiment, a CIM operation includes one or more Multiply Accumulate (MAC) operations. In some embodiments, the CIM operation comprises a multiplication of one or more multibit weight values with one or more multibit input data values. Further computation portions or circuits configured to perform CIM operations other than a multiplication are within the scopes of various embodiments. In some embodiments, the output data of the CIM operations are supplied, as input data (as the set of data D4) to the adder circuit 104 or as input data (as the set of data D1) to the controller 120.

In one or more example embodiments described herein, the memory cells MC are single-bit memory cells, i.e., each memory cell is configured to store a bit of weight data and to compute a corresponding bit of an output signal based on a CIM operation of the bit of weight data and a bit of received data. This is an example, and multi-bit memory cells, each of which is configured to store more than one bit of weight data and to perform a corresponding CIM operation on the corresponding multi-bit pieces of weight data, are within the scopes of various embodiments.

In some embodiments, the memory cells MC are single-bit memory cells configured to store a bit of data. In some embodiments, a single-bit memory cell is also referred to as a bitcell.

In some embodiments, the memory cells MC are configured to output a set of data D1 to the controller 120. In some embodiments, the memory cells MC are configured to receive the set of data D1 from the controller 120. In some embodiments, the set of data D1 includes a set of weights.

In some embodiments, the memory cells MC are configured to output a set of control signals CS1 to the controller 120. In some embodiments, the memory cells MC are configured to receive the set of control signals CS1 from the controller 120.

In some embodiments, the set of control signals CS1 includes one or more of RBL signals, WBL signals, RWL signals or WWL signals.

In some embodiments, the memory cells MC are configured to output a set of data D4 to the adder circuit 104. In some embodiments, the set of data D4 includes at least one of data signal A or data signal B (shown at least in FIG. 4A).

The adder circuit 104 is coupled to the memory array 102 and the controller 120.

The adder circuit 104 is configured to receive the set of data D4 from the memory array 102 and a set of control signals CS2 from the controller 120. In some embodiments, the set of control signals CS2 includes at least one of control signal C1, control signal C2 or control signal C3 (shown at least in FIG. 4A).

The adder circuit 104 is configured to output a set of data D2 to at least one of the memory array 102 or the controller 120. In some embodiments, the set of output data D2 includes at least one of data signal Vo (shown at least in FIG. 4A). In some embodiments, the adder circuit 104 is config- ured to perform one or more logic operations/functions on the set of data D4 based on the set of controls signals CS2, thereby generating the set of output data D2. In some embodiments, the adder circuit 104 is configured to perform one or more non-volatile logic operations/functions on the set of data D4 based on the set of controls signals CS2, thereby generating the set of output data D2.

Examples of logic operations/functions include, but are not limited to, mathematical operations, logical operations, combinations thereof, or the like. In some embodiments, examples of logic operations/functions include AND, NAND, OR, NOR, XOR, NOT, combinations thereof, or the like. In some embodiments, examples of logic operations/ functions include adders, full adders, half-bit adders, sub- tractors, multipliers, dividers, combinations thereof, or the like.

In some embodiments, the adder circuit 104 has inputs coupled to the read bit lines RBL or the write bit lines WBL to receive the set of output data D4 from one or more of the memory cells MC.

In some embodiments, one or more examples of the adder circuit 104 include AND, NAND, OR, NOR, XOR, NOT or the like. In some embodiments, one or more examples of the adder circuit 104 include adders, full adders, half-bit adders, subtractors, multipliers, dividers, combinations thereof, or the like.

In some embodiments, the set of output data D2 or D4 is supplied, as input data, to another memory macro (not shown) of the memory device 100. In one or more embodi- ments, the set of output data D2 or D4 are output, through one or more I/O circuits (not shown) of the memory con- troller 120, to external circuitry outside the memory device 100, for example, a processor as described herein.

In the example configuration in FIG. 1, the controller 120 comprises the read word line driver 122*a*, the write word line driver 122*b*, the read bit line driver 124*a*, the write bit line driver 124*b* and the control circuit 126. In at least one embodiment, the controller 120 further includes one or more clock generators for providing clock signals for various components of the memory device 100, one or more input/ output (I/O) circuits for data exchange with external devices, and/or one or more controllers for controlling various opera- tions in the memory device 100.

Figure 2:
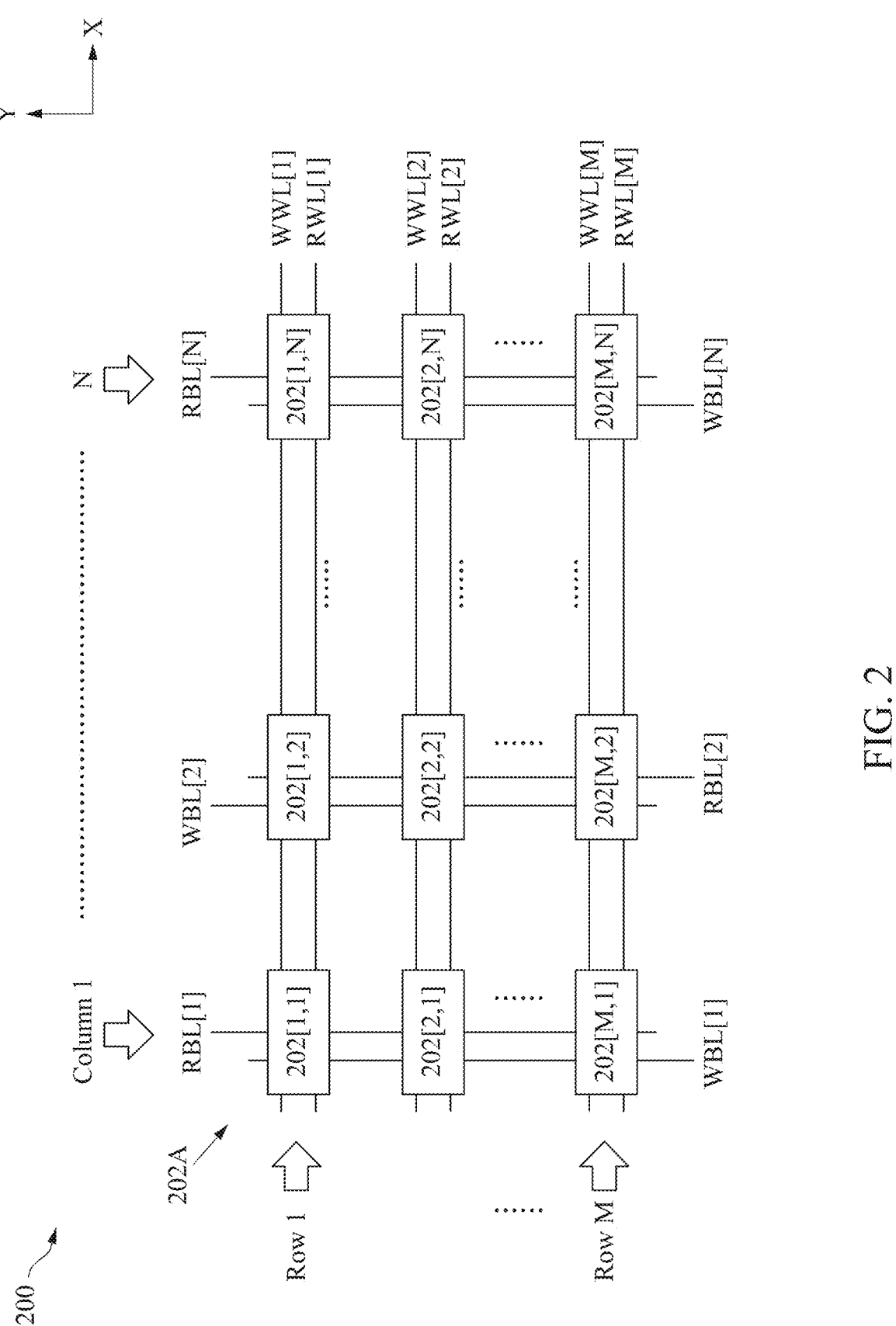
FIG. 2 is a block diagram of a memory cell array, in accordance with some embodiments.

The read word line driver 122*a* is coupled to the memory array 102 via the read word lines RWL (shown in FIG. 2). The read word line driver 122*a* is configured to decode a row address of the memory cell MC selected to be accessed in a read operation. The read word line driver 122*a* is configured to supply a voltage to the selected read word line RWL corresponding to the decoded row address, and a different voltage to the other, unselected read word lines RWL.

The write word line driver 122*b* is coupled to the memory array 102 via the write word lines WWL (shown in FIG. 2). The write word line driver 122*b* is configured to decode a row address of the memory cell MC selected to be accessed in a write operation. The write word line driver 122*b* is configured to supply a voltage to the selected write word line WWL corresponding to the decoded row address, and a different voltage to the other, unselected write word lines WWL.

The read bit line driver 124*a* is coupled to the memory array 102 via the read bit lines RBL (shown in FIG. 2). The read bit line driver 124*a* is configured to decode a column address of the memory cell MC selected to be accessed in a read operation. The read bit line driver 124*a* is configured to supply a voltage to the selected read bit line RBL corre- sponding to the decoded column address, and a different voltage to the other, unselected read bit lines RBL.

The write bit line driver 124*b* is coupled to the memory array 102 via the write bit lines WBL (shown in FIG. 2). The write bit line driver 124*b* is configured to decode a column address of the memory cell MC selected to be accessed in a write operation. The write bit line driver 124*b* is configured to supply a voltage to the selected write bit line WBL corresponding to the decoded column address, and a differ- ent voltage to the other, unselected write bit lines WBL.

The control circuit 126 is coupled to one or more of the memory cells MC, adder circuit 104, read word line driver 122*a*, write word line driver 122*b*, read bit line driver 124*a*, write bit line driver 124*b* or logic circuit 130 to coordinate operations of circuits, drivers and/or buffers in the overall operation of the memory device 100. For example, the control circuit 126 is configured to generate various control signals for controlling operations of one or more of the memory cells MC, adder circuit 104, read word line driver 122*a*, write word line driver 122*b*, read bit line driver 124*a*, write bit line driver 124*b* or logic circuit 130 or other circuits not shown.

In some embodiments, the control circuit 126 is config- ured to output the set of data D1 to the memory array 102. In some embodiments, the control circuit 126 is configured to receive the set of data D1 from the memory array 102.

In some embodiments, the control circuit 126 is config- ured to output the set of control signals CS1 to the memory array 102. In some embodiments, the control circuit 126 is configured to receive the set of control signals CS1 from the memory array 102.

In some embodiments, the control circuit 126 is config- ured to output the set of data D2 to the adder circuit 104. In some embodiments, the control circuit 126 is configured to receive the set of data D2 from the adder circuit 104.

In some embodiments, the control circuit 126 is config- ured to output the set of control signals CS2 to the adder circuit 104. In some embodiments, the control circuit 126 is configured to receive the set of control signals CS2 from the adder circuit 104.

In some embodiments, the control circuit 126 is config- ured to output a set of data D3*a* to the logic circuit 130. In some embodiments, the control circuit 126 is configured to receive a set of data D3*b* from the logic circuit 130. In some embodiments, the set of data D3*a* is usable by the logic circuit 130 in generating a set of data D3*b*.

In some embodiments, the control circuit 126 is config- ured to output a set of control signals CS3*a* to the logic circuit 130. In some embodiments, the control circuit 126 is configured to receive a set of control signals CS3*b* from the logic circuit 130. In some embodiments, the set of control signals CS3*a* is usable by the logic circuit 130 in generating the set of data D3*b*.

The logic circuit 130 is coupled to the controller 120. In some embodiments, the logic circuit 130 is coupled to the memory array 102 by the controller 120

The logic circuit 130 is configured to receive the set of data Da from the controller 120 and the set of control signals CS3*a* from the controller 120.

The logic circuit 130 is configured to output the set of data D3*b* and the set of control signals CS3*b* to the controller 120.

In some embodiments, the logic circuit 130 includes at least one or more of a central processing unit (CPU), graphics processing unit (GPU), or combinations thereof, the like. In some embodiments, the logic circuit 130 is configured to perform one or more complex logic operations/functions on the set of data D3a based on the set of controls signals CS3a, thereby generating the set of output data D3b. In some embodiments, the one or more complex logic operations/functions performed by the logic circuit 130 includes one or more operations not performed by the adder circuit 104.

Examples of complex logic operations/functions include, but are not limited to, mathematical operations, logical operations, combinations thereof, or the like. In some embodiments, examples of complex logic operations/functions include multi-stage AND, NAND, OR, NOR, XOR, NOT, combinations thereof, or the like. In some embodiments, examples of complex logic operations/functions include multi-stage adders, full adders, half-bit adders, subtractors, multipliers, dividers, combinations thereof, or the like.

In some embodiments, memory device 100 is configured to perform near-memory computing (NMC) or one or more CIM operations. In at least one embodiment, NMC memory devices or CIM memory devices, such as the memory device 100, are advantageous over other approaches, where data are moved back and forth between the memory and a processor, because such back-and-forth data movement, which is a bottleneck to both performance and energy efficiency, is avoidable. Examples of NVM or CIM applications include, but are not limited to, artificial intelligence, image recognition, neural network for machine learning, or the like. In some embodiments, the adder circuit 104 makes it possible to perform various computational operations that are realized and embedded into a memory array, such as memory circuit 110.

In some embodiments, by configuring memory circuit 110 to perform one or more CIM operations, makes it possible to reduce the number of transistors in memory circuit 110 thereby reducing the size of the memory circuit 110 compared to other approaches.

In some embodiments, the inclusion of adder circuit 104 within a memory array, such as memory circuit 110, makes it possible to reduce the distance DI1 between the memory array 102 and the adder circuit 104 thereby reducing the data loss or decay between the memory array 102 and the adder circuit 104 compared to other approaches.

In some embodiments, the inclusion of adder circuit 104 within a memory array, such as memory circuit 110, reduces the data load on the logic circuit 130 compared to other approaches, thereby allowing the logic circuit 130 to focus on other operations and/or computations not performed by the adder circuit 104, and reducing processing time and reduced power consumption.

FIG. 2 is a block diagram of a memory cell array 200, in accordance with some embodiments. In some embodiments, memory cell array 200 is part of an integrated circuit.

Memory cell array 200 is an embodiment of memory array 102 of FIG. 1, and similar detailed description is therefore omitted. In some embodiments, each memory cell in array of memory cells 202A is an embodiment of memory cell MC of memory circuit 110 of FIG. 1, and Memory cell array 200 comprises an array of memory cells 202[1,1], 202[1,2], . . . , 202[2,2], . . . , 202[M,N] (collectively referred to as "array of memory cells 202A") having M rows and N columns, where N is a positive integer corresponding to the number of columns in array of memory cells 202A and M is a positive integer corresponding to the number of rows in array of memory cells 202A. The rows of cells in array of memory cells 202A are arranged in a first direction X. The columns of cells in array of memory cells 202A are arranged in a second direction Y. The second direction Y is different from the first direction X. In some embodiments, the second direction Y is perpendicular to the first direction X. Each memory cell 202[1,1], 202[1,2], . . . , 202[2,2], . . . , 202[M,N] in array of memory cells 202A is configured to store a corresponding bit of data.

Array of memory cells 202A is a dynamic random-access memory (DRAM) array including DRAM memory cells. In some embodiments, each memory cell in array of memory cells 202A corresponds to a two transistor (2T) memory cell as shown in FIGS. 3A-3B.

Other numbers of transistors in each memory cell in array of memory cells 202A are within the scope of the present disclosure. In some embodiments, each memory cell in array of memory cells 202A corresponds to a two transistor (2T) memory cell with 1-Ferroelectric field effect transistor (FeFET). In some embodiments, each memory cell in array of memory cells 202A corresponds to a three transistor (3T) memory cell. In some embodiments, each memory cell in array of memory cells 202A corresponds to a four transistor (4T) memory cell.

Different types of memory cells in array of memory cells 202A are within the contemplated scope of the present disclosure. For example, in some embodiments, each memory cell in array of memory cells 202A is a static random access memory (SRAM). In some embodiments, each memory cell in array of memory cells 202A corresponds to a ferroelectric resistive random-access memory (FeRAM) cell. In some embodiments, each memory cell in array of memory cells 202A corresponds to a magneto-resistive random-access memory (MRAM) cell. In some embodiments, each memory cell in array of memory cells 202A corresponds to a resistive random-access memory (RRAM) cell. Other configurations of array of memory cells 202A are within the scope of the present disclosure.

Memory cell array 200 further includes M write word lines WWL[1], . . . . WWL[M] (collectively referred to as "write word line WWL"). Each row 1, . . . , M in array of memory cells 202A is associated with a corresponding write word line WWL[1], . . . , WWL[M]. Each row of memory cells in array of memory cells 202A is coupled with a corresponding write word line WWL[1], . . . , WWL[M]. For example, memory cells 202[1,1], 202[1,2], . . . , 202[1,N] in row 1 are coupled with write word line WWL[1]. Each write word line WWL extends in the first direction X.

Memory cell array 200 further includes M read word lines RWL[1], . . . RWL[M] (collectively referred to as "read word line RWL"). Each row 1, . . . , M in array of memory cells 202A is associated with a corresponding read word line RWL[1], . . . , RWL[M]. Each row of memory cells in array of memory cells 202A is coupled with a corresponding read word line RWL[1], . . . , RWL[M]. For example, memory cells 202[1,1], 202[1,2], . . . , 202[1,N] in row 1 are coupled with read word line RWL[1]. Each read word line RWL extends in the first direction X.

Memory cell array 200 further includes N write bit lines WBL[1], . . . WBL[N] (collectively referred to as "write bit line WBL"). Each column 1, . . . , N in array of memory cells 202A is associated with a corresponding write bit line WBL[1], . . . , WBL[N]. Each column of memory cells in array of memory cells 202A is coupled with a corresponding write bit line WBL[1], . . . , WBL[N]. For example, memory cells 202[1,1], 202[2, 1], . . . , 202[M,1] in column 1 are coupled with write bit line WBL[1]. Each write bit line WBL extends in the second direction Y.

Memory cell array 200 further includes N read bit lines RBL[1], . . . . RBL[N] (collectively referred to as "read bit line RBL"). Each column 1, . . . , N in array of memory cells 202A is associated with a corresponding read bit line RBL [1], . . . , RBL[N]. Each column of memory cells in array of memory cells 202A is coupled with a corresponding read bit line RBL[1], . . . , RBL[N]. For example, memory cells 202[1,1], 202[2,1], . . . , 202[M,1] in column 1 are coupled with read bit line RBL[1]. Each read bit line RBL extends in the second direction Y.

Other configurations of memory cell array 200 are within the scope of the present disclosure. Different configurations of at least write bit lines WBL, write word lines WWL, read bit lines RBL or read word lines RWL in memory cell array 200 are within the contemplated scope of the present disclosure.

In some embodiments, memory cell array 200 includes additional write ports (write word lines WWL or write bit lines WBL) and/or read ports (read word lines RWL or read bit lines RBL). Furthermore, in some embodiments, array of memory cells 202A includes multiple groups of different types of memory cells.

FIG. 3A is a circuit diagram of a memory cell 300A, in accordance with some embodiments.

Memory cell 300A is an embodiment of a memory cell in array of memory cells 202A of FIG. 2 expressed in a schematic diagram, and similar detailed description is therefore omitted.

Components that are the same or similar to those in one or more of FIGS. 3A-3B, 4A-4E, 5, 6, 7A-7E, 8A-8E, 9A-9B, 10A-10E, 11A-11B, 12A-12B, 13, 14, 15, 16 or 17A-17C (shown below) are given the same reference numbers, and detailed description thereof is thus omitted. For ease of illustration, some of the labeled elements of FIGS. 3A-3B, 4A-4E, 5, 6, 7A-7E, 8A-8E, 9A-9B, 10A-10E, 11A-11B, 12A-12B, 13, 14, 15, 16 or 17A-17C are not labelled in each of FIGS. 3A-3B, 4A-4E, 5, 6, 7A-7E, 8A-8E, 9A-9B, 10A-10E, 11A-11B, 12A-12B, 13, 14, 15, 16 or 17A-17C. In some embodiments, FIGS. 3A-3B, 4A-4E, 5, 6, 7A-7E, 8A-8E, 9A-9B, 10A-10E, 11A-11B, 12A-12B, 13, 14, 15, 16 or 17A-17C include additional elements not shown in 3A-3B, 4A-4E, 5, 6, 7A-7E, 8A-8E, 9A-9B, 10A-10E, 11A-11B, 12A-12B, 13, 14, 15, 16 or 17A-17C.

Memory cell 300A is usable as one or more memory cells in array of memory cells 202A of FIG. 2.

Memory cell 300A includes a write transistor M1, a read transistor M2, a write word line WWL, a read word line RWL, a write bit line WBL and a read bit line RBL.

Write word line WWL corresponds to a write word line of write word lines WWL[1], . . . , WWL[[M], read word line RWL corresponds to a read word line of read word lines RWL[1], . . . , RWL[[M], write bit line WBL corresponds to a write bit line of write bit lines WBL[1], . . . , WBL[[N], and read bit line RBL corresponds to a read bit line of read bit lines RBL[1], . . . , RBL[N] of FIG. 2, and similar detailed description is therefore omitted.

Write transistor M1 includes a gate terminal coupled to write word line WWL, a drain/source terminal coupled to write bit line WBL, and a source/drain terminal coupled to at least a gate terminal of read transistor M2 by a node ND1. In some embodiments, node ND1 is a storage node of read transistor M2. Write transistor M1 is configured to write data in memory cell 300A. Write transistor M1 is enabled (e.g., turned on) or disabled (e.g., turned off) in response to a write bit line signal on the write bit line WBL.

Write transistor M1 is shown as a P-type Metal Oxide Semiconductor (PMOS) transistor. In some embodiments, write transistor M1 is an N-type Metal Oxide Semiconductor (NMOS) transistor. In some embodiments, write transistor M1 is a transistor type other than a MOS transistor.

Read transistor M2 includes a drain/source terminal coupled to read word line RWL, a source/drain terminal coupled to read bit line RBL, and a gate terminal coupled to the source terminal of write transistor M1.

Read transistor M2 is shown as a P-type Metal Oxide Semiconductor (PMOS) transistor. In some embodiments, read transistor M2 is an NMOS transistor. In some embodiments, read transistor M2 is a transistor type other than a MOS transistor. In some embodiments, read transistor M2 is referred to as a ferroelectric field effect transistor (FeFET) device, as read transistor M2 includes a ferroelectric region (shown in FIG. 14 as elements 1402-1414) positioned within the gate terminal of the read transistor M2.

Write transistor M1 is configured to write data by controlling the voltage of node ND1 or the gate of read transistor M2 thereby turning on or off read transistor M2. In some embodiments, if the write transistor M1 is enabled or turned on, a voltage of the write bit line WBL is configured to control the voltage of the node ND1 or the gate of read transistor M2. Thus, in some embodiments, the voltage of the write bit line WBL controls turning on or off read transistor M2. In some embodiments, the voltage of the write bit line WBL corresponds to the data stored in memory cell 300A.

Read transistor M2 is configured to read data stored in memory cell 300A. In some embodiments, read transistor M2 is configured to output data stored in memory cell 300A based on whether read transistor M2 is turned on or off.

Other transistor terminals for each of the transistors M1 or M2 of the present application are within the scope of the present disclosure. For example, reference to the drains and sources of a same transistor in the present disclosure can be changed to a source and a drain of the same transistor. Thus, for write transistor M1, reference to the drain and source of write transistor M1 can be changed to the source and drain of write transistor M1, respectively. Similarly, for read transistor M2, reference to the drain and source of read transistor M2 can be changed to the source and drain of read transistor M2, respectively.

Other configurations or quantities of transistors in memory cell 300A are within the scope of the present disclosure.

FIG. 3B is a circuit diagram of a memory cell array 300B, in accordance with some embodiments.

Memory cell array 300B is an embodiment of memory cell array 200 of FIG. 2 expressed in a schematic diagram, and similar detailed description is therefore omitted.

In some embodiments, memory cell array 300B combines the features of a portion of memory cell array 200 of FIG. 2 and memory cell 300A of FIG. 3A, and similar detailed description is therefore omitted. For example, in some embodiments, memory cell array 300B combines the memory cell 300A of FIG. 3A with the 2 columns and 5 rows of memory cell array 200 of FIG. 2, and similar detailed description is therefore omitted.

Memory cell array 300B includes an array of memory cells 302A. In some embodiments, the array of memory cells 302A is similar to the array of memory cells 202A of FIG. 2, and similar detailed description is therefore omitted.

In some embodiments, the array of memory cells 302A includes columns 1 and 2 of array of memory cells 202A, and rows 1, 2, 3, 4 and 5 of array of memory cells 202A, and similar detailed description is therefore omitted.

Each memory cell in the array of memory cells 302A is memory cell 300A of FIG. 3A, and similar detailed description is therefore omitted.

In comparison with FIG. 2, the set of read bit lines RBL in FIG. 3B extends in the first direction X compared with the set of read bit lines RBL in FIG. 2 extending in the second direction Y, and similar detailed description is therefore omitted.

In comparison with FIG. 2, the set of read word lines RWL in FIG. 3B extends in the second direction Y compared with the set of read word lines RWL in FIG. 2 extending in the first direction X, and similar detailed description is therefore omitted.

Other configurations of memory cell array 300B are within the scope of the present disclosure.

Figure 4A:
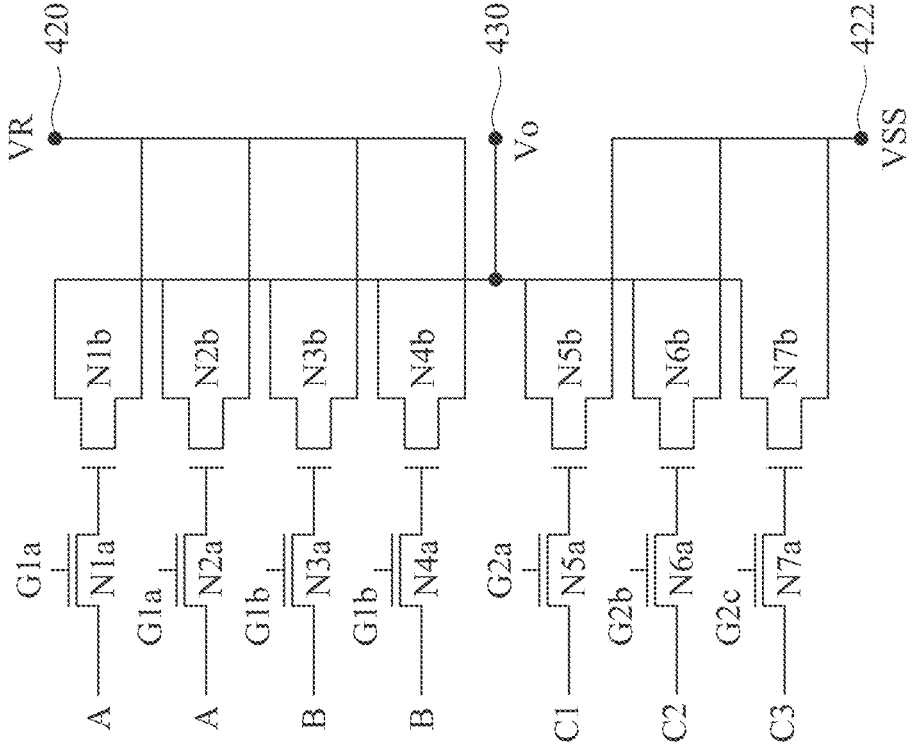
FIG. 4A is a circuit diagram of a memory circuit, in accordance with some embodiments.

FIG. 4A is a circuit diagram of a memory circuit 400A, in accordance with some embodiments.

Figure 4C:
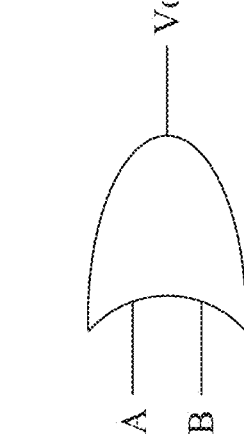
FIG. 4C is a circuit diagram of an OR gate, in accordance with some embodiments.
Figure 4B:
FIG. 4B is a table of an OR gate usable as a memory circuit, in accordance with some embodiments.

FIG. 4B is a table 400B of an OR gate 400C usable as memory circuit 400A, in accordance with some embodiments.

FIG. 4C is a circuit diagram of OR gate 400C, in accordance with some embodiments.

Figures 4D, 4E:
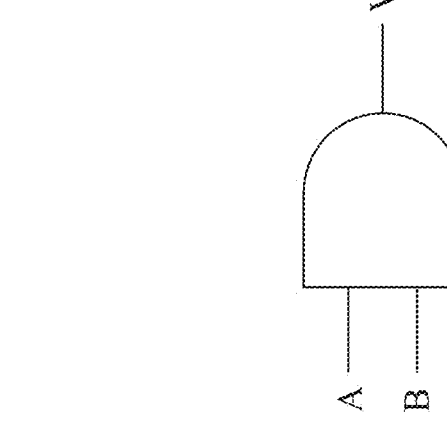
FIG. 4D is a table of an AND gate usable as a memory circuit, in accordance with some embodiments.
FIG. 4E is a circuit diagram of an AND gate, in accordance with some embodiments.

FIG. 4D is a table 400D of an AND gate 400E usable as memory circuit 400A, in accordance with some embodiments.

FIG. 4E is a circuit diagram of AND gate 400E, in accordance with some embodiments.

Memory circuit 400A is an embodiment of adder circuit 104 of FIG. 1 expressed in a schematic diagram, and similar detailed description is therefore omitted.

Memory circuit 400A is usable as adder circuit 104 of FIG. 1. In some embodiments, memory circuit 400A is configured to be OR gate 400C or AND gate 400E based on at least one of a control signal C1, a control signal C2 or a control signal C3.

Memory circuit 400A includes a transistor N1a, a transistor N1b, a transistor N2a, a transistor N2b, a transistor N3a, a transistor N3b, a transistor N4a, a transistor N4b, a transistor N5a, a transistor N5b, a transistor N6a, a transistor N6b, a transistor N7a and a transistor N7b.

In some embodiments, one or more of transistor N1a, N1b, N2a, N2b, N3a, N3b, N4a, N4b, N5a, N5b, N6a, N6b, Na or N7b is an N-type transistor. In some embodiments, one or more of transistor N1a, N1b, N2a, N2b, N3a, N3b, N4a, N4b, N5a, N5b, N6a, N6b, N7a or N7b is an NMOS transistor.

In some embodiments, one or more of transistor N1a, N1b, N2a, N2b, N3a, N3b, N4a, N4b, N5a, N5b, N6a, N6b, N7a or N7b is a P-type transistor. In some embodiments, one or more of transistor N1a, N1b, N2a, N2b, N3a, N3b, N4a, N4b, N5a, N5b, N6a, N6b, N7a or N7b is a PMOS transistor.

In some embodiments, one or more of transistor N1a, N1b, N2a, N2b, N3a, N3b, N4a, N4b, N5a, N5b, N6a, N6b, N7a or N7b is a fin field effect transistor (FinFET), a gate all around (GAA) transistor, a nanosheet transistor, a nanowire transistor, or the like. In some embodiments, one or more of transistor N1a, N1b, N2a, N2b, N3a, N3b, N4a, N4b, N5a, N5b, N6a, N6b, N7a or N7b is manufactured as part of a front end of line (FEOL) process.

In some embodiments, one or more of transistor N1a, N1b, N2a, N2b, N3a, N3b, N4a, N4b, N5a, N5b, N6a, N6b, N7a or N7b is a thin film transistor (TFT) having oxide channel regions. In some embodiments, one or more of transistor N1a, N1b, N2a, N2b, N3a, N3b, N4a, N4b, N5a, N5b, N6a, N6b, N7a or N7b is an FeFET, or the like, and is manufactured as part of a back end of line (BEOL) process.

In some embodiments, transistors N1a and N1b are configured as a 2T DRAM cell.

A drain/source terminal of transistor N1a is configured to receive the data signal A. In some embodiments, the drain/source terminal of transistor N1a is coupled to a corresponding read bit line RBL of memory cell array 300B of FIG. 3B.

A gate terminal of transistor N1a is configured to receive a control signal G1a. In some embodiments, the gate terminal of transistor N1a is coupled to a source of the control signal G1a. In some embodiments, the gate terminal of transistor N1a is coupled to a controller, such as controller 606 in FIG. 6. In some embodiments, the control signal G1a is useable to control the switching on/off of transistor N1a.

A source/drain terminal of transistor N1a is configured to output the data signal A in response to control signal G1a. The source/drain terminal of transistor N1a is coupled to a gate terminal of transistor N1b.

Transistor N1a is configured to write data by controlling the voltage of the gate terminal of transistor N1b thereby turning on or off transistor N1b. In some embodiments, if transistor N1a is enabled or turned on, a voltage of the data signal A is configured to control the voltage of the gate terminal of transistor N1b. Thus, in some embodiments, the voltage of the data signal A controls turning on or off transistor N1b. In some embodiments, transistors N1a and N1b are configured as a memory cell, where transistor N1a is the access transistor, and transistor N1b is the storage transistor, and the voltage of the data signal A corresponds to a datum stored in transistor N1b.

In some embodiments, transistor N1b is configured to read data stored therein based on whether transistor N1b is turned on or off. In some embodiments, transistor N1b is configured to output data stored therein based on whether transistor N1b is turned on or off.

In some embodiments, each of a drain/source terminal of transistor N1b, a drain/source terminal of transistor N2b, a drain/source terminal of transistor N3b and a drain/source terminal of transistor N4b are coupled together at node 420. In some embodiments, node 420 has a signal VR. In some embodiments, the signal VR is equal to a supply voltage VDD. In some embodiments, the signal VR is equal to a reference supply voltage VSS.

In some embodiments, each of a source/drain terminal of transistor N1b, a source/drain terminal of transistor N2b, a source/drain terminal of transistor N3b, a source/drain terminal of transistor N4b, a source/drain terminal of transistor N5b, a source/drain terminal of transistor N6b and a source/drain terminal of transistor N7b are coupled together at output node 430. In some embodiments, output node 430 has an output signal Vo.

In some embodiments, at least one or more of transistor N1a, N1b, N2a, N2b, N3a, N3b, N4a, N4b, N5a, N5b, N6a, N6b, Na or N7b is configured to set the output signal Vo.

In some embodiments, transistors N2a and N2b are configured as a 2T DRAM cell.

A drain/source terminal of transistor N2a is configured to receive the data signal A. In some embodiments, the drain/source terminal of transistor N2a is coupled to a corresponding read bit line RBL of memory cell array 300B of FIG. 3B.

A gate terminal of transistor N2a is configured to receive the control signal G1a. In some embodiments, the gate terminal of transistor N2a is coupled to the source of the control signal G1a. In some embodiments, the gate terminal of transistor N2a is coupled to a controller, such as controller 606 in FIG. 6. In some embodiments, the control signal G1a is useable to control the switching on/off of transistor N2a.

A source/drain terminal of transistor N2a is configured to output the data signal A in response to control signal G1a. The source/drain terminal of transistor N2a is coupled to a gate terminal of transistor N2b.

Transistor N2a is configured to write data by controlling the voltage of the gate terminal of transistor N2b thereby turning on or off transistor N2b. In some embodiments, if transistor N2a is enabled or turned on, a voltage of the data signal A is configured to control the voltage of the gate terminal of transistor N2b. Thus, in some embodiments, the voltage of the data signal A controls turning on or off transistor N2b. In some embodiments, transistors N2a and N2b are configured as a memory cell, where transistor N2a is the access transistor, and transistor N2b is the storage transistor, and the voltage of the data signal A corresponds to a datum stored in transistor N2b.

In some embodiments, transistor N2b is configured to read data stored therein based on whether transistor N2b is turned on or off. In some embodiments, transistor N2b is configured to output data stored therein based on whether transistor N2b is turned on or off.

In some embodiments, transistors N3a and N3b are configured as a 2T DRAM cell.

A drain/source terminal of transistor N3a is configured to receive a data signal B. In some embodiments, the drain/source terminal of transistor N3a is coupled to a corresponding read bit line RBL of memory cell array 300B of FIG. 3B.

A gate terminal of transistor N3a is configured to receive a control signal G1b. In some embodiments, the gate terminal of transistor N3a is coupled to a source of the control signal G1b. In some embodiments, the gate terminal of transistor N3a is coupled to a controller, such as controller 606 in FIG. 6. In some embodiments, the control signal G1b is useable to control the switching on/off of transistor N3a.

A source/drain terminal of transistor N3a is configured to output the data signal B in response to control signal G1b. The source/drain terminal of transistor N3a is coupled to a gate terminal of transistor N3b.

Transistor N3a is configured to write data by controlling the voltage of the gate terminal of transistor N3b thereby turning on or off transistor N3b. In some embodiments, if transistor N3a is enabled or turned on, a voltage of the data signal B is configured to control the voltage of the gate terminal of transistor N3b. Thus, in some embodiments, the voltage of the data signal B controls turning on or off transistor N3b. In some embodiments, transistors N3a and N3b are configured as a memory cell, where transistor N3a is the access transistor, and transistor N3b is the storage transistor, and the voltage of the data signal B corresponds to a datum stored in transistor N3b.

In some embodiments, transistor N3b is configured to read data stored therein based on whether transistor N3b is turned on or off. In some embodiments, transistor N3b is configured to output data stored therein based on whether transistor N3b is turned on or off.

In some embodiments, transistors N4a and N4b are configured as a 2T DRAM cell.

A drain/source terminal of transistor N4a is configured to receive the data signal B. In some embodiments, the drain/source terminal of transistor N4a is coupled to a corresponding read bit line RBL of memory cell array 300B of FIG. 3B.

A gate terminal of transistor N4a is configured to receive the control signal G1b. In some embodiments, the gate terminal of transistor N4a is coupled to the source of the control signal G1b. In some embodiments, the gate terminal of transistor N4a is coupled to a controller, such as controller 606 in FIG. 6. In some embodiments, the control signal G1b is useable to control the switching on/off of transistor N4a.

A source/drain terminal of transistor N4a is configured to output the data signal B in response to control signal G1b. The source/drain terminal of transistor N4a is coupled to a gate terminal of transistor N4b.

Transistor N4a is configured to write data by controlling the voltage of the gate terminal of transistor N4b thereby turning on or off transistor N4b. In some embodiments, if transistor N4a is enabled or turned on, a voltage of the data signal B is configured to control the voltage of the gate terminal of transistor N4b. Thus, in some embodiments, the voltage of the data signal B controls turning on or off transistor N4b. In some embodiments, transistors N4a and N4b are configured as a memory cell, where transistor N4a is the access transistor, and transistor N4b is the storage transistor, and the voltage of the data signal B corresponds to a datum stored in transistor N4b.

In some embodiments, transistor N4b is configured to read data stored therein based on whether transistor N4b is turned on or off. In some embodiments, transistor N4b is configured to output data stored therein based on whether transistor N4b is turned on or off.

In some embodiments, transistors N5a and N5b are configured as a 2T DRAM cell.

A drain/source terminal of transistor N5a is configured to receive a control signal C1. In some embodiments, the drain/source terminal of transistor N5a is coupled to a corresponding read bit line RBL of memory cell array 300B of FIG. 3B.

A gate terminal of transistor N5a is configured to receive a control signal G2a. In some embodiments, the gate terminal of transistor N5a is coupled to a source of the control signal G2a. In some embodiments, the gate terminal of transistor Na is coupled to a controller, such as controller 606 in FIG. 6. In some embodiments, the control signal G2a is useable to control the switching on/off of transistor N5a.

A source/drain terminal of transistor N5a is configured to output the control signal C1 in response to control signal G2a. The source/drain terminal of transistor N5a is coupled to a gate terminal of transistor N5b.

Transistor N5a is configured to write data by controlling the voltage of the gate terminal of transistor N5b thereby turning on or off transistor N5b. In some embodiments, if transistor N5a is enabled or turned on, a voltage of the control signal C1 is configured to control the voltage of the gate terminal of transistor N5b. Thus, in some embodiments, the voltage of the control signal C1 controls turning on or off transistor N5b. In some embodiments, transistors N5a and N5b are configured as a memory cell, where transistor N5a is the access transistor, and transistor N5b is the storage transistor, and the voltage of the control signal C1 corresponds to a datum stored in transistor N5b.

In some embodiments, transistor N5b is configured to read data stored therein based on whether transistor N5b is turned on or off. In some embodiments, transistor N5b is configured to output data stored therein based on whether transistor N5b is turned on or off.

In some embodiments, each of a drain/source terminal of transistor N5b, a drain/source terminal of transistor N6b and a drain/source terminal of transistor N7b are coupled together at node 422. In some embodiments, node 422 has a voltage equal to a reference supply voltage VSS. In some embodiments, node 422 has voltage equal to the supply voltage VDD.

In some embodiments, transistors N6a and N6b are configured as a 2T DRAM cell.

A drain/source terminal of transistor N6a is configured to receive a control signal C2. In some embodiments, the drain/source terminal of transistor N6a is coupled to a corresponding read bit line RBL of memory cell array 300B of FIG. 3B.

A gate terminal of transistor N6a is configured to receive a control signal G2b. In some embodiments, the gate terminal of transistor N6a is coupled to a source of the control signal G2b. In some embodiments, the gate terminal of transistor N6a is coupled to a controller, such as controller 606 in FIG. 6. In some embodiments, the control signal G2b is useable to control the switching on/off of transistor N6a.

A source/drain terminal of transistor N6a is configured to output the control signal C2 in response to control signal G2b. The source/drain terminal of transistor N6a is coupled to a gate terminal of transistor N6b.

Transistor N6a is configured to write data by controlling the voltage of the gate terminal of transistor N6b thereby turning on or off transistor N6b. In some embodiments, if transistor N6a is enabled or turned on, a voltage of the control signal C2 is configured to control the voltage of the gate terminal of transistor N6b. Thus, in some embodiments, the voltage of the control signal C2 controls turning on or off transistor N6b. In some embodiments, transistors N6a and N6b are configured as a memory cell, where transistor N6a is the access transistor, and transistor N6b is the storage transistor, and the voltage of the control signal C2 corresponds to a datum stored in transistor N6b.

In some embodiments, transistor N6b is configured to read data stored therein based on whether transistor N6b is turned on or off. In some embodiments, transistor N6b is configured to output data stored therein based on whether transistor N6b is turned on or off.

In some embodiments, transistors N7a and N7b are configured as a 2T DRAM cell.

A drain/source terminal of transistor N7a is configured to receive a control signal C3. In some embodiments, the drain/source terminal of transistor N7a is coupled to a corresponding read bit line RBL of memory cell array 300B of FIG. 3B.

A gate terminal of transistor N7a is configured to receive a control signal G2c. In some embodiments, the gate terminal of transistor Na is coupled to a source of the control signal G2c. In some embodiments, the gate terminal of transistor N7a is coupled to a controller, such as controller 606 in FIG. 6. In some embodiments, the control signal G2c is useable to control the switching on/off of transistor N7a.

A source/drain terminal of transistor N7a is configured to output the control signal C3 in response to control signal G2c. The source/drain terminal of transistor Na is coupled to a gate terminal of transistor N7b.

Transistor N7a is configured to write data by controlling the voltage of the gate terminal of transistor N7b thereby turning on or off transistor N7b. In some embodiments, if transistor N7a is enabled or turned on, a voltage of the control signal C3 is configured to control the voltage of the gate terminal of transistor N7b. Thus, in some embodiments, the voltage of the control signal C3 controls turning on or off transistor N7b. In some embodiments, transistors N7a and N7b are configured as a memory cell, where transistor Na is the access transistor, and transistor N7b is the storage transistor, and the voltage of the control signal C3 corresponds to a datum stored in transistor N7b.

In some embodiments, transistor N7b is configured to read data stored therein based on whether transistor N7b is turned on or off. In some embodiments, transistor N7b is configured to output data stored therein based on whether transistor N7b is turned on or off.

Other transistor terminals for one or more of transistor N1a, N1b, N2a, N2b, N3a, N3b, N4a, N4b, N5a, N5b, N6a, N6b, N7a or N7b are within the scope of the present disclosure.

Other number of transistors or transistor types for one or more of transistor N1a, N1b, N2a, N2b, N3a, N3b, N4a, N4b, N5a, N5b, N6a, N6b, N7a or N7b are within the scope of the present disclosure.

Other configurations or quantities of transistors in memory circuit 400A are within the scope of the present disclosure.

FIG. 4B is a table 400B of an OR gate 400C usable as memory circuit 400A, in accordance with some embodiments.

Table 400B includes values for control signals C1, C2, C3, A and B, and values for output signal Vo when memory circuit 400A is configured as OR gate 400C. Stated differently, in some embodiments, memory circuit 400A is configured to be OR gate 400C based on values for at least one of a control signal C1, a control signal C2 or a control signal C3 as shown in Table 400B.

For example, as shown in Table 400B, memory circuit 400A is configured as OR gate 400C when the control signal C1 is logically low (e.g., logic 0), the control signal C2 is logically low (e.g., logic 0), and the control signal C3 is logically high (e.g., logic 1), in accordance with some embodiments. In these embodiments, control signals A and B are usable as input signals of OR gate 400C, and are used to generate output signal Vo which is consistent with the output values of an OR gate.

For example, as shown in Table 400B, memory circuit 400A is configured as OR gate 400C when the control signal C1 is logically low (e.g., logic 0), the control signal C2 is logically high (e.g., logic 1), and the control signal C3 is logically low (e.g., logic 0), in accordance with some embodiments.

For example, as shown in Table 400B, memory circuit 400A is configured as OR gate 400C when the control signal C1 is logically high (e.g., logic 1), the control signal C2 is logically low (e.g., logic 0), and the control signal C3 is logically low (e.g., logic 0), in accordance with some embodiments.

In some embodiments, further description of operation of memory circuit 400A is described below in FIGS. 18A-18B.

Other configurations or values in Table 400B are within the scope of the present disclosure.

FIG. 4C is a circuit diagram of OR gate 400C, in accordance with some embodiments.

OR gate 400C has a first input terminal configured to receive data signal A, and a second input terminal configured to receive data signal B. OR gate 400C is configured to generate the output signal Vo based on control signals A and B. OR gate 400C has an output terminal configured to output the output signal Vo.

In some embodiments, OR gate 400C is usable as memory circuit 400A when the values of Table 400B are used for control signal C1, control signal C2 and control signal C3.

Other configurations or quantities of terminals in OR gate 400C are within the scope of the present disclosure.

FIG. 4D is a table 400D of an AND gate 400E usable as memory circuit 400A, in accordance with some embodiments.

Table 400D includes values for control signals C1, C2, C3, A and B, and values for output signal Vo when memory circuit 400A is configured as AND gate 400E. Stated differently, in some embodiments, memory circuit 400A is configured to be AND gate 400E based on values for at least one of a control signal C1, a control signal C2 or a control signal C3 as shown in Table 400D.

For example, as shown in Table 400D, memory circuit 400A is configured as AND gate 400E when the control signal C1 is logically high (e.g., logic 1), the control signal C2 is logically high (e.g., logic 1), and the control signal C3 is logically high (e.g., logic 1), in accordance with some embodiments. In these embodiments, control signals A and B are usable as input signals of AND gate 400E, and are used to generate output signal Vo which is consistent with the output values of an AND gate.

Other configurations or values in Table 400D are within the scope of the present disclosure.

FIG. 4E is a circuit diagram of AND gate 400E, in accordance with some embodiments.

AND gate 400E has a first input terminal configured to receive data signal A, and a second input terminal configured to receive data signal B. AND gate 400E is configured to generate the output signal Vo based on control signals A and B. AND gate 400E has an output terminal configured to output the output signal Vo.

In some embodiments, AND gate 400E is usable as memory circuit 400A when the values of Table 400D are used for control signal C1, control signal C2 and control signal C3.

Figure 5:
FIG. 5 is a graph of a corresponding waveform of the memory circuit of FIG. 4A, in accordance with some embodiments.
Figure 18A:
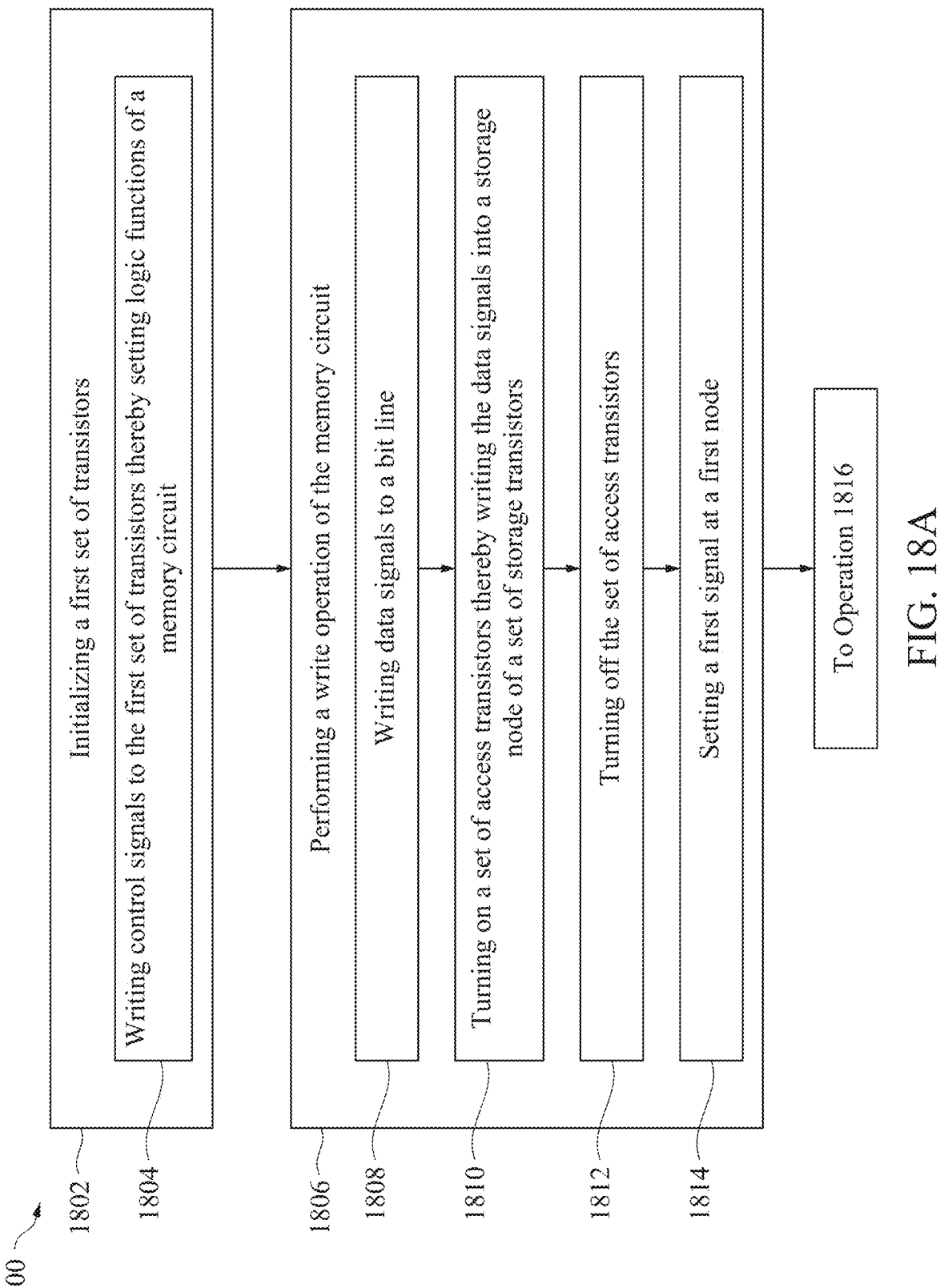
FIGS. 18A-18B are a flowchart of a method of operating a circuit, in accordance with some embodiments.
Figure 18B:
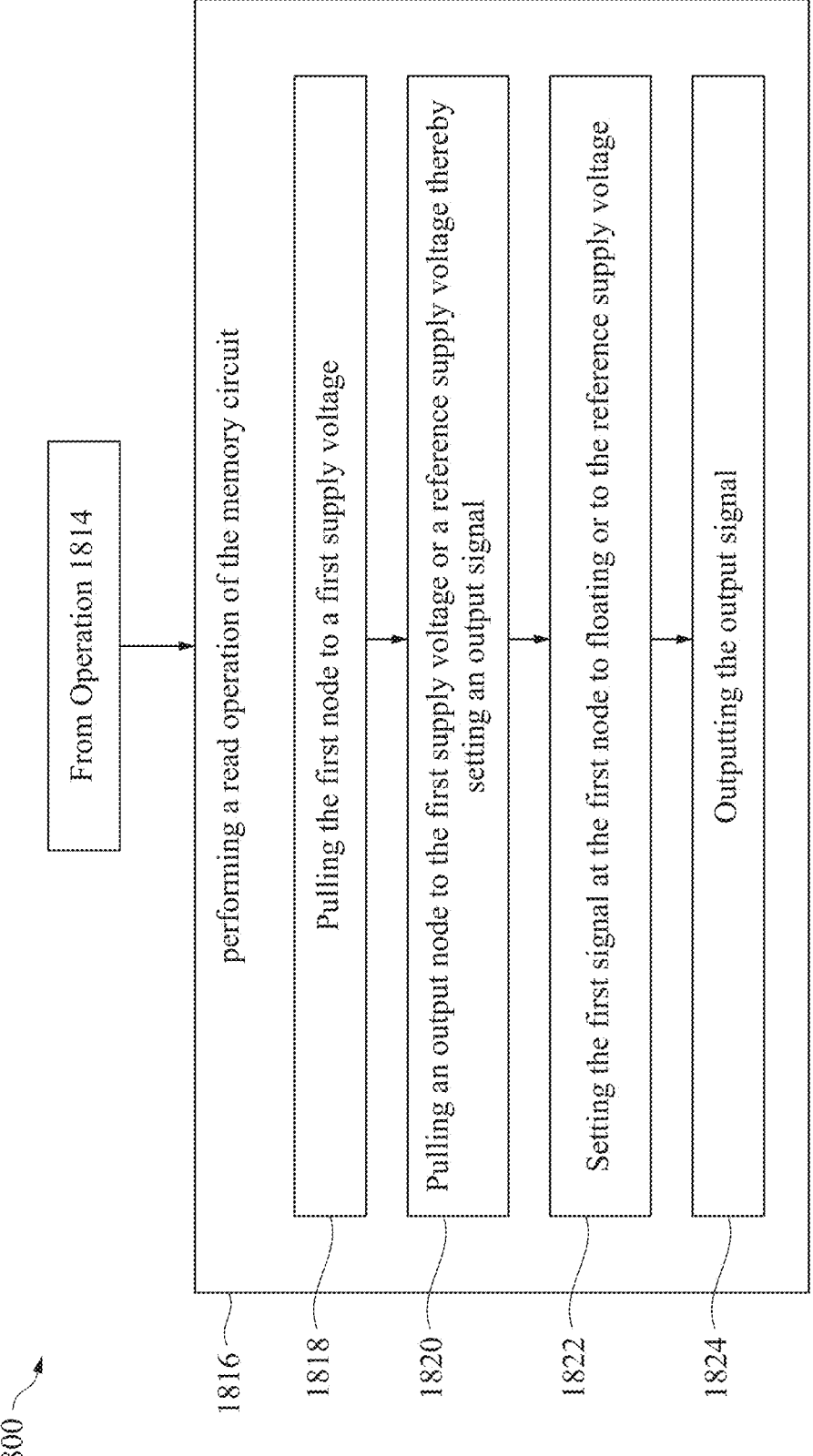

Further operations of one or more of memory circuit 400A, table 400B, OR gate 400C, Table 400D or AND gate 400E are described in timing diagram 500 of FIG. 5, and method 1800 of FIGS. 18A-18B.

Other configurations or quantities of terminals in AND gate 400E are within the scope of the present disclosure.

FIG. 5 is a graph of a corresponding waveform 500 of memory circuit 400A of FIG. 4A, in accordance with some embodiments.

In some embodiments, waveform 500 is an example of the initialization mode, the write mode and the read mode of memory circuit 400A of FIG. 4A.

The initialization (shown as "initiate" in FIG. 5) mode is from time T0 and T3, the write mode is from time T3 and T7, and the read mode is from time T7 and T10. Other times for at least one of the initialization mode, the write mode or the read mode are within the scope of the present disclosure.

Waveform 500 includes control signal C1, control signal G2a, control signal G1a, data signal A, data signal B, signal VR and output signal Vo.

At time T0, each of control signal C1, control signal G2a, control signal G1a, data signal A, data signal B, signal VR, and output signal Vo are equal to logical 0. In some embodiments, from one or more adjacent times in time T0-T8, the output signal Vo is electrically floating.

In response to control signal G2a being equal to logical 0, transistor N5a is turned off, thereby decoupling the drain/source terminal of transistor N5a from the gate terminal of transistor N5b.

In response to control signal G1a being equal to logical 0, transistor N1a is turned off, thereby decoupling the drain/source terminal of transistor N1a from the gate terminal of transistor N1b. In response to control signal G1a being equal to logical 0, transistor N2a is turned off, thereby decoupling the drain/source terminal of transistor N2a from the gate terminal of transistor N2b.

At time T1a, control signal C1 transitions to be equal to logical 1. In some embodiments, control signal C1 transitions to logical 1 to initiate the data value to be stored in the gate of transistor N5b.

At time T1b, control signal G2a transitions to be equal to logical 1.

In response to the control signal G2a being equal to logical 1, transistor N5a is turned on, thereby coupling the drain/source terminal of transistor N5a to the gate terminal of transistor N5b, and charging or setting the voltage of the gate terminal of transistor N5b to be equal to logical 1. In response to the voltage of the gate terminal of transistor N5b being equal to logical 1, transistor N5b is turned on thereby coupling the output node 430 to node 422. In some embodiments, by coupling the output node 430 to node 422, the output signal of output node 430 is pulled low towards reference voltage VSS, thereby initiating memory circuit 400A for a read operation or write operation.

At time T2, control signal G2a transitions to be equal to logical 0. In response to the control signal G2a being equal to logical 0, transistor N5a is turned off, thereby decoupling the drain/source terminal of transistor N5a and the gate terminal of transistor N5b. At time T3, control signal C1 transitions to be equal to logical 0.

At time T4, data signal A transitions to be equal to logical 1. In some embodiments, data signal A transitions to logical 1 to initiate the data value to be stored in the gates of transistors N1a and N2a.

At time T5, control signal G1a transitions to be equal to logical 1. In some embodiments, by control signal G1a transitioning to be equal to logical 1, the value of control signal A is written into transistor N1b and transistor N2b.

In response to the control signal G1a being equal to logical 1, transistor N1a is turned on, thereby coupling the drain/source terminal of transistor N1a to the gate terminal of transistor N1b, and charging or setting the voltage of the gate terminal of transistor N1b to be equal to logical 1. In response to the voltage of the gate terminal of transistor N1b being equal to logical 1, transistor N1b is turned on thereby coupling the output node 430 to node 422.

In response to the control signal G1a being equal to logical 1, transistor N2a is turned on, thereby coupling the drain/source terminal of transistor N2a to the gate terminal of transistor N2b, and charging or setting the voltage of the gate terminal of transistor N2b to be equal to logical 1. In response to the voltage of the gate terminal of transistor N2b being equal to logical 1, transistor N2b is turned on thereby coupling the output node 430 to node 422.

At time T6, control signal G1a transitions to be equal to logical 0. In response to the control signal G1a being equal to logical 0, transistor N1a is turned off, thereby decoupling the drain/source terminal of transistor N1a and the gate terminal of transistor N1b. In response to the control signal G1a being equal to logical 0, transistor N2a is turned off, thereby decoupling the drain/source terminal of transistor N2a and the gate terminal of transistor N1b.

At time T7, data signal A transitions to be equal to logical 0.

At time T8, signal VR transitions to be equal to logical 1 or supply voltage VDD.

In some embodiments, at time T8, transistors N1b and N2b are turned on, thereby coupling node 422 and the output node 430 together.

In response to signal VR being equal to logical 1 or supply voltage VDD, and in response to at least one of transistor N1b or transistor N2b being turned on, the output signal Vo of output node 430 is pulled high towards supply voltage VSS, thereby outputting the value (logical 1) stored in transistors N1b and N2b during the read operation.

While waveform 500 is described with respect to memory circuit 400A and table 400B when control signal C1 is a logically high (logic 1), waveform 500 is applicable to each of the entries in table 400B and table 400D in a similar manner, and similar detailed description is therefore omitted.

In some embodiments, memory circuit 400A achieves benefits similar to one or more benefits discussed herein.

Other configurations of waveform 500 are within the scope of the present disclosure.

Figure 6:
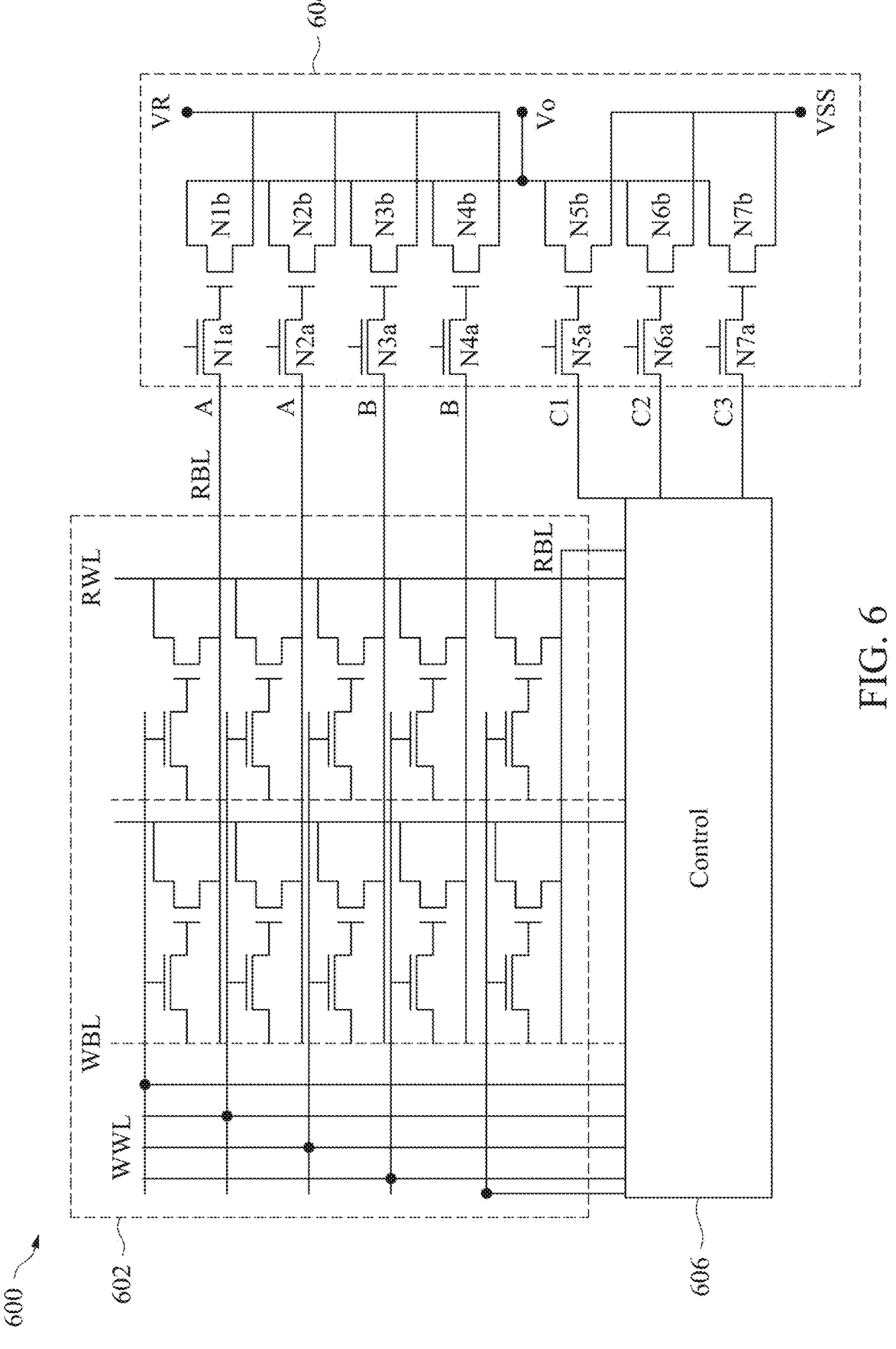
FIG. 6 is a circuit diagram of a memory circuit, in accordance with some embodiments.

FIG. 6 is a circuit diagram of a memory circuit 600, in accordance with some embodiments.

Memory circuit 600 is an embodiment of a portion of memory device 100 of FIG. 1 expressed in a schematic diagram, and similar detailed description is therefore omitted.

In some embodiments, memory circuit 600 is an embodiment of memory array 102 of FIG. 1, adder circuit 104 of FIG. 1 and controller 120, and similar detailed description is therefore omitted.

In some embodiments, memory circuit 600 combines the features of memory array 102 of FIG. 1, adder circuit 104 of FIG. 1 and controller 120 with memory circuit 400A of FIG. 4A and memory cell array 300B of FIG. 3B, and similar detailed description is therefore omitted.

Memory circuit 600 includes a memory cell array 602, an adder circuit 604 and a controller 606.

In some embodiments, the memory cell array 602 is similar to the memory cell array 300B of FIG. 3B, the adder circuit 604 is similar to the memory circuit 400A of FIG. 4A, and the controller 606 is similar to the controller 120 of FIG. 1, and similar detailed description is therefore omitted.

As shown in FIG. 6, the drain/source terminal of transistor N1*a* is coupled to read bit line RBL[1] of memory cell array 602. In some embodiments, the drain/source terminal of transistor N1*a* is further coupled to a drain/source terminal of each corresponding transistor in row 1 of memory cell array 602 by read bit line RBL[1]. In some embodiments, the drain/source terminal of transistor N1*a* is further coupled to a drain/source terminal of corresponding memory cells 302[1,1] and 302[1,2] by read bit line RBL[1].

As shown in FIG. 6, the drain/source terminal of transistor N2*a* is coupled to read bit line RBL[2] of memory cell array 602. In some embodiments, the drain/source terminal of transistor N2*a* is further coupled to a drain/source terminal of each corresponding transistor in row 2 of memory cell array 602 by read bit line RBL[2]. In some embodiments, the drain/source terminal of transistor N2*a* is further coupled to a drain/source terminal of corresponding memory cells 302[2,1] and 302[2,2] by read bit line RBL[2].

As shown in FIG. 6, the drain/source terminal of transistor N3*a* is coupled to read bit line RBL[3] of memory cell array 602. In some embodiments, the drain/source terminal of transistor N3*a* is further coupled to a drain/source terminal of each corresponding transistor in row 3 of memory cell array 602 by read bit line RBL[3]. In some embodiments, the drain/source terminal of transistor N3*a* is further coupled to a drain/source terminal of corresponding memory cells 302[3,1] and 302[3,2] by read bit line RBL[3].

As shown in FIG. 6, the drain/source terminal of transistor N4*a* is coupled to read bit line RBL[4] of memory cell array 602. In some embodiments, the drain/source terminal of transistor N4*a* is further coupled to a drain/source terminal of each corresponding transistor in row 4 of memory cell array 602 by read bit line RBL[4]. In some embodiments, the drain/source terminal of transistor N4*a* is further coupled to a drain/source terminal of corresponding memory cells 302[4,1] and 302[4,2] by read bit line RBL[4].

In some embodiments, the drain/source terminal of transistor N5*a* is coupled to controller 606. In some embodiments, the controller 606 is configured to generate and send the control signal C1 to transistor N5*a*.

In some embodiments, the drain/source terminal of transistor N6*a* is coupled to controller 606. In some embodiments, the controller 606 is configured to generate and send the control signal C2 to transistor N6*a*.

In some embodiments, the drain/source terminal of transistor N7*a* is coupled to controller 606. In some embodiments, the controller 606 is configured to generate and send the control signal C3 to transistor N7*a*.

In some embodiments, the controller 606 is coupled to one or more of write word line WWL, read word line RWL, write bit line WBL or read bit line RBL.

In some embodiments, the controller 606 is configured to generate the write word line signal of the write word line WWL. In some embodiments, the controller 606 is configured to generate the read word line signal of the read word line RWL. In some embodiments, the controller 606 is configured to generate the write bit line signal of the write bit line WBL. In some embodiments, the controller 606 is configured to generate the read bit line signal of the read bit line RBL.

In some embodiments, the write word line WWL, write bit line WBL and transistors N5*a*, N6*a* and N7*a* of adder circuit 604 are controlled by the controller 606. In some embodiments, the controller 606 is a FEOL controller or is manufactured by a FEOL process. In some embodiments, the controller is one or more processors, such as processor 1732 of FIG. 17C.

In some embodiments, the read bit line RBL is configured to interact with the controller 606. In some embodiments, the read bit line RBL is further coupled to the adder circuit 604 for writing data (e.g., by the use of control signals A and B) to the adder circuit 604.

In some embodiments, memory circuit 600 achieves one or more benefits discussed herein in the present application.

Other configurations of memory circuit 600 are within the scope of the present disclosure.

Figure 7A:
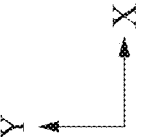
FIG. 7A is a circuit diagram of a memory circuit, in accordance with some embodiments.
Figure 7A:
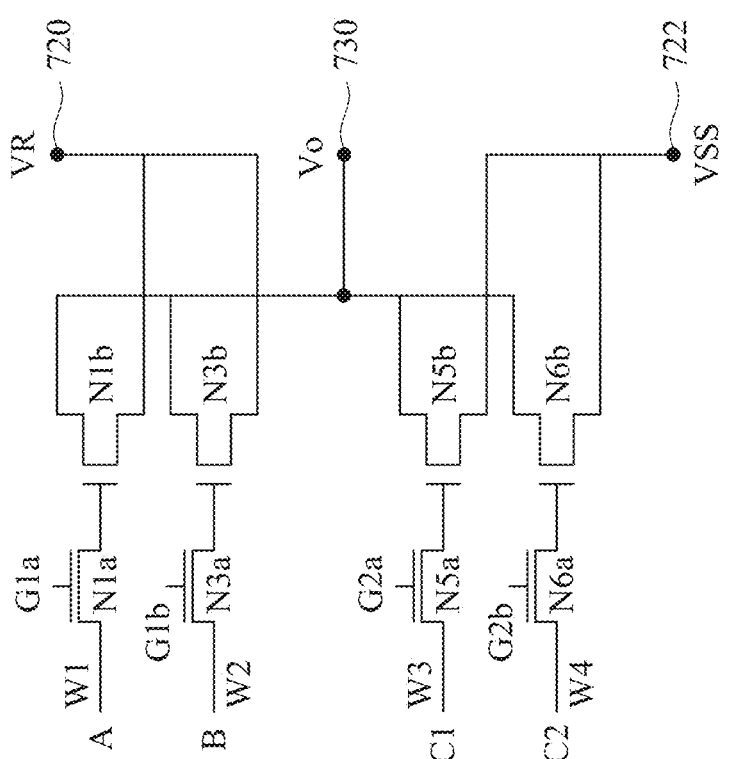
Figure 7A:

FIG. 7A is a circuit diagram of a memory circuit 700A, in accordance with some embodiments.

Figures 7B, 7C:
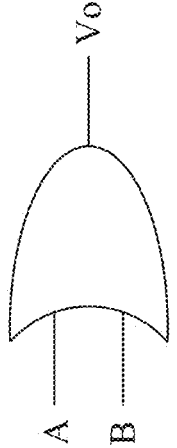
FIG. 7B is a table of an OR gate usable as a memory circuit, in accordance with some embodiments.
FIG. 7C is a circuit diagram of an OR gate, in accordance with some embodiments.

FIG. 7B is a table 700B of an OR gate 700C usable as memory circuit 700A, in accordance with some embodiments.

FIG. 7C is a circuit diagram of OR gate 700C, in accordance with some embodiments.

Figures 7D, 7E:
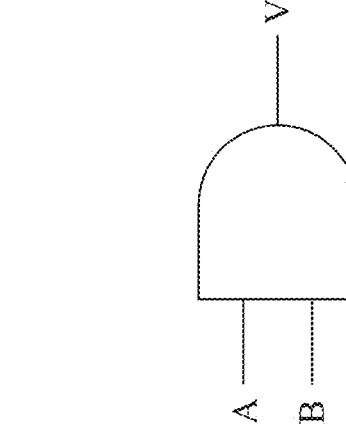
FIG. 7D is a table of an AND gate usable as a memory circuit, in accordance with some embodiments.
FIG. 7E is a circuit diagram of an AND gate, in accordance with some embodiments.

FIG. 7D is a table 700D of an AND gate 700E usable as memory circuit 700A, in accordance with some embodiments.

FIG. 7E is a circuit diagram of AND gate 700E, in accordance with some embodiments.

Memory circuit 700A is an embodiment of adder circuit 104 of FIG. 1 expressed in a schematic diagram, and similar detailed description is therefore omitted.

Memory circuit 700A is usable as adder circuit 104 of FIG. 1 or adder circuit 604 of FIG. 6. In some embodiments, memory circuit 700A is configured to be OR gate 700C or AND gate 700E based on at least one of a control signal C1 or a control signal C2.

Memory circuit 700A is a variation of memory circuit 400A of FIG. 4A, and similar detailed description is therefore omitted. In comparison with memory circuit 400A of FIG. 4A, circuit 700A of FIG. 7A does not include transistor N2*a*, transistor N2*b*, transistor N4*a*, transistor N4*b*, transistor Na or transistor N7*b*, and similar detailed description is therefore omitted.

Memory circuit 700A includes transistor N1$a$, transistor N1$b$, transistor N3$a$, transistor N3$b$, transistor N5$a$, transistor N5$b$, transistor N6$a$ and transistor N6$b$.

In comparison with memory circuit 400A of FIG. 4A, each of the drain/source terminal of transistor N1$b$ and the drain/source terminal of transistor N3$b$ are coupled together at a node 720, in accordance with some embodiments. In some embodiments, node 720 is similar to node 420 of FIG. 4A, and similar detailed description is therefore omitted. In some embodiments, node 720 has the signal VR.

In comparison with memory circuit 400A of FIG. 4A, each of the source/drain terminal of transistor N1$b$, the source/drain terminal of transistor N3$b$, the source/drain terminal of transistor N5$b$ and the source/drain terminal of transistor N6$b$ are coupled together at an output node 730, in accordance with some embodiments. In some embodiments, output node 730 is similar to output node 430 of FIG. 4A, and similar detailed description is therefore omitted. In some embodiments, output node 730 has an output signal Vo.

In comparison with memory circuit 400A of FIG. 4A, each of a drain/source terminal of transistor N5$b$, and a drain/source terminal of transistor N6$b$ are coupled together at node 722, in accordance with some embodiments. In some embodiments, node 722 is similar to node 422 of FIG. 4A, and similar detailed description is therefore omitted.

In some embodiments, transistor N1$a$ has a width W1. In some embodiments, the width W1 is a width of an active region (not shown) of transistor N1$a$ in the first direction X.

In some embodiments, transistor N3$a$ has the width W2. In some embodiments, the width W2 is the width of an active region (not shown) of transistor N3$a$ in the first direction X.

In some embodiments, transistor N5$a$ has a width W3. In some embodiments, the width W3 is a width of an active region (not shown) of transistor N5$a$ in the first direction X.

In some embodiments, transistor N6$a$ has a width W4. In some embodiments, the width W4 is a width of an active region (not shown) of transistor N6$a$ in the first direction X.

In some embodiments, the width W4 is less than at least one of width W1, W2 or W3. In some embodiments, the width W4 is equal to a range R1. In some embodiments, the range R1 ranges from about 0.3*W1 to about 0.7*W1. Other ranges or values for the range R1 are within the scope of the present disclosure.

In some embodiments, the width W3 is greater than at least one of width W1 or W2. In some embodiments, the width W3 is equal to a range R2. In some embodiments, the range R2 ranges from about 1.3*W1 to about 1.7*W1. Other ranges or values for the range R2 are within the scope of the present disclosure.

In some embodiments, the width W1 is equal to width W2. In some embodiments, the width W1 is different from width W2. In some embodiments, the width W2 is equal to a range R3. In some embodiments, the range R3 ranges from about 0.9*W1 to about 1.1*W1. Other ranges or values for the range R3 are within the scope of the present disclosure.

In some embodiments, the width W1, W2, W3 or W4 of corresponding transistor N1$a$, N3$a$, N5$a$ or N6$a$ is related to the corresponding speed and driving strength of the corresponding transistor N1$a$, N3$a$, N5$a$ or N6$a$. In some embodiments, an increase in the width W1, W2, W3 or W4 of corresponding transistor N1$a$, N3$a$, N5$a$ or N6$a$ causes the corresponding speed and driving strength of the corresponding transistor N1$a$, N3$a$, N5$a$ or N6$a$ to increase. In some embodiments, a decrease in the width W1, W2, W3 or W4 of corresponding transistor N1$a$, N3$a$, N5$a$ or N6$a$ causes the corresponding speed and driving strength of the corresponding transistor N1$a$, N3$a$, N5$a$ or Na to decrease.

In some embodiments, by adjusting one or more of widths W1, W2, W3 or W4 of corresponding transistor N1$a$, N3$a$, N5$a$ or N6$a$, the different speeds and driving strengths allow for the OR function of table 700B and the AND function of table 700D can be realized. Other widths of one or more of widths W1, W2, W3 or W4 are within the scope of the present disclosure.

In some embodiments, memory circuit 700A achieves benefits similar to one or more benefits discussed herein.

Other configurations, quantities of transistors or transistor types in memory circuit 700A are within the scope of the present disclosure.

FIG. 7B is a table 700B of an OR gate 700C usable as memory circuit 700A, in accordance with some embodiments.

Table 700B includes values for control signals C1, C2, A and B, and values for output signal Vo when memory circuit 700A is configured as OR gate 700C. Stated differently, in some embodiments, memory circuit 700A is configured to be OR gate 700C based on values for at least one of a control signal C1 or a control signal C2 as shown in Table 700B.

For example, as shown in Table 700B, memory circuit 700A is configured as OR gate 700C when the control signal C1 is logically high (e.g., logic 1), and the control signal C2 is logically low (e.g., logic 0), in accordance with some embodiments. In these embodiments, control signals A and B are usable as input signals of OR gate 700C, and are used to generate output signal Vo which is consistent with the output values of an OR gate.

Other configurations or values in Table 700B are within the scope of the present disclosure.

FIG. 7C is a circuit diagram of OR gate 700C, in accordance with some embodiments.

In some embodiments, OR gate 700C is similar to OR gate 400C of FIG. 4C, and similar detailed description is therefore omitted.

In some embodiments, OR gate 700C is usable as memory circuit 700A when the values of Table 700B are used for control signal C1 and control signal C2.

Other configurations or quantities of terminals in OR gate 700C are within the scope of the present disclosure.

FIG. 7D is a table 700D of an AND gate 700E usable as memory circuit 700A, in accordance with some embodiments.

Table 700D includes values for control signals C1, C2, A and B, and values for output signal Vo when memory circuit 700A is configured as AND gate 700E. Stated differently, in some embodiments, memory circuit 700A is configured to be AND gate 700E based on values for at least one of a control signal C1 or a control signal C2 as shown in Table 700D.

For example, as shown in Table 700D, memory circuit 700A is configured as AND gate 700E when the control signal C1 is logically low (e.g., logic 0), and the control signal C2 is logically high (e.g., logic 1), in accordance with some embodiments. In these embodiments, control signals A and B are usable as input signals of AND gate 700E, and are used to generate output signal Vo which is consistent with the output values of an AND gate.

Other configurations or values in Table 700D are within the scope of the present disclosure.

FIG. 7E is a circuit diagram of AND gate 700E, in accordance with some embodiments.

In some embodiments, AND gate 700E is usable as memory circuit 700A when the values of Table 700D are used for control signal C1 and control signal C2.

Other configurations or quantities of terminals in AND gate 700E are within the scope of the present disclosure.

Figure 8A:
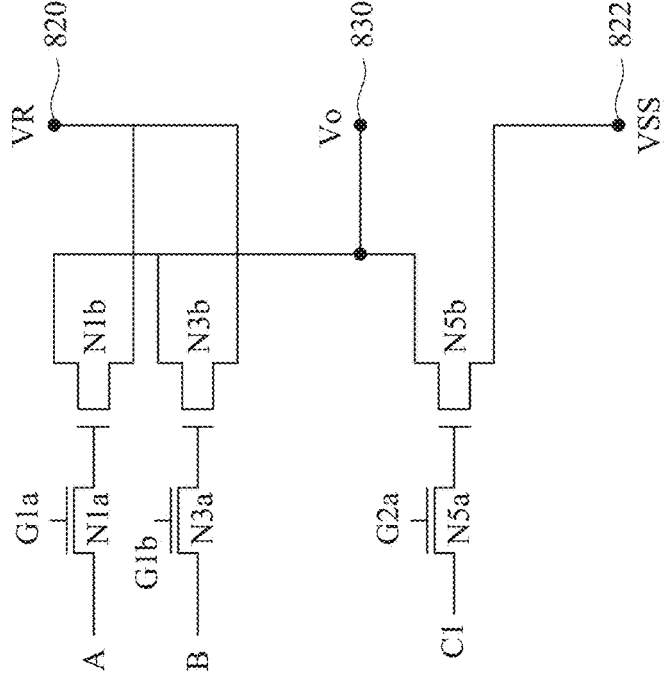
FIG. 8A is a circuit diagram of a memory circuit, in accordance with some embodiments.

FIG. 8A is a circuit diagram of a memory circuit 800A, in accordance with some embodiments.

Figures 8B, 8C:
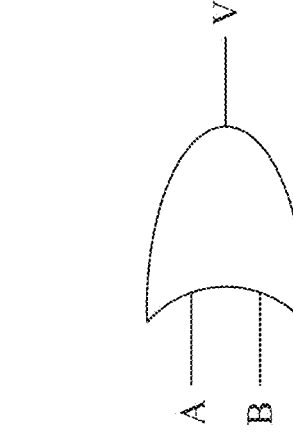
FIG. 8B is a table of an OR gate usable as a memory circuit, in accordance with some embodiments.
FIG. 8C is a circuit diagram of OR gate, in accordance with some embodiments.

FIG. 8B is a table 800B of an OR gate 800C usable as memory circuit 800A, in accordance with some embodiments.

FIG. 8C is a circuit diagram of OR gate 800C, in accordance with some embodiments.

Figures 8D, 8E:
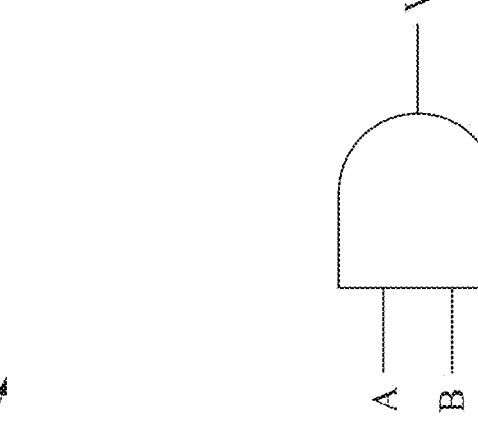
FIG. 8D is a table of an AND gate usable as a memory circuit, in accordance with some embodiments.
FIG. 8E is a circuit diagram of an AND gate, in accordance with some embodiments.

FIG. 8D is a table 800D of an AND gate 800E usable as memory circuit 800A, in accordance with some embodiments.

FIG. 8E is a circuit diagram of AND gate 800E, in accordance with some embodiments.

Memory circuit 800A is an embodiment of adder circuit 104 of FIG. 1 expressed in a schematic diagram, and similar detailed description is therefore omitted.

Memory circuit 800A is usable as adder circuit 104 of FIG. 1 or adder circuit 604 of FIG. 6. In some embodiments, memory circuit 800A is configured to be OR gate 800C or AND gate 800E based on at least one of a control signal C1 or a control signal C2.

Memory circuit 800A is a variation of memory circuit 400A of FIG. 4A, and similar detailed description is therefore omitted. In comparison with memory circuit 400A of FIG. 4A, circuit 800A of FIG. 8A does not include transistor N2a, transistor N2b, transistor N4a, transistor N4b, transistor N6a, transistor N6b, transistor N7a or transistor N7b, and similar detailed description is therefore omitted.

Memory circuit 800A includes transistor N1a, transistor N1b, transistor N3a, transistor N3b, transistor N5a and transistor N5b.

In comparison with memory circuit 400A of FIG. 4A, node 820 replaces node 420 of FIG. 4A, output node 830 replaces output node 430 of FIG. 4A, node 822 replaces node 422 of FIG. 4A, and similar detailed description is therefore omitted.

In comparison with memory circuit 400A of FIG. 4A, each of the drain/source terminal of transistor N1b and the drain/source terminal of transistor N3b are coupled together at node 820, in accordance with some embodiments. In some embodiments, node 820 has the signal VR.

In comparison with memory circuit 400A of FIG. 4A, each of the source/drain terminal of transistor N1b, the source/drain terminal of transistor N3b and the source/drain terminal of transistor N5b are coupled together at an output node 830, in accordance with some embodiments. In some embodiments, output node 830 has an output signal Vo.

In comparison with memory circuit 400A of FIG. 4A, each of a drain/source terminal of transistor N5b, a drain/source terminal of transistor N6b and a drain/source terminal of transistor N7b are coupled together at node 822, in accordance with some embodiments. In some embodiments, node 822 has a reference voltage VSS.

In some embodiments, the control signal C1 is equal to a voltage V1 or a voltage V2. In some embodiments, voltage V1 is different from voltage V2. In some embodiments, voltages V1 and V2 are different from reference supply voltage VSS. In some embodiments, by voltage V1 being different from voltage V2, the operating voltage of transistor N5a can be adjusted based on voltage V1 and V2, and transistor N5a will turn on at a different speed for each of voltage V1 or V2. Other values for voltages V1 and V2 are within the scope of the present disclosure.

In some embodiments, one or more of transistor N1a or N3a has a different operating voltage from transistor N5a. For example, in some embodiments, by using a control signal C1 that has a different voltage (e.g., voltage V1 or V2) from data signal A or B (e.g., VDD or VSS), the operating voltage of transistor N5a can be adjusted thereby adjusting the memory current through transistors N1b, N3b or N5b, thereby allowing for the OR function of table 800B and the AND function of table 700D can be realized.

Other configurations, quantities of transistors or transistor types in memory circuit 800A are within the scope of the present disclosure.

FIG. 8B is a table 800B of an OR gate 800C usable as memory circuit 800A, in accordance with some embodiments.

Table 800B includes values for control signals C1, A and B, and values for output signal Vo when memory circuit 800A is configured as OR gate 800C. In some embodiments, memory circuit 800A is configured to be OR gate 800C when control signal C1 is equal to voltage V1 as shown in Table 800B.

For example, as shown in Table 800B, memory circuit 800A is configured as OR gate 800C when the control signal C1 is equal to voltage V1, in accordance with some embodiments. In these embodiments, control signals A and B are usable as input signals of OR gate 800C, and are used to generate output signal Vo which is consistent with the output values of an OR gate.

Other configurations or values in Table 800B are within the scope of the present disclosure.

FIG. 8C is a circuit diagram of OR gate 800C, in accordance with some embodiments.

In some embodiments, OR gate 800C is similar to OR gate 400C of FIG. 4C, and similar detailed description is therefore omitted.

In some embodiments, OR gate 800C is usable as memory circuit 800A when the values of Table 800B are used for control signal C1 and control signal C2.

Other configurations or quantities of terminals in OR gate 800C are within the scope of the present disclosure.

FIG. 8D is a table 800D of an AND gate 800E usable as memory circuit 800A, in accordance with some embodiments.

Table 800D includes values for control signals C1, C2, A and B, and values for output signal Vo when memory circuit 800A is configured as AND gate 800E. In some embodiments, memory circuit 800A is configured to be AND gate 800E when control signal C1 is equal to voltage V2 as shown in Table 800D.

For example, as shown in Table 800D, memory circuit 800A is configured as AND gate 800E when the control signal C1 is equal to voltage V2, in accordance with some embodiments. In these embodiments, control signals A and B are usable as input signals of AND gate 800E, and are used to generate output signal Vo which is consistent with the output values of an AND gate.

Other configurations or values in Table 800D are within the scope of the present disclosure.

FIG. 8E is a circuit diagram of AND gate 800E, in accordance with some embodiments.

In some embodiments, AND gate 800E is usable as memory circuit 800A when the values of Table 800D are used for control signal C1.

Other configurations or quantities of terminals in AND gate 800E are within the scope of the present disclosure.

Figure 8F:
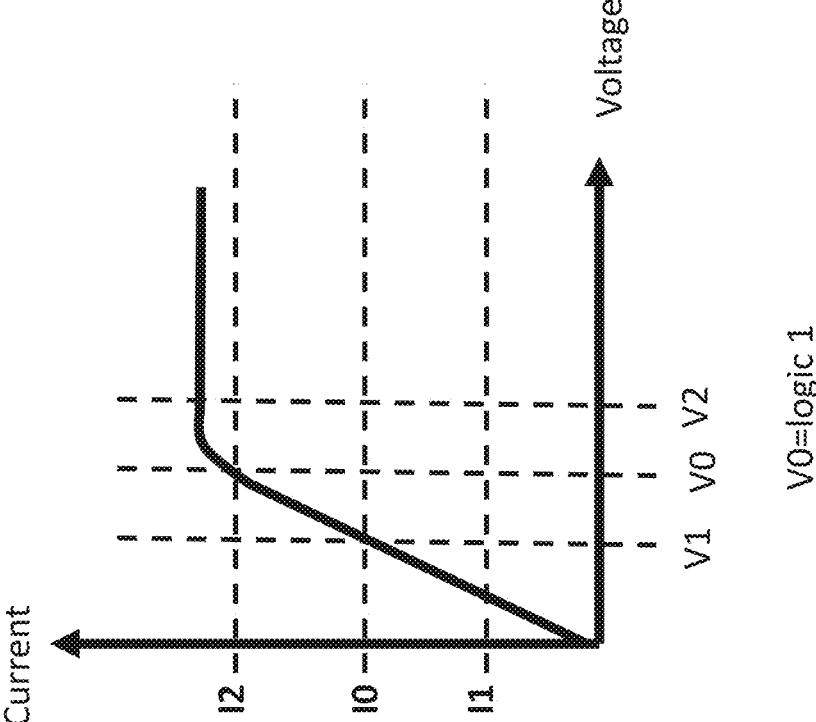
FIG. 8F is a timing diagram of a waveform, in accordance with some embodiments.

FIG. 8F is a timing diagram of a waveform 800F, in accordance with some embodiments.

Waveform 800f includes a diagram of voltages for memory circuit 800A versus corresponding current values of memory circuit 800A.

Waveform 800f includes voltages V1, V2, and V0. In some embodiments, the voltages V1, V2, and V0 are the voltage of control signal C1 of memory circuit 800A. In some embodiments, each voltage V1, V2, and V0 is a voltage useable to generate a corresponding current I1, I2, and I0.

Waveform 800f further includes currents I1, I2, and I0. In some embodiments, the currents I1, I2, and I0 are the current of control signal C1 of memory circuit 800A.

In some embodiments, based on a design of memory circuit 800A, voltages V0, V1 and V2 are different from each other. In some embodiments, voltage V0 is a voltage usable for a logic 1 or a logically high signal.

In some embodiments, I2 is equal to 1.5*I0, and/or I1 is equal to 0.5*I0.

In some embodiments, voltage V0 is a voltage useable to generate current I0.

In some embodiments, voltage V1 is a voltage useable to generate current I1.

In some embodiments, voltage V2 is a voltage useable to generate current I2.

In some embodiments, voltage V2 is greater than voltage V1 and voltage V0.

In some embodiments, voltage V0 is greater than voltage V1.

Other configurations or values of waveforms in waveform 800F are within the scope of the present disclosure.

Figure 9B:
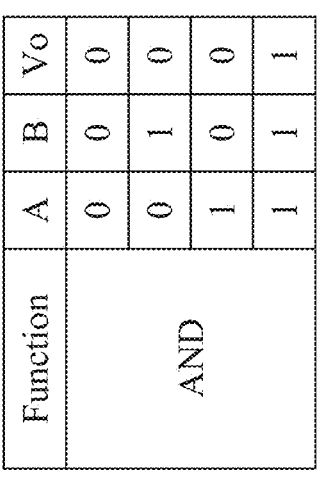
FIG. 9B is a table of an AND gate usable as a memory circuit, in accordance with some embodiments.
Figure 9A:
FIG. 9A is a circuit diagram of a memory circuit, in accordance with some embodiments.
Figure 9A:
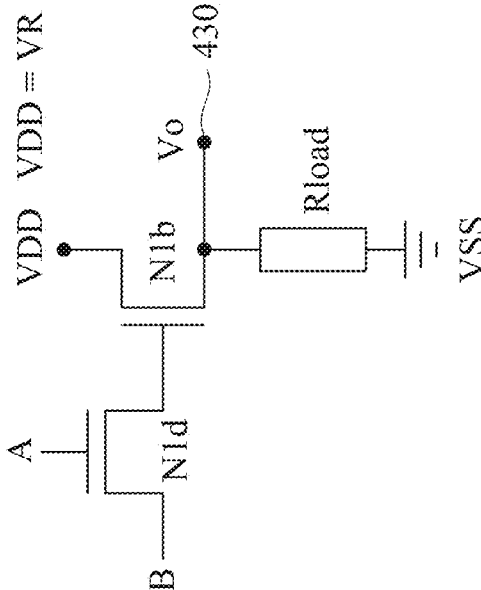

FIG. 9A is a circuit diagram of a memory circuit 900A, in accordance with some embodiments.

FIG. 9B is a table 900B of an AND gate usable as memory circuit 900A, in accordance with some embodiments.

Memory circuit 900A is an embodiment of adder circuit 104 of FIG. 1 expressed in a schematic diagram, and similar detailed description is therefore omitted.

Memory circuit 900A is usable as adder circuit 104 of FIG. 1 or adder circuit 604 of FIG. 6. In some embodiments, memory circuit 900A is configured to be an AND gate.

Memory circuit 900A is a variation of memory circuit 400A of FIG. 4A, and similar detailed description is therefore omitted. For example, memory circuit 900A is a 2T DRAM cell, in accordance with some embodiments.

In comparison with memory circuit 400A of FIG. 4A, circuit 900A of FIG. 9A does not include transistors N1*a*, N2*a*, N2*b*, N3*a*, N3*b*, N4*a*, N4*b*, N5*a*, N5*b*, N6*a*, N6*b*, N7*a* and N7*b*, and similar detailed description is therefore omitted.

Memory circuit 900A includes a transistor N1*d* and transistor N1*b*.

In some embodiments, transistor N1*d* is a variation of transistor N1*a*, and similar detailed description is therefore omitted. In comparison with transistor N1*a* of FIG. 4A, transistor N1*d* is configured to receive data signals A and B, and similar detailed description is therefore omitted.

A drain/source terminal of transistor N1*d* is configured to receive the data signal B. In some embodiments, the drain/source terminal of transistor N1*d* is coupled to a corresponding read bit line RBL of memory cell array 300B of FIG. 3B.

A gate terminal of transistor N1*d* is configured to receive a data signal A. In some embodiments, the gate terminal of transistor N1*d* is coupled to a corresponding read bit line RBL of memory cell array 300B of FIG. 3B.

A source/drain terminal of transistor N1*d* is configured to output the data signal B in response to data signal A. The source/drain terminal of transistor N1*d* is coupled to a gate terminal of transistor N1*b*.

Transistor N1*d* is configured to write data by controlling the voltage of the gate terminal of transistor N1*b* thereby turning on or off transistor N1*b*. In some embodiments, if transistor N1*d* is enabled or turned on, a voltage of the data signal B is configured to control the voltage of the gate terminal of transistor N1*b*. Thus, in some embodiments, the voltage of the data signal B controls turning on or off transistor N1*b*. In some embodiments, transistors N1*d* and N1*b* are configured as a memory cell, where transistor N1*d* is the access transistor, and transistor N1*b* is the storage transistor, and the voltage of the data signal B corresponds to a datum stored in transistor N1*b*.

In some embodiments, transistor N1*b* is configured to read data stored therein based on whether transistor N1*b* is turned on or off. In some embodiments, transistor N1*b* is configured to output data stored therein based on whether transistor N1*b* is turned on or off.

A drain/source terminal of transistor N1*b* is coupled to the supply voltage VDD.

In some embodiments, a source/drain terminal of transistor N1*b* is coupled to output node 430, an output load Rload and to reference supply voltage VSS. In some embodiments, the output load Rload corresponds to a resistance of one or more conductive lines or memory cells (similar to memory circuit 900A).

In some embodiments, memory circuit 900A achieves benefits similar to one or more benefits discussed herein.

Other configurations, quantities of transistors or transistor types in memory circuit 900A are within the scope of the present disclosure.

FIG. 9B is a table 900B of an AND gate usable as memory circuit 900A, in accordance with some embodiments.

Table 900B includes values for data signals A and B, and values for output signal Vo. In some embodiments, memory circuit 900A is an AND gate, and is configured to output the output signal Vo as shown in Table 900B.

In some embodiments, control signals A and B are usable as input signals of an AND gate similar to AND gate 400E, and control signals A and B are used to generate output signal Vo which is consistent with the output values of an AND gate.

Other configurations or values in Table 900B are within the scope of the present disclosure.

Figure 10A:
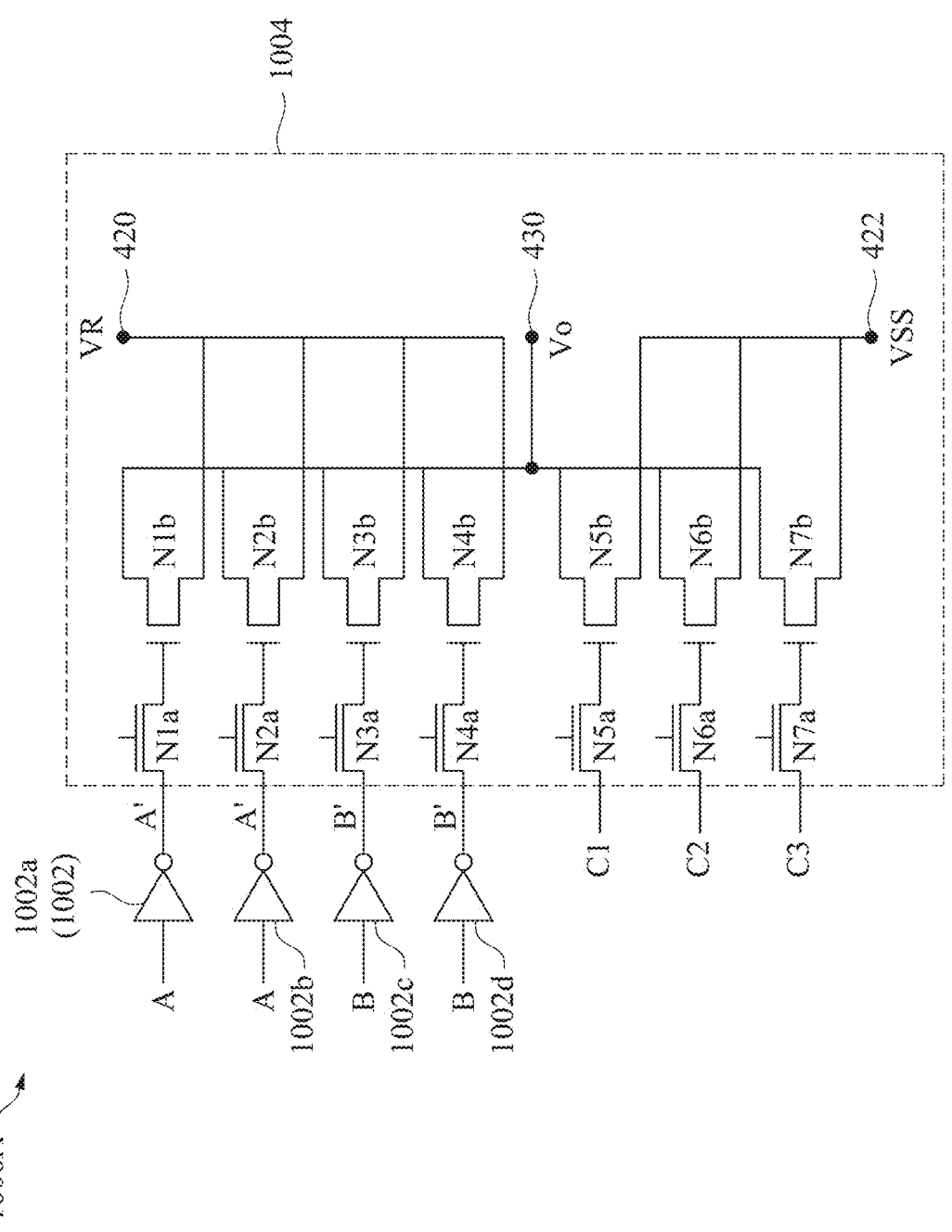
FIG. 10A is a circuit diagram of a memory circuit, in accordance with some embodiments.

FIG. 10A is a circuit diagram of a memory circuit 1000A, in accordance with some embodiments.

Figures 10B, 10C:
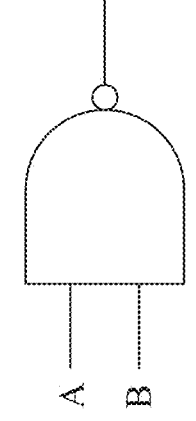
FIG. 10B is a table of a NAND gate usable as a memory circuit, in accordance with some embodiments.
FIG. 10C is a circuit diagram of NAND gate, in accordance with some embodiments.

FIG. 10B is a table 1000B of a NAND gate 1000C usable as memory circuit 1000A, in accordance with some embodiments.

FIG. 10C is a circuit diagram of NAND gate 1000C, in accordance with some embodiments.

Figures 10D, 10E:
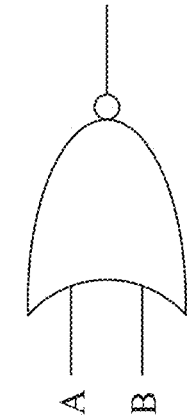
FIG. 10D is a table of a NOR gate usable as a memory circuit, in accordance with some embodiments.
FIG. 10E is a circuit diagram of NOR gate, in accordance with some embodiments.

FIG. 10D is a table 1000D of an NOR gate 1000E usable as memory circuit 1000A, in accordance with some embodiments.

FIG. 10E is a circuit diagram of NOR gate 1000E, in accordance with some embodiments.

Memory circuit 1000A is an embodiment of adder circuit 104 of FIG. 1 expressed in a schematic diagram, and similar detailed description is therefore omitted.

Memory circuit 1000A is usable as adder circuit 104 of FIG. 1 or adder circuit 604 of FIG. 6. In some embodiments, memory circuit 1000A is configured to be NAND gate 1000C or NOR gate 1000E based on at least one of a control signal C1, control signal C2 or control signal C3.

Memory circuit 1000A is a variation of memory circuit 400A of FIG. 4A, and similar detailed description is therefore omitted. In comparison with memory circuit 400A of FIG. 4A, memory circuit 1000A of FIG. 10A further includes a set of inverters 1002, and similar detailed description is therefore omitted.

In comparison with memory circuit 400A of FIG. 4A, memory circuit 1004 of memory circuit 1000A of FIG. 10A replaces memory circuit 400A of FIG. 4A, and similar detailed description is therefore omitted.

Memory circuit 1000A includes the memory circuit 1004 and the set of inverters 1002.

In some embodiments, memory circuit 1004 is memory circuit 400A of FIG. 4A, and similar detailed description is therefore omitted.

In some embodiments, the set of inverters 1002 comprises one or more of inverters 1002a, 1002b, 1002c or 1002d.

Inverter 1002a is configured to generate a corresponding inverted data signal A' in response to a corresponding data signal A. In some embodiments, the data signal A is inverted from the inverted data signal A'.

An input terminal of inverter 1002a is coupled to a source of data signal A. In some embodiments, the input terminal of inverter 1002a is coupled to the read bit line RBL. An output terminal of inverter 1002a is coupled to the source/drain terminal of transistor N1a. The output terminal of inverter 1002a is configured to output the inverted data signal A' to the drain/source terminal of transistor N1a. In some embodiments, operation of memory circuit 1004 is similar to memory circuit 400A of FIG. 4A, but the data signal A of memory circuit 400A of FIG. 4A is replaced with inverted data signal A' in memory circuit 1000A, and similar detailed description is therefore omitted.

Inverter 1002b is configured to generate a corresponding inverted data signal A' in response to a corresponding data signal A.

An input terminal of inverter 1002b is coupled to a source of data signal A. In some embodiments, the input terminal of inverter 1002b is coupled to the read bit line RBL. An output terminal of inverter 1002b is coupled to the source/drain terminal of transistor N2a. The output terminal of inverter 1002b is configured to output the inverted data signal A' to the drain/source terminal of transistor N2a. In some embodiments, operation of memory circuit 1004 is similar to memory circuit 400A of FIG. 4A, but the data signal A of memory circuit 400A of FIG. 4A is replaced with inverted data signal A' in memory circuit 1000A, and similar detailed description is therefore omitted.

Inverter 1002c is configured to generate a corresponding inverted data signal B' in response to a corresponding data signal B. In some embodiments, the data signal B is inverted from the inverted data signal B'.

An input terminal of inverter 1002c is coupled to a source of data signal B. In some embodiments, the input terminal of inverter 1002c is coupled to the read bit line RBL. An output terminal of inverter 1002c is coupled to the source/drain terminal of transistor N3a. The output terminal of inverter 1002c is configured to output the inverted data signal B' to the drain/source terminal of transistor N3a. In some embodiments, operation of memory circuit 1004 is similar to memory circuit 400A of FIG. 4A, but the data signal B of memory circuit 400A of FIG. 4A is replaced with inverted data signal B' in memory circuit 1000A, and similar detailed description is therefore omitted.

Inverter 1002d is configured to generate a corresponding inverted data signal B' in response to a corresponding data signal B.

An input terminal of inverter 1002d is coupled to a source of data signal B. In some embodiments, the input terminal of inverter 1002d is coupled to the read bit line RBL. An output terminal of inverter 1002d is coupled to the source/drain terminal of transistor N4a. The output terminal of inverter 1002d is configured to output the inverted data signal B' to the drain/source terminal of transistor N4a. In some embodiments, operation of memory circuit 1004 is similar to memory circuit 400A of FIG. 4A, but the data signal B of memory circuit 400A of FIG. 4A is replaced with inverted data signal B' in memory circuit 1000A, and similar detailed description is therefore omitted.

In some embodiments, by adding the set of inverters 1002 to memory circuit 1004, memory circuit 1000A is configured to be NAND gate 1000C or NOR gate 1000E based on at least one of a control signal C1, a control signal C2 or a control signal C3.

In some embodiments, memory circuit 1000A achieves benefits similar to one or more benefits discussed herein.

Other configurations, quantities of transistors or transistor types in memory circuit 1000A are within the scope of the present disclosure.

FIG. 10B is a table 1000B of a NAND gate 1000C usable as memory circuit 1000A, in accordance with some embodiments.

Table 1000B includes values for control signals C1, C2 and C3, data signals A and B, inverted data signals A' and B', and values for output signal Vo when memory circuit 1000A is configured as NAND gate 1000C. Stated differently, in some embodiments, memory circuit 1000A is configured to be NAND gate 1000C based on values for at least one of a control signal C1, control signal C2 or control signal C3 as shown in Table 1000B.

For example, as shown in Table 1000B, memory circuit 1000A is configured as NAND gate 1000C when the control signal C1 is logically low (e.g., logic 0), the control signal C2 is logically low (e.g., logic 0), and the control signal C3 is logically high (e.g., logic 1), in accordance with some embodiments. In these embodiments, data signals A and B are usable as input signals of NAND gate 1000C, and are used to generate output signal Vo which is consistent with the output values of an NAND gate.

For example, as shown in Table 1000B, memory circuit 1000A is configured as NAND gate 1000C when the control signal C1 is logically low (e.g., logic 0), the control signal C2 is logically high (e.g., logic 1), and the control signal C3 is logically low (e.g., logic 0), in accordance with some embodiments.

For example, as shown in Table 1000B, memory circuit 1000A is configured as NAND gate 1000C when the control signal C1 is logically high (e.g., logic 1), the control signal C2 is logically low (e.g., logic 0), and the control signal C3 is logically low (e.g., logic 0), in accordance with some embodiments.

Other configurations or values in Table 1000B are within the scope of the present disclosure.

FIG. 10C is a circuit diagram of NAND gate 1000C, in accordance with some embodiments.

In some embodiments, NAND gate 1000C is similar to AND gate 400E of FIG. 4E, and similar detailed description is therefore omitted.

In some embodiments, NAND gate 1000C is usable as memory circuit 1000A when the values of Table 1000B are used for control signal C1, control signal C2 and control signal C3.

Other configurations or quantities of terminals in NAND gate 1000C are within the scope of the present disclosure.

FIG. 10D is a table 1000D of a NAND gate 1000E usable as memory circuit 1000A, in accordance with some embodiments.

Table 1000D includes values for control signals C1, C2 and C3, data signals A and B, inverted data signals A' and B', and values for output signal Vo when memory circuit 1000A is configured as NAND gate 1000E. Stated differently, in some embodiments, memory circuit 1000A is configured to be NOR gate 1000E based on values for at least one of a control signal C1, control signal C2 or control signal C3 as shown in Table 1000D.

For example, as shown in Table 1000D, memory circuit 1000A is configured as NOR gate 1000E when the control signal C1 is logically high (e.g., logic 1), the control signal C2 is logically high (e.g., logic 1), and the control signal C3 is logically high (e.g., logic 1), in accordance with some embodiments. In these embodiments, data signals A and B are usable as input signals of NOR gate 1000E, and are used to generate output signal Vo which is consistent with the output values of an NOR gate.

Other configurations or values in Table 1000D are within the scope of the present disclosure.

FIG. 10E is a circuit diagram of NOR gate 1000E, in accordance with some embodiments.

In some embodiments, NOR gate 1000E is usable as memory circuit 1000A when the values of Table 1000D are used for control signal C1, control signal C2 and control signal C3.

Other configurations or quantities of terminals in NOR gate 1000E are within the scope of the present disclosure.

Figures 11A, 11B:
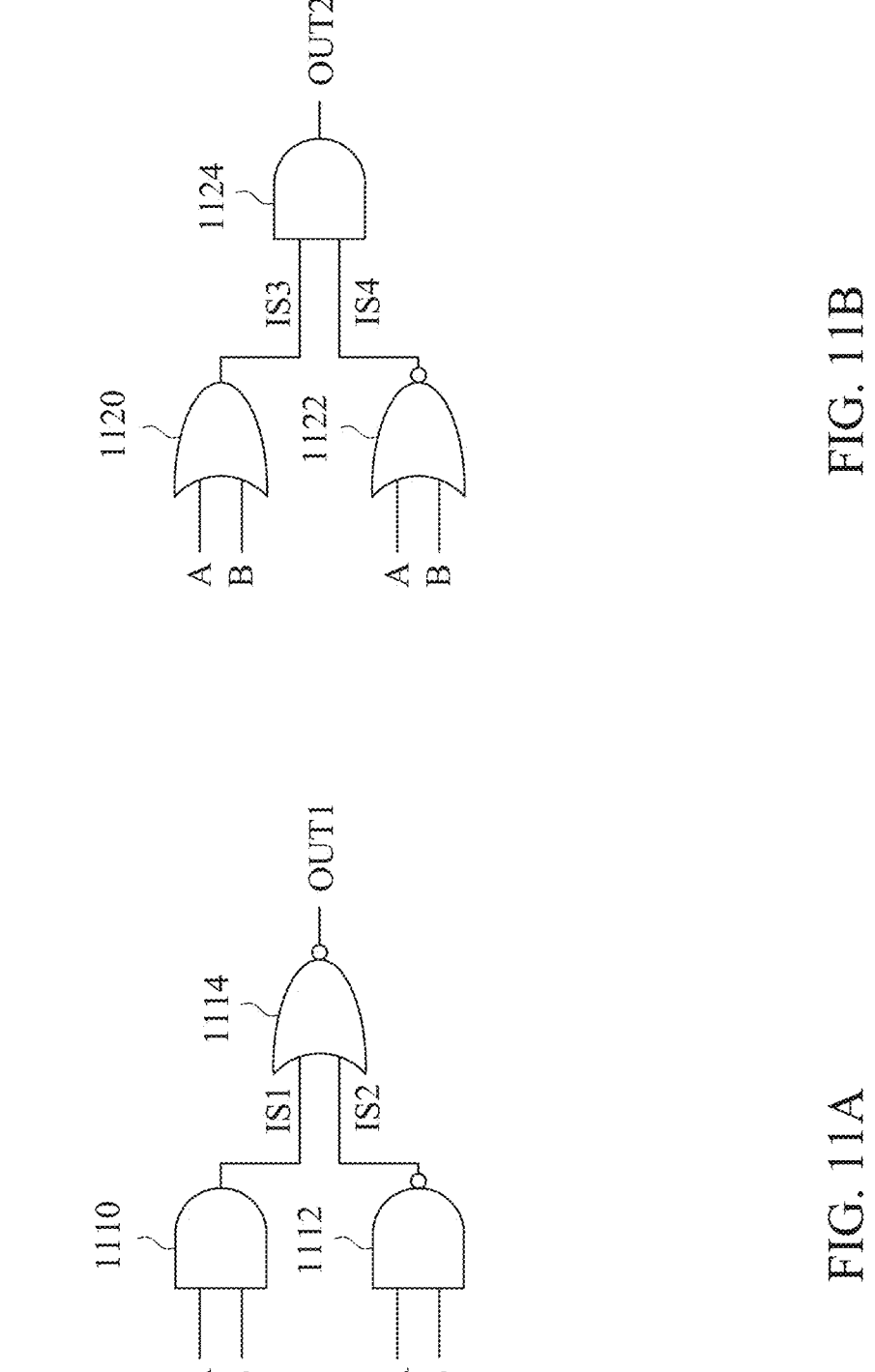
FIG. 11A is a circuit diagram of an XOR logic gate, in accordance with some embodiments.
FIG. 11B is a circuit diagram of an XOR logic gate, in accordance with some embodiments.

FIG. 11A is a circuit diagram of an XOR logic gate 1100A, in accordance with some embodiments.

XOR logic gate 1100A is an embodiment of adder circuit 104 of FIG. 1 expressed in a schematic diagram, and similar detailed description is therefore omitted.

XOR logic gate 1100A is usable as adder circuit 104 of FIG. 1 or adder circuit 604 of FIG. 6.

XOR logic gate 1100A is configured to generate an output signal OUT1 in response to data signal A and data signal B.

XOR logic gate 1100A includes an AND gate 1110, a NAND gate 1112 and a NOR gate 1114.

In some embodiments, NOR gate 1114 is memory circuit 1000A of FIG. 10A when configured as NOR gate 1000E of FIG. 10E, and similar detailed description is therefore omitted.

In some embodiments, at least one of AND gate 1110 or NAND gate 1112 is memory circuit 400A of FIG. 4A when configured as AND gate 400E of FIG. 4E, and similar detailed description is therefore omitted. In some embodiments, at least one of AND gate 1110 or NAND gate 1112 is memory circuit 700A of FIG. 7A when configured as AND gate 700E of FIG. 7E, and similar detailed description is therefore omitted. In some embodiments, at least one of AND gate 1110 or NAND gate 1112 is memory circuit 800A of FIG. 8A when configured as AND gate 800E of FIG. 8E, and similar detailed description is therefore omitted. In some embodiments, at least one of AND gate 1110 or NAND gate 1112 is memory circuit 900A of FIG. 9B when configured as an AND of FIG. 8B, and similar detailed description is therefore omitted.

AND gate 1110 is configured to generate a signal IS1 in response to data signal A and data signal B. In some embodiments, the signal IS1 corresponds to an AND operation of data signal A and data signal B.

A first input terminal of AND gate 1110 is coupled to the source of data signal A. A second input terminal of AND gate 1110 is coupled to the source of data signal B. In some embodiments, the first input terminal of AND gate 1110 and the second input terminal of AND gate 1110 are coupled to the read bit line RBL.

The first input terminal of AND gate 1110 is configured to receive data signal A. The second input terminal of AND gate 1110 is configured to receive data signal B.

An output terminal of AND gate 1110 is configured to output the signal IS1 to a first input terminal of NOR gate 1114.

NAND gate 1112 is configured to generate a signal IS2 in response to data signal A and data signal B. In some embodiments, the signal IS2 corresponds to a NAND operation of data signal A and data signal B.

A first input terminal of NAND gate 1112 is coupled to the source of data signal A. A second input terminal of NAND gate 1112 is coupled to the source of data signal B. In some embodiments, the first input terminal of NAND gate 1112 and the second input terminal of NAND gate 1112 are coupled to the read bit line RBL.

The first input terminal of NAND gate 1112 is configured to receive data signal A. The second input terminal of NAND gate 1112 is configured to receive data signal B.

An output terminal of NAND gate 1112 is configured to output the signal IS2 to a second input terminal of NOR gate 1114.

NOR gate 1114 is configured to generate the output signal OUT1 in response to signal IS1 and signal IS2. In some embodiments, the output signal OUT1 corresponds to a NOR operation of signal IS1 and signal IS2. In some embodiments, NOR gate 1114 is FEOL logic circuit. In some embodiments, AND gate 1110 and NAND gate 1112 are corresponding BEOL logic circuits.

A first input terminal of NOR gate 1114 is coupled to the output terminal of AND gate 1110. A second input terminal of NOR gate 1114 is coupled to the output terminal of NAND gate 1112.

The first input terminal of NOR gate 1114 is configured to receive signal IS1. The second input terminal of NOR gate 1114 is configured to receive signal IS2.

An output terminal of NOR gate 1114 is configured to output the signal OUT1.

In some embodiments, XOR logic gate 1100A achieves benefits similar to one or more benefits discussed herein.

Other configurations, quantities of circuits or transistor types in XOR logic gate 1100A are within the scope of the present disclosure.

FIG. 11B is a circuit diagram of an XOR logic gate 1100B, in accordance with some embodiments.

XOR logic gate 1100B is an embodiment of adder circuit 104 of FIG. 1 expressed in a schematic diagram, and similar detailed description is therefore omitted.

XOR logic gate 1100B is usable as adder circuit 104 of FIG. 1 or adder circuit 604 of FIG. 6.

XOR logic gate 1100B is configured to generate an output signal OUT2 in response to data signal A and data signal B.

XOR logic gate 1100B includes an OR gate 1120, a NOR gate 1122 and an AND gate 1124.

In some embodiments, NOR gate 1122 is memory circuit 1000A of FIG. 10A when configured as NOR gate 1000E of FIG. 10E, and similar detailed description is therefore omitted.

In some embodiments, OR gate 1120 is memory circuit 400A of FIG. 4A when configured as OR gate 400C of FIG. 4E, and similar detailed description is therefore omitted. In some embodiments, OR gate 1120 is memory circuit 700A of FIG. 7A when configured as OR gate 700C of FIG. 7C, and similar detailed description is therefore omitted. In some embodiments, OR gate 1120 is memory circuit 800A of FIG. 8A when configured as OR gate 800C of FIG. 8C, and similar detailed description is therefore omitted.

In some embodiments, AND gate 1124 is memory circuit 400A of FIG. 4A when configured as AND gate 400E of FIG. 4E, and similar detailed description is therefore omitted. In some embodiments, AND gate 1124 is memory circuit 700A of FIG. 7A when configured as AND gate 700E of FIG. 7E, and similar detailed description is therefore omitted. In some embodiments, AND gate 1124 is memory circuit 800A of FIG. 8A when configured as AND gate 800E of FIG. 8E, and similar detailed description is therefore omitted. In some embodiments, AND gate 1124 is memory circuit 900A of FIG. 9A when configured as an AND of FIG. 9B, and similar detailed description is therefore omitted.

OR gate 1120 is configured to generate a signal IS3 in response to data signal A and data signal B. In some embodiments, the signal IS3 corresponds to an OR operation of data signal A and data signal B.

A first input terminal of OR gate 1120 is coupled to the source of data signal A. A second input terminal of OR gate 1120 is coupled to the source of data signal B. In some embodiments, the first input terminal of OR gate 1120 and the second input terminal of OR gate 1120 are coupled to the read bit line RBL.

The first input terminal of OR gate 1120 is configured to receive data signal A. The second input terminal of OR gate 1120 is configured to receive data signal B.

An output terminal of OR gate 1120 is configured to output the signal IS3 to a first input terminal of AND gate 1124.

NOR gate 1122 is configured to generate a signal IS4 in response to data signal A and data signal B. In some embodiments, the signal IS4 corresponds to a NOR operation of data signal A and data signal B.

A first input terminal of NOR gate 1122 is coupled to the source of data signal A. A second input terminal of NOR gate 1122 is coupled to the source of data signal B. In some embodiments, the first input terminal of NOR gate 1122 and the second input terminal of NOR gate 1122 are coupled to the read bit line RBL.

The first input terminal of NOR gate 1122 is configured to receive data signal A. The second input terminal of NOR gate 1122 is configured to receive data signal B.

An output terminal of NOR gate 1122 is configured to output the signal IS4 to a second input terminal of AND gate 1124.

AND gate 1124 is configured to generate the output signal OUT2 in response to signal IS3 and signal IS4. In some embodiments, the output signal OUT2 corresponds to a AND operation of signal IS3 and signal IS4. In some embodiments, AND gate 1124 is FEOL logic circuit. In some embodiments, OR gate 1120 and NOR gate 1122 are corresponding BEOL logic circuits.

A first input terminal of AND gate 1124 is coupled to the output terminal of OR gate 1120. A second input terminal of AND gate 1124 is coupled to the output terminal of NOR gate 1122.

The first input terminal of AND gate 1124 is configured to receive signal IS3. The second input terminal of AND gate 1124 is configured to receive signal IS4.

An output terminal of AND gate 1124 is configured to output the output signal OUT2.

In some embodiments, XOR logic gate 1100B achieves benefits similar to one or more benefits discussed herein.

Other configurations, quantities of circuits or transistor types in XOR logic gate 1100B are within the scope of the present disclosure.

Figure 12A:
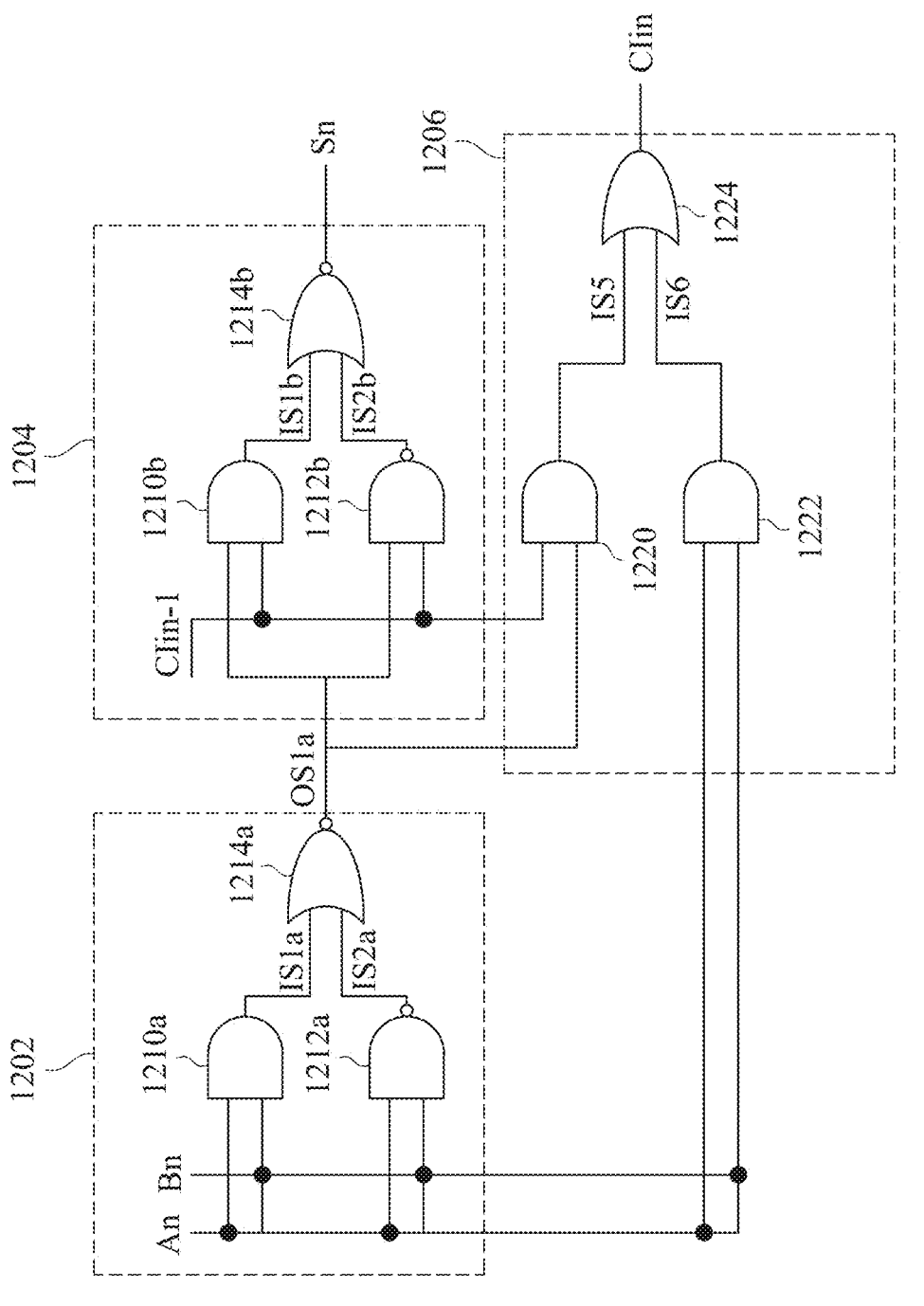
FIG. 12A is a circuit diagram of a full adder circuit, in accordance with some embodiments.

FIG. 12A is a circuit diagram of a full adder circuit 1200A, in accordance with some embodiments.

Figure 12B:
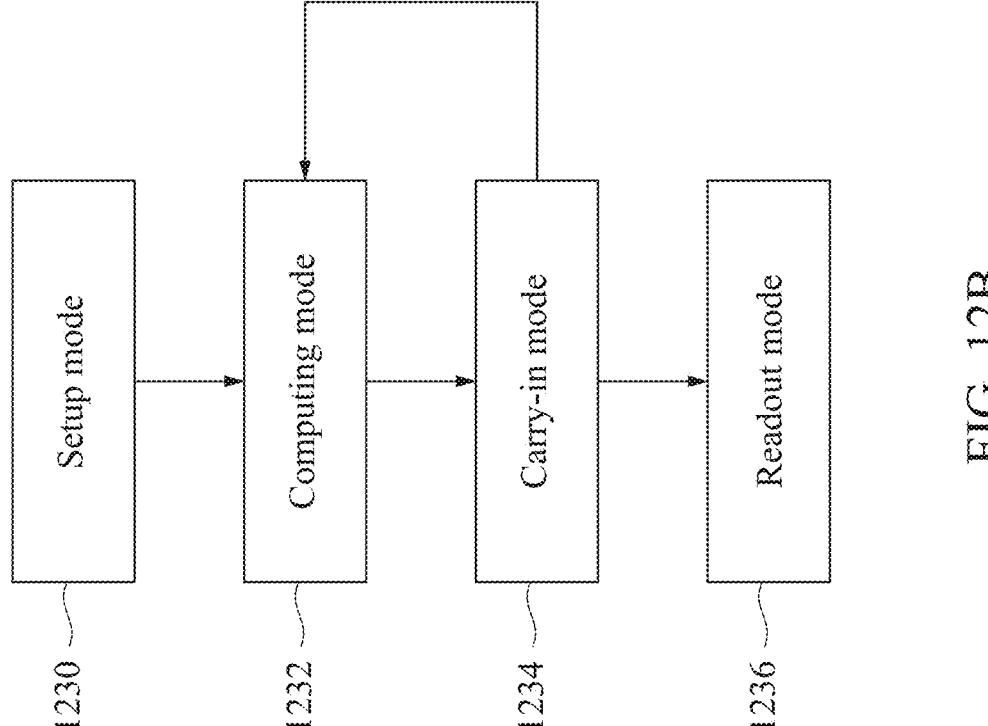
FIG. 12B is a flowchart of a method of operating a circuit, in accordance with some embodiments.

FIG. 12B is a flowchart of a method of operating a circuit, in accordance with some embodiments.

Full adder circuit 1200A is an embodiment of adder circuit 104 of FIG. 1 expressed in a schematic diagram, and similar detailed description is therefore omitted.

Full adder circuit 1200A is usable as adder circuit 104 of FIG. 1 or adder circuit 604 of FIG. 6.

Full adder circuit 1200A is configured to generate a sum signal Sn and a carry signal Clin in response to data signal An and data signal Bn. In some embodiments, the sum Sn is the nth bit of sum signal S. In some embodiments, data signal An is the nth bit of data signal A. In some embodiments, data signal Bn is the nth bit of data signal B.

Full adder circuit 1200A includes an XOR logic gate 1202, an XOR logic gate 1204 and a circuit 1206.

In some embodiments, XOR logic gate 1202 is XOR logic gate 1100A of FIG. 11A, and similar detailed description is therefore omitted. In some embodiments, XOR logic gate 1204 is XOR logic gate 1100A of FIG. 11A, and similar detailed description is therefore omitted.

XOR logic gate 1202 includes an AND gate 1210a, a NAND gate 1212a and a NOR gate 1214a.

In some embodiments, AND gate 1210a is AND gate 1110 of FIG. 11A, NAND gate 1212a is NAND gate 1112 of FIG. 11A, NOR gate 1214a is NOR gate 1114 of FIG. 11A, and similar detailed description is therefore omitted.

AND gate 1210a is configured to generate a signal IS1a in response to data signal An and data signal Bn. In some embodiments, the signal IS1a corresponds to an AND operation of data signal An and data signal Bn.

A first input terminal of AND gate 1210a is coupled to the source of data signal An. A second input terminal of AND gate 1210a is coupled to the source of data signal Bn. In some embodiments, the first input terminal of AND gate 1210a and the second input terminal of AND gate 1210a are coupled to the read bit line RBL.

The first input terminal of AND gate 1210a is configured to receive data signal An. The second input terminal of AND gate 1210a is configured to receive data signal Bn.

An output terminal of AND gate 1210a is configured to output the signal IS1a to a first input terminal of NOR gate 1214a.

NAND gate 1212a is configured to generate a signal IS2a in response to data signal An and data signal Bn. In some embodiments, the signal IS2a corresponds to a NAND operation of data signal An and data signal Bn.

A first input terminal of NAND gate 1212a is coupled to the source of data signal An. A second input terminal of NAND gate 1212a is coupled to the source of data signal Bn. In some embodiments, the first input terminal of NAND gate 1212a and the second input terminal of NAND gate 1212a are coupled to the read bit line RBL.

The first input terminal of NAND gate 1212a is configured to receive data signal An. The second input terminal of NAND gate 1212a is configured to receive data signal Bn.

An output terminal of NAND gate 1212a is configured to output the signal IS2a to a second input terminal of NOR gate 1214a.

NOR gate 1214a is configured to generate the output signal OS1a in response to signal IS1a and signal IS2a. In some embodiments, the output signal OS1a corresponds to a NOR operation of signal IS1a and signal IS2a.

A first input terminal of NOR gate 1214a is coupled to the output terminal of AND gate 1210a. A second input terminal of NOR gate 1214a is coupled to the output terminal of NAND gate 1212a.

The first input terminal of NOR gate 1214a is configured to receive signal IS1a. The second input terminal of NOR gate 1214a is configured to receive signal IS2a.

An output terminal of NOR gate 1214a is configured to output the output signal OS1a. An output terminal of NOR gate 1214a is coupled to a first input terminal of AND gate 1210b, a first input terminal of NAND gate 1212b, and a second input terminal of AND gate 1220.

XOR logic gate 1204 includes an AND gate 1210b, a NAND gate 1212b and a NOR gate 1214b.

In some embodiments, AND gate 1210b is AND gate 1110 of FIG. 11A, NAND gate 1212b is NAND gate 1112 of FIG. 11A, NOR gate 1214b is NOR gate 1114 of FIG. 11A, and similar detailed description is therefore omitted.

AND gate 1210b is configured to generate a signal IS1b in response to signal OS1a and carry signal Clin-1. In some embodiments, the signal IS1b corresponds to an AND operation of signal OS1a and carry signal Clin-1.

A first input terminal of AND gate 1210b is coupled to the output terminal of NOR gate 1214a. A second input terminal of AND gate 1210b is coupled to the source of carry signal Clin-1. In some embodiments, the second input terminal of AND gate 1210b is coupled to the output terminal of OR gate 1224.

The first input terminal of AND gate 1210b is configured to receive signal OS1a. The second input terminal of AND gate 1210b is configured to receive carry signal Clin-1.

An output terminal of AND gate 1210b is configured to output the signal IS1b to a first input terminal of NOR gate 1214b.

NAND gate 1212b is configured to generate a signal IS2b in response to signal OS1a and carry signal Clin-1. In some embodiments, the signal IS2b corresponds to a NAND operation of signal OS1a and carry signal Clin-1.

A first input terminal of NAND gate 1212b is coupled to the output terminal of NOR gate 1214a. A second input terminal of NAND gate 1212b is coupled to the source of carry signal Clin-1. In some embodiments, the second input terminal of NAND gate 1212b is coupled to the output terminal of OR gate 1224.

The first input terminal of NAND gate 1212b is configured to receive signal OS1a. The second input terminal of NAND gate 1212b is configured to receive carry signal Clin-1.

An output terminal of NAND gate 1212b is configured to output the signal IS2b to a second input terminal of NOR gate 1214b.

NOR gate 1214b is configured to generate the sum signal Sn in response to signal IS1b and signal IS2b. In some embodiments, the sum signal Sn corresponds to a NOR operation of signal IS1b and signal IS2b.

A first input terminal of NOR gate 1214b is coupled to the output terminal of AND gate 1210b. A second input terminal of NOR gate 1214b is coupled to the output terminal of NAND gate 1212b.

The first input terminal of NOR gate 1214b is configured to receive signal IS1b. The second input terminal of NOR gate 1214b is configured to receive signal IS2b.

An output terminal of NOR gate 1214b is configured to output the sum signal Sn.

Circuit 1206 includes an AND gate 1220, an AND gate 1222 and an OR gate 1224.

In some embodiments, AND gate 1220 is AND gate 1110 of FIG. 11A, AND gate 1222 is AND gate 1110 of FIG. 11A, OR gate 1224 is OR gate 1120 of FIG. 11B, and similar detailed description is therefore omitted.

AND gate 1220 is configured to generate a signal IS5 in response to signal OS1a and carry signal Clin-1. In some embodiments, the signal IS5 corresponds to an AND operation of signal OS1a and carry signal Clin-1.

A second input terminal of AND gate 1220 is coupled to the output terminal of NOR gate 1214a. A first input terminal of AND gate 1220 is coupled to the source of carry signal Clin-1. In some embodiments, the first input terminal of AND gate 1220 is coupled to the output terminal of OR gate 1224.

The second input terminal of AND gate 1220 is configured to receive signal OS1a. The first input terminal of AND gate 1220 is configured to receive carry signal Clin-1.

An output terminal of AND gate 1220 is configured to output the signal IS5 to a first input terminal of OR gate 1224.

AND gate 1222 is configured to generate a signal IS6 in response to data signal An and data signal Bn. In some embodiments, the signal IS6 corresponds to an AND operation of data signal An and data signal Bn.

A first input terminal of AND gate 1222 is coupled to the source of data signal An. A second input terminal of AND gate 1222 is coupled to the source of data signal Bn. In some embodiments, the first input terminal of AND gate 1222 and the second input terminal of AND gate 1222 are coupled to the read bit line RBL.

The first input terminal of AND gate 1222 is configured to receive data signal An. The second input terminal of AND gate 1222 is configured to receive data signal Bn.

An output terminal of AND gate 1222 is configured to output the signal IS6 to a second input terminal of OR gate 1224.

OR gate 1224 is configured to generate the carry signal Clin in response to signal IS5 and signal IS6. In some embodiments, the carry signal Clin corresponds to an OR operation of signal IS5 and signal IS6.

A first input terminal of OR gate 1224 is coupled to the output terminal of AND gate 1220. A second input terminal of OR gate 1224 is coupled to the output terminal of AND gate 1222.

The first input terminal of OR gate 1224 is configured to receive signal IS5. The second input terminal of OR gate 1224 is configured to receive signal IS6.

An output terminal of OR gate 1224 is configured to output the carry signal Clin.

In some embodiments, full adder circuit 1200A achieves benefits similar to one or more benefits discussed herein.

Other configurations, quantities of circuits or transistor types in full adder circuit 1200A are within the scope of the present disclosure.

FIG. 12B is a flowchart of a method 1200B of operating a circuit, in accordance with some embodiments.

In some embodiments, FIG. 12B is a flowchart of method 1200B of operating a circuit, such as full adder circuit 1200A.

In some embodiments, method 1200B uses one or more aspects of full adder circuit 1200A.

It is understood that additional operations may be performed before, during, and/or after the method 1200B depicted in FIG. 12B, and that some other processes may only be briefly described herein. In some embodiments, other order of operations of method 1200B is within the scope of the present disclosure. Method 1200B include exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 1200B is not performed.

In operation 1230 of method 1200B, the full adder circuit 1200A performs setup mode. In some embodiments, the setup mode of method 1200B includes writing each bit of data signals An and Bn. In some embodiments, operation 1230 is performed by a controller, such as controller 120 or 606.

In operation 1232 of method 1200B, the full adder circuit 1200A performs computing mode. In some embodiments, the computing mode of method 1200B includes writing the carry signal Clin-1 to XOR logic gate 1204 and reading out the signal OS1a from XOR logic gate 1202, and writing the signal OS1a to XOR logic gate 1204.

In operation 1234 of method 1200B, the full adder circuit 1200A performs carry-in mode. In some embodiments, the carry-in mode of method 1200B includes reading out the carry in signal Clin from circuit 1206.

In some embodiments, the carry-in mode of method 1200B includes reading out the carry in signal Clin from circuit 1206, and then returning to operation 1232. In some embodiments, operation 1234 returns to operation 1232 to write the next carry in signal Clin to XOR logic gate 1204.

In operation 1236 of method 1200B, the full adder circuit 1200A performs readout mode. In some embodiments, the readout mode of method 1200B includes outputting the sum signal Sn.

In some embodiments, operation 1236 is performed after buffering each bit of the sum signal Sn, and then outputting the entire sum signal Sn (e.g., each of the bits of sum signal Sn) at a same time. In some embodiments, operation 1236 is performed to output the sum signal Sn bit-by-bit sequentially.

By using method 1200B, the circuit operates to achieve one or more benefits discussed herein in the present disclosure.

Figure 13:
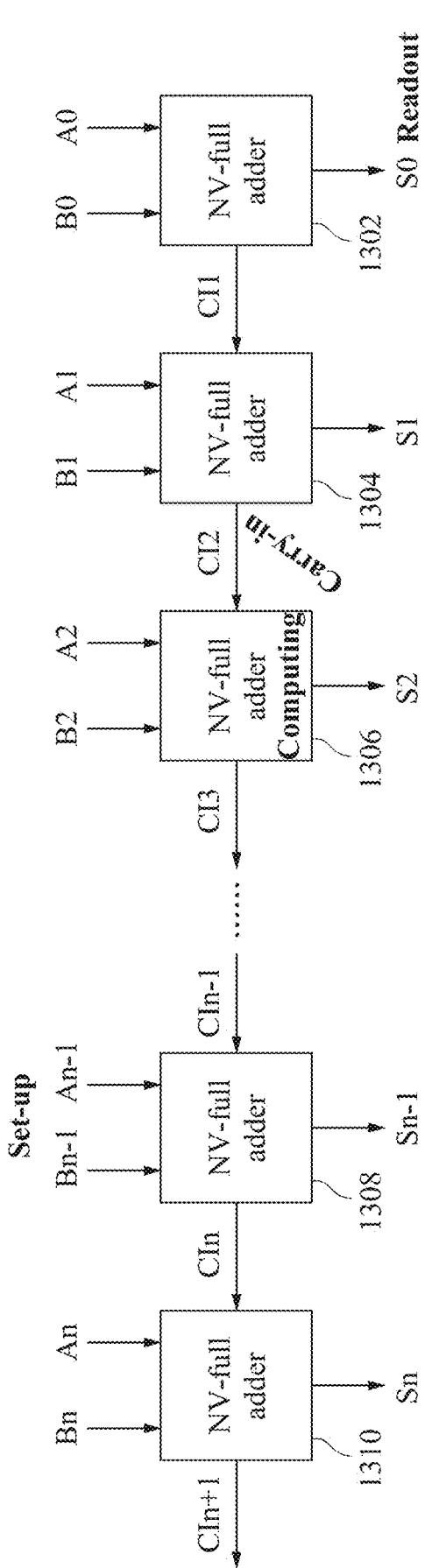
FIG. 13 is a circuit diagram of a n-bit adder circuit, in accordance with some embodiments.

While method 1200B was described above with reference to a single full adder circuit (e.g., full adder circuit 1200A), it is understood that method 1200B applies to multiple full adder circuits, such as n-bit adder circuit 1300 of FIG. 13, in some embodiments.

Other operations of method 1200B are within the scope of the present disclosure.

FIG. 13 is a circuit diagram of a n-bit adder circuit 1300, in accordance with some embodiments.

N-bit adder circuit 1300 is an embodiment of adder circuit 104 of FIG. 1 expressed in a schematic diagram, and similar detailed description is therefore omitted.

N-bit adder circuit 1300 is usable as adder circuit 104 of FIG. 1 or adder circuit 604 of FIG. 6.

N-bit adder circuit 1300 is configured to generate an n-bit sum signal Sn and an n-bit carry signal Clin in response to n-bit data signal An and n-bit data signal Bn. In some embodiments, the sum Sn is the nth bit of sum signal S. In some embodiments, the carry signal Clin is the nth bit of carry signal CI. In some embodiments, data signal An is the nth bit of data signal A. In some embodiments, data signal Bn is the nth bit of data signal B.

N-bit adder circuit 1300 includes a full adder circuit 1302, a full adder circuit 1304, a full adder circuit 1306, a full adder circuit 1308 and a full adder circuit 1310.

In some embodiments, at least one or more of full adder circuit 1302, full adder circuit 1304, full adder circuit 1306, full adder circuit 1308 or full adder circuit 1310 is full adder circuit 1200A of FIG. 12A, and similar detailed description is therefore omitted.

In some embodiments, operation of at least one or more of full adder circuit 1302, full adder circuit 1304, full adder circuit 1306, full adder circuit 1308 or full adder circuit 1310 is similar to method 1200B of FIG. 12B, and similar detailed description is therefore omitted.

Each of full adder circuit 1302, full adder circuit 1304, full adder circuit 1306, full adder circuit 1308 and full adder circuit 1310 are connected together in a cascading manner.

In some embodiments, n-bit adder 1300 is referred to as "a ripple-carry adder" since each carry bit (e.g., Cn) "ripples" to the adjacent full adder (e.g., full adder circuit 1302, 1304, 1306, 1308 or 1310).

Full adder circuit 1302 is coupled to an input terminal of full adder circuit 1304. Full adder circuit 1302 is configured to receive data signal A0 and data signal B0. Full adder circuit 1302 is configured to generate a sum signal S0 and a carry signal CI1 in response to data signal A0 and data signal B0. Full adder circuit 1302 is configured to output the sum signal S0 and the carry signal CI1.

Full adder circuit 1304 is coupled between an output terminal of full adder circuit 1302 and an input terminal of full adder circuit 1306. Full adder circuit 1304 is configured to receive data signal A1, data signal B1 and carry signal CI1. Full adder circuit 1304 is configured to generate a sum signal S1 and a carry signal CI2 in response to data signal A1, data signal B1 and carry signal CI1. Full adder circuit 1304 is configured to output the sum signal S1 and the carry signal CI2.

Full adder circuit 1306 is coupled between an output terminal of full adder circuit 1304 and an input terminal of full adder circuit 1308. Full adder circuit 1306 is configured to receive data signal A2, data signal B2 and carry signal CI2. Full adder circuit 1306 is configured to generate a sum signal S2 and a carry signal CI3 in response to data signal A2, data signal B2 and carry signal CI2. Full adder circuit 1306 is configured to output the sum signal S2 and the carry signal CI3.

Full adder circuit 1308 is coupled between an output terminal of full adder circuit 1306 and an input terminal of full adder circuit 1310. Full adder circuit 1308 is configured to receive data signal An-1, data signal Bn-1 and carry signal CIn-1. Full adder circuit 1308 is configured to generate a sum signal Sn-1 and a carry signal CIn in response to data signal An-1, data signal Bn-1 and carry signal CIn-1. Full adder circuit 1308 is configured to output the sum signal Sn-1 and the carry signal CIn.

Full adder circuit 1310 is coupled to an output terminal of full adder circuit 1308. Full adder circuit 1310 is configured to receive data signal An, data signal Bn and carry signal CIn. Full adder circuit 1310 is configured to generate a sum signal Sn and a carry signal CIn+1 in response to data signal An, data signal Bn and carry signal CIn. Full adder circuit 1310 is configured to output the sum signal Sn and the carry signal CIn+1.

In some embodiments, n-bit adder circuit 1300 achieves benefits similar to one or more benefits discussed herein.

In some embodiments, when the least significant bit (LSB) of n-bit adder circuit 1300 is in the computing mode (similar to operation 1232 of FIG. 12B), the most significant bit (MSB) of n-bit adder circuit 1300 is in the set-up mode (similar to operation 1230 of FIG. 12B) thereby reducing the idle time of n-bit adder circuit 1300.

In some embodiments, after the carry-in mode (similar to operation 1234 of FIG. 12B), the LSB of n-bit adder circuit

1300 transitions to a readout mode (similar to operation 1236 of FIG. 12B) where the output is directly output or the LSB of n-bit adder circuit 1300 transitions to a standby state thereby preventing unnecessary power being consumed.

In some embodiments, by using n-bit adder circuit 1300 as one or more of adder circuit 104 of FIG. 1 or adder circuit 604 of FIG. 6, n-bit adder circuit 1300 improves the speed and performance of memory device 100 of FIG. 1 by reducing idle time of n-bit adder circuit 1300 and saving power of n-bit adder circuit 1300.

Other configurations, quantities of circuits or transistor types in n-bit adder circuit 1300 are within the scope of the present disclosure.

Figure 14:
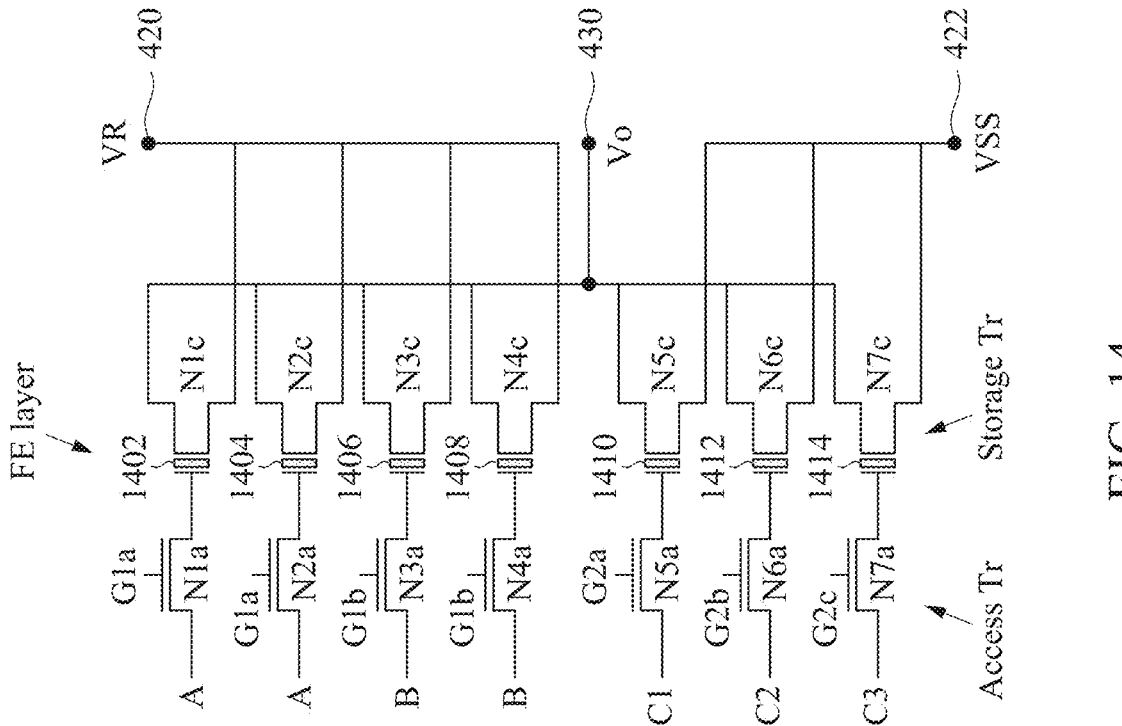
FIG. 14 is a circuit diagram of a memory circuit, in accordance with some embodiments.

FIG. 14 is a circuit diagram of a memory circuit 1400, in accordance with some embodiments.

Memory circuit 1400 is an embodiment of adder circuit 104 of FIG. 1 expressed in a schematic diagram, and similar detailed description is therefore omitted.

Memory circuit 1400 is usable as adder circuit 104 of FIG. 1 or adder circuit 604 of FIG. 6. In some embodiments, memory circuit 1400 is configured to be an OR gate (similar to OR gate 400C of FIG. 4C) or an AND gate (similar to AND gate 400E of FIG. 4E) based on at least one of a control signal C1, control signal C2 or control signal C3.

Memory circuit 1400 is a variation of memory circuit 400A of FIG. 4A, and similar detailed description is therefore omitted. In comparison with memory circuit 400A of FIG. 4A, transistor N1$c$, transistor N2$c$, transistor N3$c$, transistor N4$c$, transistor N5$c$, transistor N6$c$ or transistor N7$c$ of FIG. 14 replace corresponding transistor N1$b$, transistor N2$b$, transistor N3$b$, transistor N4$b$, transistor N5$b$, transistor N6$b$ or transistor N7$b$ of FIG. 4A, and similar detailed description is therefore omitted.

Memory circuit 1400 includes transistor N1$a$, transistor N1$c$, transistor N2$a$, transistor N2$c$, transistor N3$a$, transistor N3$c$, transistor N4$a$, transistor N4$c$, transistor N5$a$, transistor N5$c$, transistor N6$a$, transistor N6$c$, transistor N7$a$ and transistor N7$c$.

In some embodiments, each of transistor N1$c$, N2$c$, N3$c$, N4$c$, N5$c$, N6$c$ or N7$c$ is a corresponding ferroelectric field effect transistor (FeFET) device.

In some embodiments, each of transistor N1$c$, N2$c$, N3$c$, N4$c$, N5$c$, N6$c$ or N7$c$ is a corresponding FeFET device, and includes a corresponding ferroelectric region 1402, 1404, 1406, 1408, 1410, 1412 or 1414 positioned within the corresponding gate terminal of the corresponding transistor N1$c$, N2$c$, N3$c$, N4$c$, N5$c$, N6$c$ or N7$c$.

The ferroelectric region 1402, 1404, 1406, 1408, 1410, 1412 or 1414 is configured to have different polarization states based on the corresponding voltage applied to the corresponding gate of corresponding transistor N1$c$, N2$c$, N3$c$, N4$c$, N5$c$, N6$c$ or N7$c$. The polarization of the ferroelectric region 1402, 1404, 1406, 1408, 1410, 1412 or 1414 determines the conductivity (e.g., low resistance state or high resistance state) of corresponding transistor N1$c$, N2$c$, N3$c$, N4$c$, N5$c$, N6$c$ or N7$c$ which represents the data stored in corresponding transistor N1$c$, N2$c$, N3$c$, N4$c$, N5$c$, N6$c$ or N7$c$.

Data is stored by programming the ferroelectric region 1402, 1404, 1406, 1408, 1410, 1412 or 1414 to have different polarization states. The different polarization states create two different threshold voltage states (e.g., Vth) that correspond to a logic '1' and a logic '0'. Due to the threshold voltage difference, the ferroelectric region 1402, 1404, 1406, 1408, 1410, 1412 or 1414 in the corresponding transistor N1$c$, N2$c$, N3$c$, N4$c$, N5$c$, N6$c$ or N7$c$ is configured to use specific gate voltages based on its logic state to turn on. In some embodiments, the difference between these gate voltages is referred to as memory window.

The binary states of stored data in corresponding transistor N1$c$, N2$c$, N3$c$, N4$c$, N5$c$, N6$c$ or N7$c$ are encoded in the form of the polarization of the ferroelectric region 1402, 1404, 1406, 1408, 1410, 1412 or 1414. The direction or value of the polarization (e.g., +P or −P) of the ferroelectric region 1402, 1404, 1406, 1408, 1410, 1412 or 1414 determines the resistance state (e.g., low or high) of the corresponding transistor N1$c$, N2$c$, N3$c$, N4$c$, N5$c$, N6$c$ or N7$c$. In some embodiments, a low resistance state of the corresponding transistor N1$c$, N2$c$, N3$c$, N4$c$, N5$c$, N6$c$ or N7$c$ corresponds to the corresponding transistor N1$c$, N2$c$, N3$c$, N4$c$, N5$c$, N6$c$ or N7$c$ being turned on or conducting, and a high resistance state of the corresponding transistor N1$c$, N2$c$, N3$c$, N4$c$, N5$c$, N6$c$ or N7$c$ corresponds to the corresponding transistor N1$c$, N2$c$, N3$c$, N4$c$, N5$c$, N6$c$ or N7$c$ being turned off or not conducting. In some embodiments, a low resistance state of the corresponding transistor N1$c$, N2$c$, N3$c$, N4$c$, N5$c$, N6$c$ or N7$c$ corresponds to a first stored value (e.g., logic "0" or "1"), and a high resistance state of the corresponding transistor N1$c$, N2$c$, N3$c$, N4$c$, N5$c$, N6$c$ or N7$c$ corresponds to a second stored value (e.g., logic "1" or "0") opposite from the first stored value. A voltage of the gate of the corresponding transistor N1$c$, N2$c$, N3$c$, N4$c$, N5$c$, N6$c$ or N7$c$ or the storage node controls the polarization states and corresponding electric field in the ferroelectric region 1402, 1404, 1406, 1408, 1410, 1412 or 1414 of corresponding transistor N1$c$, N2$c$, N3$c$, N4$c$, N5$c$, N6$c$ or N7$c$.

In some embodiments, memory circuit 1400 achieves benefits similar to one or more benefits discussed herein.

Other configurations, quantities of transistors or transistor types in memory circuit 1400 are within the scope of the present disclosure.

Figure 15:
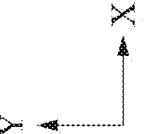
FIG. 15 is a cross-sectional view of an integrated circuit 1500, in accordance with some embodiments.
Figure 15:
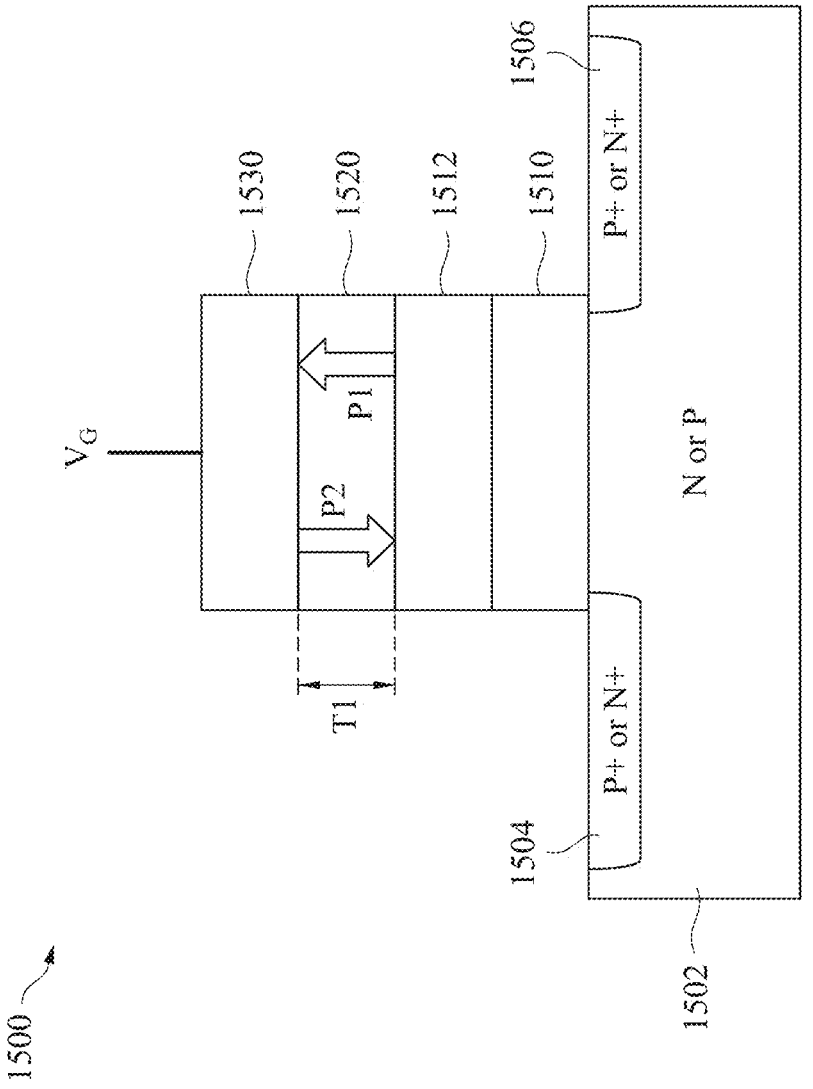

FIG. 15 is a cross-sectional view of an integrated circuit 1500, in accordance with some embodiments.

Integrated circuit 1500 is an embodiment of one or more of transistor N1$c$, transistor N2$c$, transistor N3$c$, transistor N4$c$, transistor N5$c$, transistor N6$c$ or transistor N7$c$ of FIG. 14, and similar detailed description is therefore omitted. In some embodiments, integrated circuit 1500 includes additional elements not shown for ease of illustration.

Integrated circuit 1500 is shown as a planar transistor; however, other transistors are within the scope of the present disclosure. In some embodiments, integrated circuit 1500 is a fin field effect transistor (FinFET), a nanosheet transistor, a nanowire transistor, or the like. In some embodiments, integrated circuit 1500 is manufactured as part of a front end of line (FEOL) process. In some embodiments, integrated circuit 1500 is an FeFET or the like, and is manufactured as part of a back end of line (BEOL) process.

Integrated circuit 1500 includes a substrate 1502. In some embodiments, substrate 1502 is a p-type substrate. In some embodiments, substrate 1502 is an n-type substrate. In some embodiments, substrate 1502 includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, first substrate 1502 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, integrated circuit 1500 is a silicon transistor (e.g., has a silicon channel region (not labelled)), and substrate 1502 has a silicon body or bulk. In some embodiments, integrated circuit 1500 is an oxide transistor (e.g., has an oxide channel region), and substrate 1502 includes an oxide semiconductor material including zinc oxide, cadmium oxide, indium oxide, IGZO, $SnO_2$, $TiO_2$, or combinations thereof, or the like.

Integrated circuit 1500 further includes a drain region 1504 and a source region 1506 in substrate 1502. In some embodiments, at least a portion of source region 1506 or a portion of drain region 1504 extends above substrate 1502. In some embodiments, the source region 1506 and the drain region 1504 are embedded in substrate 1502.

Drain region 1504 is an embodiment of the drain terminal of transistor N1c, transistor N2c, transistor N3c, transistor N4c, transistor N5c, transistor N6c or transistor N7c of FIG. 14, and similar detailed description is therefore omitted. Source region 1506 is an embodiment of the source terminal of transistor N1c, transistor N2c, transistor N3c, transistor N4c, transistor N5c, transistor N6c or transistor N7c of FIG. 14, and similar detailed description is therefore omitted.

In some embodiments, the drain region 1504 and source region 1506 of FIG. 15 is referred to as an oxide definition (OD) region which defines the source or drain diffusion regions of integrated circuit 1500 or transistor N1c, transistor N2c, transistor N3c, transistor N4c, transistor N5c, transistor N6c or transistor N7c of FIG. 14, and similar detailed description is therefore omitted.

In some embodiments, integrated circuit 1500 is a P-type FeFET transistor, therefore the substrate 1502 is an N-type region, the drain region 1504 is a P-type active region having P-type dopants implanted in substrate 1502, and the source region 1506 is a P-type active region having P-type dopants implanted in substrate 1502.

In some embodiments, integrated circuit 1500 is an N-type FeFET transistor, therefore the substrate 1502 is a P-type region, the drain region 1504 is an N-type active region having N-type dopants implanted in substrate 1502, and the source region 1506 is a an N-type active region having N-type dopants implanted in substrate 1502.

In some embodiments, N-type dopants include phosphorus, arsenic or other suitable N-type dopants. In some embodiments, P-type dopants include boron, aluminum or other suitable p-type dopants.

Integrated circuit 1500 further includes an insulating layer 1510 on substrate 1502. In some embodiments, the insulating layer 1510 is between the drain region 1504 and the source region 1506. In some embodiments, the insulating layer 1510 is a gate dielectric layer. In some embodiments, the insulating layer includes an insulating material including SiO, $SiO_2$ or combinations thereof, or the like. In some embodiments, insulating layer 1510 includes a gate oxide or the like.

Integrated circuit 1500 further includes a metal layer 1512 over the insulating layer 1510. In some embodiments, the metal layer 1512 includes Cu, TiN, W or combinations thereof, or the like. In some embodiments, the metal layer 1512 is a conductive layer including doped polysilicon. In some embodiments, integrated circuit 1500 does not include metal layer 1512.

Integrated circuit 1500 further includes a ferroelectric layer 1520 over at least the conductive layer 1512 or the insulating layer 1510. In some embodiments, where integrated circuit 1500 does not include metal layer 1512, ferroelectric layer 1520 is on the insulating layer 1510. Ferroelectric layer 1520 is an embodiment of one or more of ferroelectric region 1402, 1404, 1406, 1408, 1410, 1412 or 1414 of FIG. 14, and similar detailed description is therefore omitted.

In some embodiments, ferroelectric layer 1520 includes a ferroelectric material. In some embodiments, a ferroelectric material includes $HfO_2$, HfZrO, HfO, perovskite, SBT, PZT or combinations thereof, or the like.

Ferroelectric layer 1520 has polarization states P1 or P2 that correspond to polarization states P+ or P− in FIG. 15, and similar detailed description is therefore omitted. Polarization state P1 points in a first direction Y. Polarization state P2 points in a second direction (e.g., negative Y) opposite of the first direction Y.

FIG. 15 shows both polarization states P1 and P2. However, in some embodiments, due to the non-volatility of the ferroelectric layer 1520, once the polarization state P1 or P2 of integrated circuit 1500 is set based on the gate voltage VG, integrated circuit 1500 includes one of the polarization states P1 or P2.

The ferroelectric layer 1520 creates a capacitance in integrated circuit 1500. Furthermore, the MOS transistor of integrated circuit 1500 also has a capacitance. In some embodiments, the capacitance of the ferroelectric layer 1520 and the capacitance of the MOS transistor are matched to operate integrated circuit 1500 in a non-volatile mode. In some embodiments, the capacitance of the ferroelectric layer 1520 is adjusted based on a thickness T1 of the ferroelectric layer 1520. In some embodiments, by changing thickness T1, integrated circuit 1500 can operate in a non-volatile mode or a volatile mode.

In some embodiments, the thickness T1 of the ferroelectric layer 1520 ranges from about 3 nanometers (nm) to about 50 nm. In some embodiments, as the thickness T1 increases, the ability of the ferroelectric layer 1520 to preserve the hysteresis and bi-stable polarization states (e.g., P1 or P2) is increased and the leakage current of integrated circuit 1500 decreases. In some embodiments, as the thickness T1 decreases, the ability of the ferroelectric layer 1520 to preserve the hysteresis and bi-stable polarization states (e.g., P1 or P2) is reduced and the leakage current of integrated circuit 1500 increases. In some embodiments, integrated circuit 1500 does not include the insulating layer 1510 and metal layer 1512, and the ferroelectric layer 1520 is directly on substrate 1502. In some embodiments, integrated circuit 1500 does not include the insulating layer 1510, and the metal layer 1512 is directly on substrate 1502.

Integrated circuit 1500 further includes a gate structure 1530 over the ferroelectric layer 1520. The gate structure 1530 includes a conductive material such as a metal or doped polysilicon (also referred to herein as "POLY").

In some embodiments, integrated circuit 1500 is an embodiment of one or more of transistor N1a, N1b, N2a, N2b, N3a, N3b, N4a, N4b, N5a, N5b, N6a, N6b, N7a or N7b of FIGS. 4A and 14. In these embodiments, integrated circuit 1500 does not include the ferroelectric layer 1520.

In some embodiments, integrated circuit 1500 achieves benefits similar to one or more benefits discussed herein.

Other configurations, quantities of layers or other layer types in integrated circuit 1500 are within the scope of the present disclosure.

Figure 16:
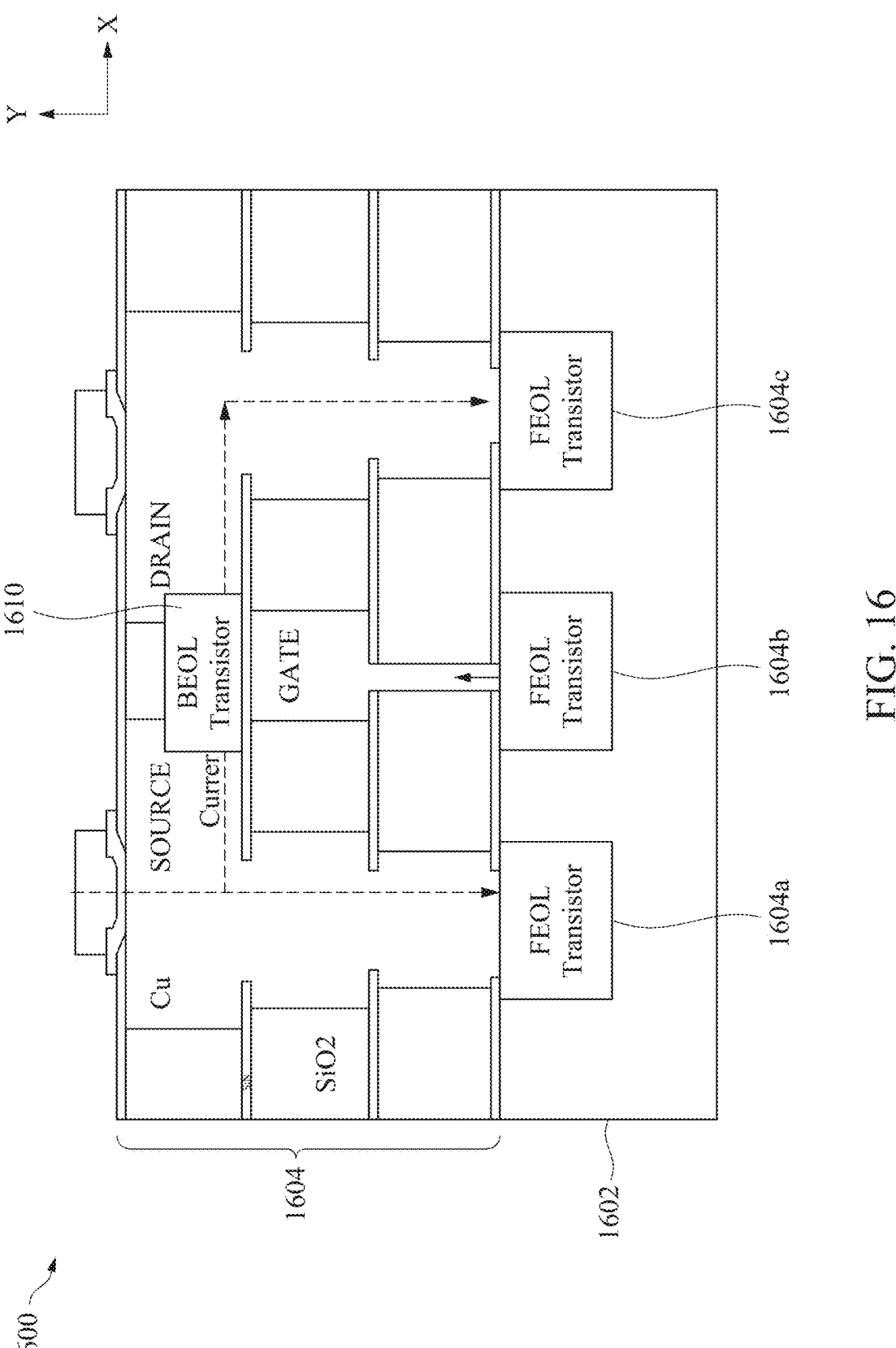
FIG. 16 is a cross-sectional view of an integrated circuit 1600, in accordance with some embodiments.

FIG. 16 is a cross-sectional view of an integrated circuit 1600, in accordance with some embodiments.

Integrated circuit 1600 is an embodiment of one or more transistors in memory circuit 400A, 600, 700A, 800A, 900A, 1000A, 1100A, 1100B, 1200A, 1300 or 1400, and similar detailed description is therefore omitted. In some embodiments, integrated circuit 1500 includes additional elements not shown for ease of illustration.

Integrated circuit 1600 includes a substrate 1602, FEOL transistors 1604a, 1604b and 1604c, an interconnect 1604 and BEOL transistor 1610.

In some embodiments, substrate 1602 is substrate 1502 in FIG. 15, FEOL transistors 1604a, 1604b and 1604c are integrated circuit 1500 in FIG. 15, and similar detailed description is therefore omitted.

In some embodiments, at least one of FEOL transistors 1604a, 1604b or 1604c is one or more transistors described herein, such as one or more of transistor N1a, N1b, N2a, N2b, N3a, N3b, N4a, N4b, N5a, N5b, N6a, N6b, N7a or N7b of FIGS. 4A and 14, and similar detailed description is therefore omitted.

In some embodiments, BEOL transistor 1610 is one or more transistors described herein, such as one or more of transistor N1c, transistor N2c, transistor N3c, transistor N4c, transistor N5c, transistor N6c or transistor N7c of FIG. 14, and similar detailed description is therefore omitted.

Interconnect 1604 is over FEOL transistors 1604a, 1604b and 1604c. In some embodiments, interconnect 1604 is below BEOL transistor 1610. In some embodiments, BEOL transistor 1610 is within interconnect 1604.

In some embodiments, interconnect 1604 includes a plurality of metallization layers M0, . . . , Mx-1, Mx configured to provide an electrical connection between a power supply and one or more of FEOL transistors 1604a, 1604b or and 1604c or BEOL transistor 1610.

In some embodiments, the plurality of metallization layers M0, . . . , Mx-1, Mx of interconnect 1604 are embedded within an insulating layer, such as one or more ILD layers.

Other configurations and arrangements of the plurality of metallization layers M0, . . . , Mx-1, Mx metallization layers are within the contemplated scope of the present disclosure.

In some embodiments, interconnect 1604 is configured to provide an electrical connection between one or more of FEOL transistors 1604a, 1604b or and 1604c and BEOL transistor 1610.

In some embodiments, integrated circuit 1600 achieves benefits similar to one or more benefits discussed herein.

Other configurations, quantities of layers or other layer types in integrated circuit 1600 are within the scope of the present disclosure.

Figure 17A:
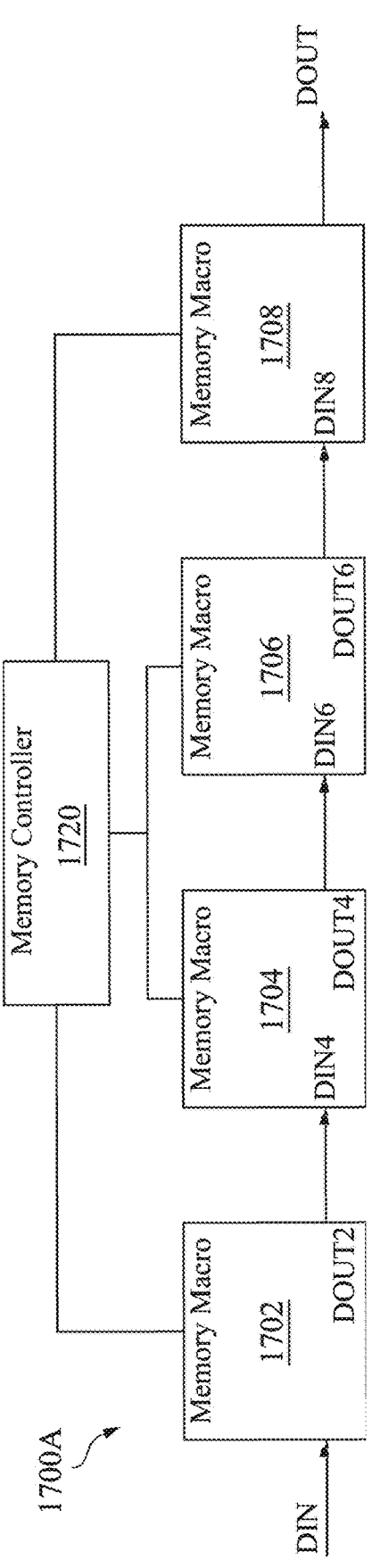
FIG. 17A is a schematic diagram of a memory device, in accordance with some embodiments.

FIG. 17A is a schematic diagram of a memory device 1700A, in accordance with some embodiments.

The memory device 1700A comprises memory macros 1702, 1704, 1706, 1708 and memory controller 1720. In some embodiments, one or more of the memory macros 1702, 1704, 1706, 1708 correspond to memory macro 110, and/or memory controller 1720 corresponds to the memory controller 120. In some embodiments, one or more of the memory macros 1702, 1704, 1706, 1708 correspond to memory circuit 102, and/or memory controller 1720 corresponds to the memory controller 120.

In the example configuration in FIG. 17A, the memory controller 1720 is a common memory controller for the memory macros 1702, 1704, 1706, 1708. In at least one embodiment, at least one of the memory macros 1702, 1704, 1706, 1708 has its own memory controller. The number of four memory macros in the memory device 1700A is an example. Other configurations are within the scopes of various embodiments.

The memory macros 1702, 1704, 1706, 1708 are coupled to each other in sequence, with output data of a preceding memory macro being input data for a subsequent memory macro. For example, input data DIN are input into the memory macro 1702. The memory macro 1702 performs one or more CIM operations based on the data signal A and data signal B stored in the memory macro 1702, and generates output data DOUT2 as results of the CIM operations. The output data DOUT2 are supplied as input data DIN4 of the memory macro 1704. The memory macro 1704 performs one or more CIM operations based on the input data DIN4 and one of the data signal A and data signal B stored in the memory macro 1704, and generates output data DOUT4 as results of the CIM operations. The output data DOUT4 are supplied as input data DIN6 of the memory macro 1706. The memory macro 1706 performs one or more CIM operations based on the input data DIN6 and one of the data signal A and data signal B stored in the memory macro 1706, and generates output data DOUT6 as results of the CIM operations. The output data DOUT6 are supplied as input data DIN8 of the memory macro 1708. The memory macro 1708 performs one or more CIM operations based on the input data DIN8 and one of the data signal A and data signal B stored in the memory macro 1708, and generates output data DOUT as results of the CIM operations.

One or more of the input data DIN, DIN4, DIN6, DIN8 correspond to the data signal A or data signal B described herein, and/or one or more of the output data DOUT2, DOUT4, DOUT6, DOUT correspond to the output signal Vo described herein, and similar detailed description is therefore omitted. In at least one embodiment, the described configuration of the memory macros 1702, 1704, 1706, 1708 implements a neural network. In at least one embodiment, one or more advantages described herein are achievable by the memory device 1700A.

Other configurations or quantities of elements in memory device 1700A are within the scope of the present disclosure.

Figure 17B:
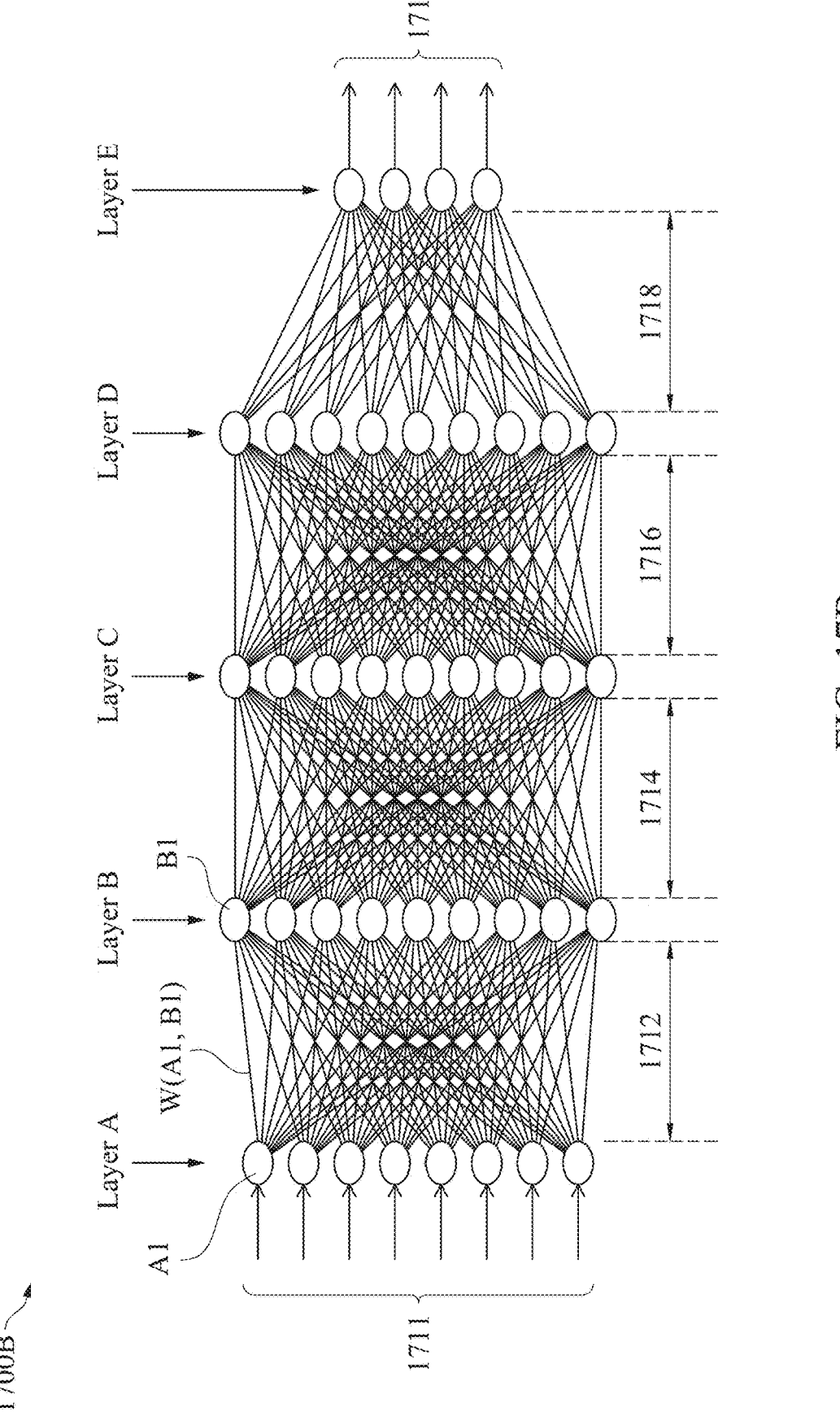
FIG. 17B is a schematic diagram of a neural network, in accordance with some embodiments.

FIG. 17B is a schematic diagram of a neural network 1700B, in accordance with some embodiments.

The neural network 1700B comprises a plurality of layers A-E each comprising a plurality of nodes (or neurons). The nodes in successive layers of the neural network 1700B are connected with each other by a matrix or array of connections. For example, the nodes in layers A and B are connected with each other by connections in a matrix 1712, the nodes in layers B and C are connected with each other by connections in a matrix 1714, the nodes in layers C and D are connected with each other by connections in a matrix 1716, and the nodes in layers D and E are connected with each other by connections in a matrix 1718. Layer A is an input layer configured to receive input data 1711. The input data 1711 propagate through the neural network 1700B, from one layer to the next layer via the corresponding matrix of connections between the layers. As the data propagate through the neural network 1700B, the data undergo one or more computations, and are output as output data 1719 from layer E which is an output layer of the neural network 1700B. Layers B, C, D between input layer A and output layer E are sometimes referred to as hidden or intermediate layers. The number of layers, number of matrices of connections, and number of nodes in each layer in FIG. 17B are examples. Other configurations are within the scopes of various embodiments. For example, in at least one embodiment, the neural network 1700B includes no hidden layer, and has an input layer connected by one matrix of connections to an output layer. In one or more embodiments, the neural network 1700B has one, two, or more than three hidden layers.

In some embodiments, the matrices 1712, 1714, 1716, 1718 are correspondingly implemented by the memory macros 1702, 1704, 1706, 1708, the input data 1711 corresponds to the data signal A or B, and the output data 1719 corresponds to the output signal Vo, and similar detailed description is therefore omitted. Specifically, in the matrix 1712, a connection between a node in layer A and another node in layer B has a corresponding weight. For example, a connection between node A1 and node B1 has a weight W(A1,B1) which corresponds to a weight value stored in the memory array of the memory macro 1702. The memory macros 1704, 1706, 1708 are configured in a similar manner. The weight data W in one or more of the memory macros 1702, 1704, 1706, 1708 are updated, e.g., by a processor and through the memory controller 1720, as machine learning is performed using the neural network 1700B. One or more advantages described herein are achievable in the neural network 1700B implemented in whole or in part by one or more memory macros and/or memory devices in accordance with some embodiments.

Other configurations or quantities of elements in neural network 1700B are within the scope of the present disclosure.

Figure 17C:
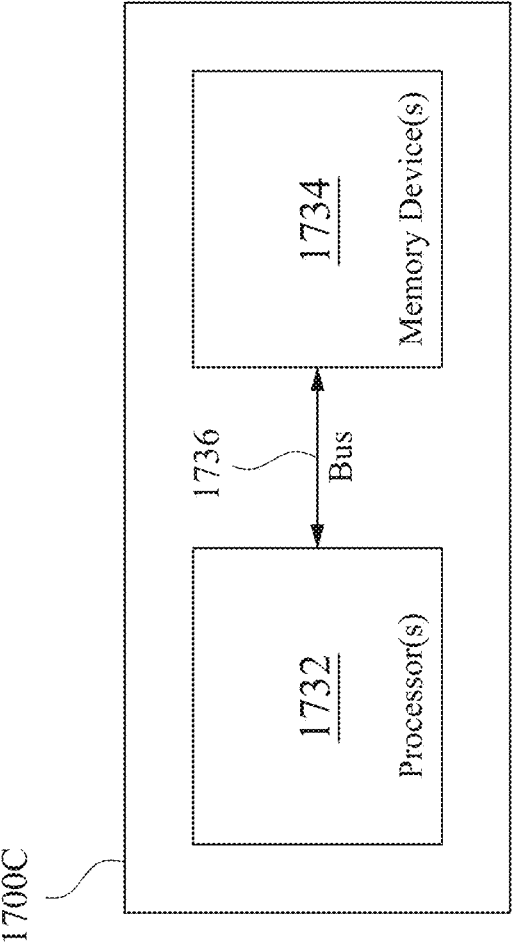
FIG. 17C is a schematic diagram of an integrated circuit (IC) device, in accordance with some embodiments.

FIG. 17C is a schematic diagram of an integrated circuit (IC) device 1700C, in accordance with some embodiments.

The IC device 1700C is an embodiment of memory device 100 of FIG. 1 or memory device 1700A of FIG. 17A, and similar detailed description is therefore omitted.

The IC device 1700C comprises one or more hardware processors 1732, one or more memory devices 1734 coupled to the processors 1732 by one or more buses 1736. In some embodiments, the one or more hardware processors 1732 is useable as one or more components in controller 120 of FIG. 1 or memory controller 1720 in FIG. 17A, and similar detailed description is therefore omitted. In some embodiments, the one or more memory devices 1734 is useable as one or more components in memory circuit 102 of FIG. 1, memory macro 110 of FIG. 1 or one or more of memory macros 1702, 1704, 1706 or 1708 in FIG. 17A, and similar detailed description is therefore omitted.

In some embodiments, the IC device 1700C comprises one or more further circuits including, but not limited to, cellular transceiver, global positioning system (GPS) receiver, network interface circuitry for one or more of Wi-Fi, USB, Bluetooth, or the like. Examples of the processors 1732 include, but are not limited to, a central processing unit (CPU), a multi-core CPU, a neural processing unit (NPU), a graphics processing unit (GPU), a digital signal processor (DSP), a field-programmable gate array (FPGA), an application-specific integrated circuit (ASIC), other programmable logic devices, a multimedia processor, an image signal processors (ISP), or the like. Examples of the memory devices 1734 include one or more memory devices and/or memory macros described herein. In at least one embodiment, each of the processors 1732 is coupled to a corresponding memory device among the memory devices 1734.

Because the one or more of the memory devices 1734 are CIM memory devices, various computations are performed in the memory devices which reduces the computing workload of the corresponding processor, reduces memory access time, and improves performance. In at least one embodiment, the IC device 1700C is a system-on-a-chip (SOC). In at least one embodiment, one or more advantages described herein are achievable by the IC device 1700C.

Other configurations or quantities of elements in IC device 1700C are within the scope of the present disclosure.

FIGS. 18A-18B are a flowchart of a method 1800 of operating a circuit, in accordance with some embodiments.

In some embodiments, FIGS. 18A-18B are a flowchart of method 1800 of operating a memory circuit, such as memory device 100 of FIG. 1, memory cell array 200 of FIG. 2, memory cell 300A of FIG. 3A, memory cell array 300B of FIG. 3B, memory circuit 400A of FIG. 4A, memory circuit 600 of FIG. 6, memory circuit 700A of FIG. 7A, memory circuit 800A of FIG. 8A, waveform 800F of FIG. 8F, memory circuit 900A of FIG. 9A, memory circuit 1000A of FIG. 10A, XOR logic gate 1100A of FIG. 11A, XOR logic gate 1100B of FIG. 11B, full adder circuit 1200A of FIG. 12A, n-bit adder circuit 1300 of FIG. 13, memory circuit 1400 of FIG. 14, memory device 1700A of FIG. 17A, neural network 1700B of FIG. 17B or IC device 1700C of FIG. 17C.

In some embodiments, method 1800 uses one or more aspects of waveform 500 of corresponding FIG. 5.

It is understood that additional operations may be performed before, during, and/or after the method 1800 depicted in FIGS. 18A-18B, and that some other processes may only be briefly described herein. In some embodiments, other order of operations of method 1800 is within the scope of the present disclosure. Method 1800 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 1800 is not performed.

In operation 1802 of method 1800, a first set of transistors is initialized.

In some embodiments, the first set of transistors of method 1800 includes at least one of transistors N5a, N5b, N5c, N6a, N6b, N6c, N7a, N7b or N7c.

In some embodiments, operation 1802 and 1804 are performed by a controller. In some embodiments, the controller of method 1800 includes at least one of controller 120, 606 or processor 1732.

In some embodiments, operation 1802 includes at least one of operation 1804.

In operation 1804 of method 1800, a first set of control signals is written to the first set of transistors thereby setting logic functions of the memory circuit.

In some embodiments, the first set of control signals of method 1800 includes at least one of control signals C1, C2 or C3. In some embodiments, the first set of control signals of method 1800 further includes at least one of control signals G2a, G2b or G2c.

In some embodiments, the logic functions of method 1800 includes the functions of at least one of table 400B, 400D, 700B, 700D, 800B, 800D, 900B, 1000B or 1000D.

In operation 1806 of method 1800, a write operation of the memory circuit is performed.

In some embodiments, operation 1806 is performed by at least one of transistors N1a, N2a, N3a, N4a or N1d.

In some embodiments, operation 1806 includes at least one of operation 1808, 1810, 1812 or 1814.

In operation 1808 of method 1800, the data signals are written to a bit line.

In some embodiments, operation 1808 includes writing the data signals to a source line.

In some embodiments, the data signals of method 1800 includes at least one of data signal A, B, A', B', An or Bn.

In some embodiments, the bit line of method 1800 includes at least one of read bit line RBL or write bit line WBL.

In some embodiments, operation 1808 includes writing the data signals to a set of access transistors. In some embodiments, the set of access transistors of method 1800 includes at least one of transistor N1*a*, N2*a*, N3*a*, N4*a* or N1*d*.

In some embodiments, operation 1808 includes writing the data signals to a set of inverters. In some embodiments, the set of inverters of method 1800 includes at least one of inverter 1002*a*, 1002*b*, 1002*c* or 1002*d*.

In some embodiments, operation 1808 is performed by controller 120, 606 or processor 1732.

In some embodiments, operation 1808 is performed by a driver, such as read bit line driver 124*a*, write bit line driver 124*b*, read word line driver 122*a* or write word line driver 122*b*.

In operation 1810 of method 1800, the set of access transistors is turned on thereby writing the data signals into a storage node of a set of storage transistors.

In some embodiments, operation 1810 further includes turning on the set of access transistors in response to a second set of control signals thereby writing the data signals into the storage node of the set of storage transistors.

In some embodiments, the second set of control signals of method 1800 includes at least one of control signal G1*a* or G1*b*.

In some embodiments, the set of storage transistors of method 1800 includes at least one of transistor N1*b*, N2*b*, N3*b*, N4*b*, N1*c*, N2*c*, N3*c* or N4*c*.

In some embodiments, the storage node of the set of storage transistors of method 1800 of includes at least one of the corresponding gates of corresponding transistor N1*b*, N2*b*, N3*b*, N4*b*, N1*c*, N2*c*, N3*c* or N4*c*.

In operation 1812 of method 1800, the set of access transistors is turned off.

In some embodiments, operation 1812 further includes turning off the set of access transistors in response to the second set of control signals thereby decoupling the corresponding storage node of the set of storage transistors from the corresponding bit line.

In operation 1814 of method 1800, a first signal at a first node is set.

In some embodiments, the first signal of method 1800 includes at least one of signal VR.

In some embodiments, the first node of method 1800 includes at least one of node 420, 720 or 820.

In some embodiments, operation 1814 includes setting the first signal of the first node to be equal to the reference supply voltage VSS.

In some embodiments, operation 1814 includes setting the first signal of the first node to be electrically floating.

In some embodiments, operation 1814 is performed by controller 120, 606 or processor 1732.

In operation 1816 of method 1800, a read operation of the memory circuit is performed.

In some embodiments, operation 1816 is performed by at least one of transistors N1*b*, N2*b*, N3*b*, N4*b*, N1*c*, N2*c*, N3*c* or N4*c*.

In some embodiments, operation 1816 includes at least one of operation 1818, 1820 or 1822.

In operation 1818 of method 1800, the first node is pulled toward a first supply voltage.

In some embodiments, the first supply voltage of method 1800 includes at least one of supply voltage VDD.

In some embodiments, operation 1818 includes setting the first signal of the first node to be equal to the supply voltage VDD.

In some embodiments, operation 1818 is performed by controller 120, 606 or processor 1732.

In operation 1820 of method 1800, an output node is pulled to the first supply voltage or a reference supply voltage thereby setting an output signal.

In some embodiments, the output signal of method 1800 includes at least one of output signal Vo.

In some embodiments, the output node of method 1800 includes at least one of node 430, 730 or 830.

In some embodiments, operation 1820 is performed by at least one of transistors N1*b*, N2*b*, N3*b*, N4*b*, N1*c*, N2*c*, N3*c*, N4*c*, N5*b*, N5*c*, N6*b*, N6*c*, N7*b* or N7*c*.

In operation 1822 of method 1800, the first signal at the first node is set to be electrically floating or to be equal to the reference supply voltage VSS.

In some embodiments, operation 1822 includes setting the first signal of the first node to be equal to the reference supply voltage VSS.

In some embodiments, operation 1822 includes setting the first signal of the first node to be electrically floating.

In some embodiments, operation 1822 is performed by controller 120, 606 or processor 1732.

In some embodiments, operation 1822 is performed by at least one of transistors N5*b*, N5*c*, N6*b*, N6*c*, N7*b* or N7*c*.

In operation 1824 of method 1800, the output signal is output. In some embodiments, the output signal corresponds to the logic function between the first data signal and the second data signal.

In some embodiments, operation 1824 is performed by at least one of transistors N1*b*, N2*b*, N3*b*, N4*b*, N1*c*, N2*c*, N3*c*, N4*c*, N5*b*, N5*c*, N6*b*, N6*c*, N7*b* or N7*c*.

By using method 1800, the memory circuit operates to achieve one or more benefits discussed herein in the present disclosure.

While method 1800 was described above with reference to memory circuit 400A, it is understood that method 1800 applies to each memory circuit disclosed herein, in some embodiments.

Other operations of method 1800 are within the scope of the present disclosure.

Furthermore, various PMOS or NMOS transistors shown in FIGS. 3A, 3B, 4A, 6, 7A, 8A, 9A, 10A and 14 are of a particular dopant type (e.g., N-type or P-type) are for illustration purposes. Embodiments of the disclosure are not limited to a particular transistor type, and one or more of the PMOS or NMOS transistors shown in FIGS. 3A, 3B, 4A, 6, 7A, 8A, 9A, 10A and 14 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of transistors in FIGS. 3A, 3B, 4A, 6, 7A, 8A, 9A, 10A and 14 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. The memory circuit includes a first memory cell array configured to store data and a second memory cell array coupled to the first memory cell array. In some embodiments, the second memory cell array is configured as a first logic circuit or a second logic circuit in response to a first set of control signals. In some embodiments, the first logic circuit being configured to perform a first logic function on a first set of data signals based on a second set of control signals. In some embodiments, the second logic circuit being configured to perform a second logic function on the first set of data signals based on the second set of control signals. In some embodiments, the second logic function being different from the first logic function. In some embodiments, the first set of data signals being part of the data stored in the first memory cell array. In some embodiments, the first memory cell array and the second memory cell array are embedded in a same memory cell array.

Another aspect of this description relates to a memory circuit. In some embodiments, the memory circuit includes a first memory cell array configured to store data, and a second memory cell array. In some embodiments, the second memory cell array is reconfigurable as a first logic circuit or a second logic circuit in response to a first set of control signals the first logic circuit being configured to perform a first logic function on a first set of data signals based on a second set of control signals. In some embodiments, the second logic circuit being configured to perform a second logic function on the first set of data signals based on the second set of control signals, the second logic function being different from the first logic function. In some embodiments, the first set of data signals being part of the data stored in the first memory cell array. In some embodiments, the memory circuit further includes a controller configured to generate the first set of control signals and configured to control the first memory cell array and the second memory cell array. In some embodiments, the first memory cell array and the second memory cell array are embedded in a same memory cell array.

Still another aspect of this description relates to a method of operating a memory circuit. In some embodiments, the method includes writing a first set of control signals to a first set of transistors thereby setting logic functions of a first memory cell array in the memory circuit, the first set of transistors being part of the memory cell array. In some embodiments, the method further includes performing a write operation of the first memory cell array. In some embodiments, the performing the write operation includes turning on a set of access transistors in the first memory cell array thereby writing a first data signal and a second data signal into a corresponding storage node of a set of storage transistors, the set of storage transistors being part of the first memory cell array, the set of storage transistors being coupled to a first node, an output node and the first set of transistors. In some embodiments, the method further includes performing a read operation of the memory circuit. In some embodiments, the performing the read operation of the memory circuit includes setting the first node to a first supply voltage, pulling the output node to the first supply voltage or a reference supply voltage thereby setting an output signal, setting the first signal at the first node to the reference supply voltage, and outputting the output signal, the output signal corresponding to the logic function between the first data signal and the second data signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a first memory cell array configured to store data; and
a second memory cell array coupled to the first memory cell array and being configured as a first logic circuit or a second logic circuit in response to a first set of control signals, the first logic circuit being configured to perform a first logic function on a first set of data signals based on a second set of control signals, and the second logic circuit being configured to perform a second logic function on the first set of data signals based on the second set of control signals, the second logic function being different from the first logic function, the first set of data signals being part of the data stored in the first memory cell array,
wherein the first memory cell array and the second memory cell array are embedded in a same memory cell array.

2. The memory circuit of claim 1, wherein the second memory cell array comprises:
a first set of memory cells configured to receive the first set of data signals and the second set of control signals; and
a second set of memory cells coupled to the first set of memory cells, and being configured to receive the first set of control signals and a third set of control signals,
wherein the second set of memory cells is configured to control whether the second memory cell array is configured as the first logic circuit or the second logic circuit based on the first set of control signals.

3. The memory circuit of claim 2, wherein each memory cell of the first set of memory cells and each memory cell of the second set of memory cells is a 2 transistor (2T) memory cell.

4. The memory circuit of claim 2, wherein the first set of memory cells comprises:
a first set of access transistors configured to receive the first set of data signals and the second set of control signals; and
a first set of storage transistors coupled to a first node and an output node of the memory circuit;
wherein the first set of access transistors is configured to set a first voltage of a corresponding first storage node of each storage transistor of the first set of storage transistors based on the first set of data signals; and
in response to the first set of storage transistors being enabled, the first set of storage transistors is configured to set a first state of an output signal of the output node based on the first voltage of the corresponding first storage node of each storage transistor of the first set of storage transistors.

5. The memory circuit of claim 4, wherein the second set of memory cells comprises:

a second set of access transistors configured to receive the first set of control signals and the third set of control signals; and a second set of storage transistors coupled to a second node and the output node of the memory circuit;

wherein the second set of access transistors is configured to set a second voltage of a corresponding second storage node of each storage transistor of the second set of storage transistors based on the first set of control signals; and in response to the second set of storage transistors being enabled, the second set of storage transistors is configured to set a second state of the output signal of the output node based on the second voltage of the corresponding second storage node of each storage transistor of the second set of storage transistors.

6. The memory circuit of claim 5, wherein the first set of access transistors comprises:

a first transistor comprising a first source/drain terminal, a second source/drain terminal and a first gate terminal, the first source/drain terminal of the first transistor configured to receive a first data signal of the first set of data signals, and the first gate terminal of the first transistor configured to receive a first control signal of the second set of control signals; and a second transistor comprising a first source/drain terminal, a second source/drain terminal and a first gate terminal, the first source/drain terminal of the second transistor configured to receive a second data signal of the first set of data signals, and the first gate terminal of the second transistor configured to receive a second control signal of the second set of control signals.

7. The memory circuit of claim 6, wherein the first set of storage transistors comprises:

a third transistor comprising a first source/drain terminal, a second source/drain terminal and a first gate terminal, the first gate terminal of the third transistor coupled to the second source/drain terminal of the first transistor, and being configured to receive the first data signal of the first set of data signals; and a fourth transistor comprising a first source/drain terminal, a second source/drain terminal and a first gate terminal, the first gate terminal of the fourth transistor coupled to the second source/drain terminal of the second transistor, and being configured to receive the second data signal of the first set of data signals;

wherein each of the first source/drain terminal of the third transistor, the first source/drain terminal of the fourth transistor and the output node are coupled together;

each of the second source/drain terminal of the third transistor, the second source/drain terminal of the fourth transistor and the first node are coupled together.

8. The memory circuit of claim 7, wherein the second set of access transistors comprises:

a fifth transistor comprising a first source/drain terminal, a second source/drain terminal and a first gate terminal, the first source/drain terminal of the fifth transistor configured to receive a first control signal of the first set of control signals, and the first gate terminal of the fifth transistor configured to receive a first control signal of the third set of control signals;

a sixth transistor comprising a first source/drain terminal, a second source/drain terminal and a first gate terminal, the first source/drain terminal of the sixth transistor configured to receive a second control signal of the first set of control signals, and the first gate terminal of the sixth transistor configured to receive a second control signal of the third set of control signals; and a seventh transistor comprising a first source/drain terminal, a second source/drain terminal and a first gate terminal, the first source/drain terminal of the seventh transistor configured to receive a third control signal of the first set of control signals, and the first gate terminal of the seventh transistor configured to receive a third control signal of the third set of control signals.

9. The memory circuit of claim 8, wherein the second set of storage transistors comprises:

an eighth transistor comprising a first source/drain terminal, a second source/drain terminal and a first gate terminal, the first gate terminal of the eighth transistor coupled to the second source/drain terminal of the fifth transistor, and being configured to receive the first control signal of the first set of control signals;

a ninth transistor comprising a first source/drain terminal, a second source/drain terminal and a first gate terminal, the first gate terminal of the ninth transistor coupled to the second source/drain terminal of the sixth transistor, and being configured to receive the second control signal of the first set of control signals; and a tenth transistor comprising a first source/drain terminal, a second source/drain terminal and a first gate terminal, the first gate terminal of the tenth transistor coupled to the second source/drain terminal of the seventh transistor, and being configured to receive the third control signal of the first set of control signals;

wherein each of the first source/drain terminal of the third transistor, the first source/drain terminal of the fourth transistor, the first source/drain terminal of the eighth transistor, the first source/drain terminal of the ninth transistor, the first source/drain terminal of the tenth transistor and the output node are coupled together; and each of the second source/drain terminal of the eighth transistor, the second source/drain terminal of the ninth transistor, the second source/drain terminal of the tenth transistor and the second node are coupled together.

10. The memory circuit of claim 1, wherein the first logic circuit is an OR gate, the second logic circuit is an AND gate, the first logic function is an OR function, and the second logic function is an AND function.

11. A memory circuit, comprising:

a first memory cell array configured to store data;

a second memory cell array reconfigurable as a first logic circuit or a second logic circuit in response to a first set of control signals, the first logic circuit being configured to perform a first logic function on a first set of data signals based on a second set of control signals, and the second logic circuit being configured to perform a second logic function on the first set of data signals based on the second set of control signals, the second logic function being different from the first logic function, the first set of data signals being part of the data stored in the first memory cell array; and a controller configured to generate the first set of control signals and configured to control the first memory cell array and the second memory cell array, wherein the first memory cell array and the second memory cell array are embedded in a same memory cell array.

12. The memory circuit of claim 11, wherein the controller comprises:

a read bit line driver circuit coupled to the first memory cell array, and configured to generate a set of read bit line signals; and a write bit line driver circuit coupled to the first memory cell array, and configured to generate a set of write bit line signals.

13. The memory circuit of claim 11, wherein the controller comprises:

a read word line driver circuit coupled to the first memory cell array, and configured to generate a set of read word line signals; and a write word line driver circuit coupled to the first memory cell array, and configured to generate a set of write word line signals.

14. The memory circuit of claim 11, wherein the second memory cell array comprises:

a first set of memory cells configured to receive the first set of data signals and the second set of control signals; and a second set of memory cells coupled to the first set of memory cells, and being configured to receive the first set of control signals and a third set of control signals, wherein the second set of memory cells is configured to control whether the second memory cell array is configured as the first logic circuit or the second logic circuit based on the first set of control signals.

15. The memory circuit of claim 14, wherein the first set of memory cells comprises:

a first set of access transistors configured to receive the first set of data signals and the second set of control signals; and a first set of storage transistors coupled to a first node and an output node of the memory circuit;

wherein the first set of access transistors is configured to set a first voltage of a corresponding first storage node of each storage transistor of the first set of storage transistors based on the first set of data signals; and in response to the first set of storage transistors being enabled, the first set of storage transistors is configured to set a first state of an output signal of the output node based on the first voltage of the corresponding first storage node of each storage transistor of the first set of storage transistors.

16. The memory circuit of claim 15, wherein the second set of memory cells comprises:

a second set of access transistors configured to receive the first set of control signals and the third set of control signals; and a second set of storage transistors coupled to a second node and the output node of the memory circuit;

wherein the second set of access transistors is configured to set a second voltage of a corresponding second storage node of each storage transistor of the second set of storage transistors based on the first set of control signals; and in response to the second set of storage transistors being enabled, the second set of storage transistors is configured to set a second state of the output signal of the output node based on the second voltage of the corresponding second storage node of each storage transistor of the second set of storage transistors.

17. The memory circuit of claim 16, wherein the first set of storage transistors is a first set of ferroelectric field effect transistors (FeFET), and each FeFET of the first set of FeFETs includes a first ferroelectric layer; and the second set of storage transistors is a second set of FeFETs, and each FeFET of the second set of FeFETs includes a second ferroelectric layer.

18. The memory circuit of claim 16, wherein the first set of access transistors includes a first set of transistors with active regions having a first width or a second width in a first direction;

the second set of access transistors includes a second set of transistors with active regions having a third width or a fourth width in the first direction; and at least one of the first width, the second width, the third width or the fourth width is different from at least another of the first width, the second width, the third width or the fourth width.

19. The memory circuit of claim 11, wherein the first logic circuit is a NOR gate, the second logic circuit is a NAND gate, the first logic function is a NOR function, and the second logic function is a NAND function.

20. A method of operating a memory circuit, the method comprising:

writing a first set of control signals to a first set of transistors thereby setting logic functions of a first memory cell array in the memory circuit, the first set of transistors being part of the first memory cell array;

performing a write operation of the first memory cell array, the performing the write operation comprising:

turning on a set of access transistors in the first memory cell array thereby writing a first data signal and a second data signal into a corresponding storage node of a set of storage transistors, the set of storage transistors being part of the first memory cell array, the set of storage transistors being coupled to a first node, an output node and the first set of transistors; and performing a read operation of the memory circuit, the performing the read operation of the memory circuit comprising:

setting the first node to a first supply voltage;

pulling the output node to the first supply voltage or a reference supply voltage thereby setting an output signal;

setting a first signal at the first node to the reference supply voltage; and outputting the output signal, the output signal corresponding to a logic function between the first data signal and the second data signal.

* * * * *